United States Patent
Thompson et al.

(10) Patent No.: US 11,672,165 B2
(45) Date of Patent: *Jun. 6, 2023

(54) ORGANIC ELECTROLUMINESCENT MATERIALS AND DEVICES

(71) Applicant: Universal Display Corporation, Ewing, NJ (US)

(72) Inventors: Nicholas J. Thompson, New Hope, PA (US); Chun Lin, Yardley, PA (US)

(73) Assignee: UNIVERSAL DISPLAY CORPORATION, Ewing, NJ (US)

(*) Notice: Subject to any disclaimer, the term of this patent is extended or adjusted under 35 U.S.C. 154(b) by 484 days.

This patent is subject to a terminal disclaimer.

(21) Appl. No.: 16/841,182

(22) Filed: Apr. 6, 2020

(65) Prior Publication Data

US 2020/0251670 A1 Aug. 6, 2020

Related U.S. Application Data

(63) Continuation-in-part of application No. 16/683,507, filed on Nov. 14, 2019.

(60) Provisional application No. 62/772,403, filed on Nov. 28, 2018.

(51) Int. Cl.
*H01L 51/00* (2006.01)
*H01L 51/50* (2006.01)

(52) U.S. Cl.
CPC ...... *H01L 51/0087* (2013.01); *H01L 51/5004* (2013.01); *H01L 51/5024* (2013.01)

(58) Field of Classification Search
CPC ............ H01L 51/0072; H01L 51/0067; H01L 51/5012; H01L 51/5016; H01L 2251/5384; C07D 403/14; C07D 487/04; C09K 11/02; C09K 11/06; C09K 2211/1007; C09K 2211/1018; C09K 2211/1029; C09K 2211/1044; C09K 2211/185
See application file for complete search history.

(56) References Cited

U.S. PATENT DOCUMENTS

| | | | |
|---|---|---|---|
| 4,769,292 | A | 9/1988 | Tang et al. |
| 5,061,569 | A | 10/1991 | VanSlyke et al. |
| 5,247,190 | A | 9/1993 | Friend et al. |
| 5,703,436 | A | 12/1997 | Forrest et al. |
| 5,707,745 | A | 1/1998 | Forrest et al. |

(Continued)

FOREIGN PATENT DOCUMENTS

| | | |
|---|---|---|
| EP | 0650955 | 5/1995 |
| EP | 1725079 | 11/2006 |

(Continued)

OTHER PUBLICATIONS

Adachi, Chihaya et al., "Organic Electroluminescent Device Having a Hole Conductor as an Emitting Layer," Appl. Phys. Lett, 55(15): 1489-1491 (1989).

(Continued)

*Primary Examiner* — Shane Fang
(74) *Attorney, Agent, or Firm* — Duane Morris LLP

(57) ABSTRACT

Disclosed is an OLED configuration that although comprises an exciplex that has an emission spectrum that is redder than the emission spectrum of the emitter, the emission from the exciplex is suppressed so that the overall OLED emission spectrum is still dominated by the emission of the emitter.

20 Claims, 6 Drawing Sheets

(56) References Cited

U.S. PATENT DOCUMENTS

| | | |
|---|---|---|
| 5,834,893 A | 11/1998 | Bulovic et al. |
| 5,844,363 A | 12/1998 | Gu et al. |
| 6,013,982 A | 1/2000 | Thompson et al. |
| 6,087,196 A | 7/2000 | Sturm et al. |
| 6,091,195 A | 7/2000 | Forrest et al. |
| 6,097,147 A | 8/2000 | Baldo et al. |
| 6,294,398 B1 | 9/2001 | Kim et al. |
| 6,303,238 B1 | 10/2001 | Thompson et al. |
| 6,337,102 B1 | 1/2002 | Forrest et al. |
| 6,468,819 B1 | 10/2002 | Kim et al. |
| 6,528,187 B1 | 3/2003 | Okada |
| 6,687,266 B1 | 2/2004 | Ma et al. |
| 6,835,469 B2 | 12/2004 | Kwong et al. |
| 6,921,915 B2 | 7/2005 | Takiguchi et al. |
| 7,087,321 B2 | 8/2006 | Kwong et al. |
| 7,090,928 B2 | 8/2006 | Thompson et al. |
| 7,154,114 B2 | 12/2006 | Brooks et al. |
| 7,250,226 B2 | 7/2007 | Tokito et al. |
| 7,279,704 B2 | 10/2007 | Walters et al. |
| 7,332,232 B2 | 2/2008 | Ma et al. |
| 7,338,722 B2 | 3/2008 | Thompson et al. |
| 7,393,599 B2 | 7/2008 | Thompson et al. |
| 7,396,598 B2 | 7/2008 | Takeuchi et al. |
| 7,431,968 B1 | 10/2008 | Shtein et al. |
| 7,445,855 B2 | 11/2008 | Mackenzie et al. |
| 7,534,505 B2 | 5/2009 | Lin et al. |
| 2002/0034656 A1 | 3/2002 | Thompson et al. |
| 2002/0134984 A1 | 9/2002 | Igarashi |
| 2002/0158242 A1 | 10/2002 | Son et al. |
| 2003/0138657 A1 | 7/2003 | Li et al. |
| 2003/0152802 A1 | 8/2003 | Tsuboyama et al. |
| 2003/0162053 A1 | 8/2003 | Marks et al. |
| 2003/0175553 A1 | 9/2003 | Thompson et al. |
| 2003/0230980 A1 | 12/2003 | Forrest et al. |
| 2004/0036077 A1 | 2/2004 | Ise |
| 2004/0137267 A1 | 7/2004 | Igarashi et al. |
| 2004/0137268 A1 | 7/2004 | Igarashi et al. |
| 2004/0174116 A1 | 9/2004 | Lu et al. |
| 2005/0025993 A1 | 2/2005 | Thompson et al. |
| 2005/0112407 A1 | 5/2005 | Ogasawara et al. |
| 2005/0238919 A1 | 10/2005 | Ogasawara |
| 2005/0244673 A1 | 11/2005 | Satoh et al. |
| 2005/0260441 A1 | 11/2005 | Thompson et al. |
| 2005/0260449 A1 | 11/2005 | Walters et al. |
| 2006/0008670 A1 | 1/2006 | Lin et al. |
| 2006/0202194 A1 | 9/2006 | Jeong et al. |
| 2006/0240279 A1 | 10/2006 | Adamovich et al. |
| 2006/0251923 A1 | 11/2006 | Lin et al. |
| 2006/0263635 A1 | 11/2006 | Ise |
| 2006/0280965 A1 | 12/2006 | Kwong et al. |
| 2007/0190359 A1 | 8/2007 | Knowles et al. |
| 2007/0278938 A1 | 12/2007 | Yabunouchi et al. |
| 2008/0015355 A1 | 1/2008 | Schafer et al. |
| 2008/0018221 A1 | 1/2008 | Egen et al. |
| 2008/0106190 A1 | 5/2008 | Yabunouchi et al. |
| 2008/0124572 A1 | 5/2008 | Mizuki et al. |
| 2008/0220265 A1 | 9/2008 | Xia et al. |
| 2008/0297033 A1 | 12/2008 | Knowles et al. |
| 2009/0008605 A1 | 1/2009 | Kawamura et al. |
| 2009/0009065 A1 | 1/2009 | Nishimura et al. |
| 2009/0017330 A1 | 1/2009 | Iwakuma et al. |
| 2009/0030202 A1 | 1/2009 | Iwakuma et al. |
| 2009/0039776 A1 | 2/2009 | Yamada et al. |
| 2009/0045730 A1 | 2/2009 | Nishimura et al. |
| 2009/0045731 A1 | 2/2009 | Nishimura et al. |
| 2009/0101870 A1 | 4/2009 | Prakash et al. |
| 2009/0108737 A1 | 4/2009 | Kwong et al. |
| 2009/0115316 A1 | 5/2009 | Zheng et al. |
| 2009/0165846 A1 | 7/2009 | Johannes et al. |
| 2009/0167162 A1 | 7/2009 | Lin et al. |
| 2009/0179554 A1 | 7/2009 | Kuma et al. |
| 2015/0295197 A1 | 10/2015 | Adamovich et al. |
| 2017/0012207 A1 | 1/2017 | Seo et al. |
| 2019/0036055 A1* | 1/2019 | Lin .................. H01L 51/5024 |
| 2020/0190115 A1* | 6/2020 | Hatakeyama ......... H01L 51/008 |
| 2020/0270262 A1 | 8/2020 | Fleetham |
| 2021/0066613 A1* | 3/2021 | Cheng ................ H01L 51/0067 |
| 2021/0070791 A1* | 3/2021 | Ji ....................... C07F 15/0086 |

FOREIGN PATENT DOCUMENTS

| | | |
|---|---|---|
| EP | 2034538 | 3/2009 |
| EP | 3435438 | 1/2019 |
| EP | 3439063 | 2/2019 |
| JP | 200511610 | 1/2005 |
| JP | 2007123392 | 5/2007 |
| JP | 2007254297 | 10/2007 |
| JP | 2008074939 | 4/2008 |
| WO | 01/39234 | 5/2001 |
| WO | 02/02714 | 1/2002 |
| WO | 02015654 | 2/2002 |
| WO | 03040257 | 5/2003 |
| WO | 03060956 | 7/2003 |
| WO | 2004093207 | 10/2004 |
| WO | 2004107822 | 12/2004 |
| WO | 2005014551 | 2/2005 |
| WO | 2005019373 | 3/2005 |
| WO | 2005030900 | 4/2005 |
| WO | 2005089025 | 9/2005 |
| WO | 2005123873 | 12/2005 |
| WO | 2006009024 | 1/2006 |
| WO | 2006056418 | 6/2006 |
| WO | 2006072002 | 7/2006 |
| WO | 2006082742 | 8/2006 |
| WO | 2006098120 | 9/2006 |
| WO | 2006100298 | 9/2006 |
| WO | 2006103874 | 10/2006 |
| WO | 2006114966 | 11/2006 |
| WO | 2006132173 | 12/2006 |
| WO | 2007002683 | 1/2007 |
| WO | 2007004380 | 1/2007 |
| WO | 2007063754 | 6/2007 |
| WO | 2007063796 | 6/2007 |
| WO | 2008056746 | 5/2008 |
| WO | 2008101842 | 8/2008 |
| WO | 2008132085 | 11/2008 |
| WO | 2009000673 | 12/2008 |
| WO | 2009003898 | 1/2009 |
| WO | 2009008311 | 1/2009 |
| WO | 2009018009 | 2/2009 |
| WO | 2009021126 | 2/2009 |
| WO | 2009050290 | 4/2009 |
| WO | 2009062578 | 5/2009 |
| WO | 2009063833 | 5/2009 |
| WO | 2009066778 | 5/2009 |
| WO | 2009066779 | 5/2009 |
| WO | 2009086028 | 7/2009 |
| WO | 2009100991 | 8/2009 |

OTHER PUBLICATIONS

Adachi, Chihaya et al., "Nearly 100% Internal Phosphorescence Efficiency in an Organic Light Emitting Device," J. Appl. Phys., 90(10): 5048-5051 (2001).

Adachi, Chihaya et al., "High-Efficiency Red Electrophosphorescence Devices," Appl. Phys. Lett., 78(11)1622-1624 (2001).

Aonuma, Masaki et al., "Material Design of Hole Transport Materials Capable of Thick-Film Formation in Organic Light Emitting Diodes," Appl. Phys. Lett., 90, Apr. 30, 2007, 183503-1-183503-3.

Baldo et al., Highly Efficient Phosphorescent Emission from Organic Electroluminescent Devices, Nature, vol. 395, 151-154, (1998).

Baldo et al., Very high-efficiency green organic light-emitting devices based on electro phosphorescence, Appl. Phys. Lett., vol. 75, No. 1, 4-6 (1999).

Gao, Zhiqiang et al., "Bright-Blue Electroluminescence From a Silyl-Substituted ter-(phenylene-vinylene) derivative," Appl. Phys. Lett., 74(6): 865-867 (1999).

Guo, Tzung-Fang et al., "Highly Efficient Electrophosphorescent Polymer Light-Emitting Devices," Organic Electronics, 1: 15-20 (2000).

(56) References Cited

OTHER PUBLICATIONS

Hamada, Yuji et al., "High Luminance in Organic Electroluminescent Devices with Bis(10-hydroxybenzo[h]quinolinato)beryllium as an Emitter," Chem. Lett., 905-906 (1993).
Holmes, R.J. et al., "Blue Organic Electrophosphorescence Using Exothermic Host-Guest Energy Transfer," Appl. Phys. Lett., 82(15):2422-2424 (2003).
Hu, Nan-Xing et al., "Novel High Tg Hole-Transport Molecules Based on Indolo[3,2-b]carbazoles for Organic Light-Emitting Devices," Synthetic Metals, 111-112:421-424 (2000).
Huang, Jinsong et al., "Highly Efficient Red-Emission Polymer Phosphorescent Light-Emitting Diodes Based on Two Novel Tris(1-phenylisoquinolinato-C2,N)iridium(III) Derivatives," Adv. Mater., 19:739-743 (2007).
Huang, Wei-Sheng et al., "Highly Phosphorescent Bis-Cyclometalated Iridium Complexes Containing Benzoimidazole-Based Ligands," Chem. Mater., 16(12):2480-2488 (2004).
Hung, L.S. et al., "Anode Modification in Organic Light-Emitting Diodes by Low-Frequency Plasma Polymerization of CHF3," Appl. Phys. Lett., 78(5):673-675 (2001).
Ikai, Masamichi et al., "Highly Efficient Phosphorescence From Organic Light-Emitting Devices with an Exciton-Block Layer," Appl. Phys. Lett., 79(2):156-158 (2001).
Ikeda, Hisao et al., "P-185 Low-Drive-Voltage OLEDs with a Buffer Layer Having Molybdenum Oxide," SID Symposium Digest, 37:923-926 (2006).
Inada, Hiroshi and Shirota, Yasuhiko, "1,3,5-Tris[4-(diphenylamino)phenyl]benzene and its Methylsubstituted Derivatives as a Novel Class of Amorphous Molecular Materials," J. Mater. Chem., 3(3):319-320 (1993).
Kanno, Hiroshi et al., "Highly Efficient and Stable Red Phosphorescent Organic Light-Emitting Device Using bis[2-(2-benzothiazoyl)phenolato]zinc(II) as host material," Appl. Phys. Lett., 90:123509-1-123509-3 (2007).
Kido, Junji et al., 1,2,4-Triazole Derivative as an Electron Transport Layer in Organic Electroluminescent Devices, Jpn. J. Appl. Phys., 32:L917-L920 (1993).
Kuwabara, Yoshiyuki et al., "Thermally Stable Multilayered Organic Electroluminescent Devices Using Novel Starburst Molecules, 4,4',4"-Tri(N-carbazolyl)triphenylamine (TCTA) and 4,4',4"-Tris(3-methylphenylphenyl-amino)triphenylamine (m-MTDATA), as Hole-Transport Materials," Adv. Mater., 6(9):677-679 (1994).
Kwong, Raymond C. et al., "High Operational Stability of Electrophosphorescent Devices," Appl. Phys. Lett., 81(1)162-164(2002).
Lamansky, Sergey et al., "Synthesis and Characterization of Phosphorescent Cyclometalated Iridium Complexes," Inorg. Chem., 40(7):1704-1711 (2001).
Lee, Chang-Lyoul et al., "Polymer Phosphorescent Light-Emitting Devices Doped with Tris(2-phenylpyridine) Iridium as a Triplet Emitter," Appl Phys Lett., 77(15):2280-2282 (2000).
Lo, Shih-Chun et al., "Blue Phosphorescence from Iridium(III) Complexes at Room Temperature," Chem. Mater., 18(21)5119-5129 (2006).
Ma, Yuguang et al., "Triplet Luminescent Dinuclear-Gold(I) Complex-Based Light-Emitting Diodes with Low Turn-On voltage," Appl. Phys. Lett., 74(10):1361-1363 (1999).
Mi, Bao-Xiu et al., "Thermally Stable Hole-Transporting Material for Organic Light-Emitting Diode an Isoindole Derivative," Chem. Mater., 15(16):3148-3151 (2003).

Nishida, Jun-ichi et al., "Preparation, Characterization, and Electroluminescence Characteristics of α-Diimine-type Platinum(II) Complexes with Perfluorinated Phenyl Groups as Ligands," Chem. Lett., 34(4): 592-593 (2005).
Niu, Yu-Hua et al., "Highly Efficient Electrophosphorescent Devices with Saturated Red Emission from a Neutral Osmium Complex," Chem. Mater., 17(13):3532-3536 (2005).
Noda, Tetsuya and Shirota,Yasuhiko, "5,5'-Bis(dimesitylboryl)-2,2'-bithiophene and 5,5"-Bis(dimesitylboryl)-2,2'5',2"-terthiophene as a Novel Family of Electron-Transporting Amorphous Molecular Materials," J. Am. Chem. Soc., 120 (37):9714-9715 (1998).
Okumoto, Kenji et al., "Green Fluorescent Organic Light-Emitting Device with External Quantum Efficiency of Nearly 10%," Appl. Phys. Lett., 89:063504-1-063504-3 (2006).
Palilis, Leonidas C., "High Efficiency Molecular Organic Light-Emitting Diodes Based on Silole Derivatives and Their Exciplexes," Organic Electronics, 4:113-121 (2003).
Paulose, Betty Marie Jennifer S. et al., "First Examples of Alkenyl Pyridines as Organic Ligands for Phosphorescent Iridium Complexes," Adv. Mater., 16(22):2003-2007 (2004).
Ranjan, Sudhir et al., "Realizing Green Phosphorescent Light-Emitting Materials from Rhenium(I) Pyrazolato Diimine Complexes," Inorg. Chem., 42(4):1248-1255 (2003).
Sakamoto, Youichi et al., "Synthesis, Characterization, and Electron-Transport Property of Perfluorinated Phenylene Dendrimers," J. Am. Chem. Soc., 122(8):1832-1833 (2000).
Salbeck, J. et al., "Low Molecular Organic Glasses for Blue Electroluminescence," Synthetic Metals, 91:209-215 (1997).
Shirota, Yasuhiko et al., "Starburst Molecules Based on pi-Electron Systems as Materials for Organic Electroluminescent Devices," Journal of Luminescence, 72-74:985-991 (1997).
Sotoyama, Wataru et al., "Efficient Organic Light-Emitting Diodes with Phosphorescent Platinum Complexes Containing N^C^N-Coordinating Tridentate Ligand," Appl. Phys. Lett., 86:153505-1-153505-3 (2005).
Sun, Yiru and Forrest, Stephen R., "High-Efficiency White Organic Light Emitting Devices with Three Separate Phosphorescent Emission Layers," Appl. Phys. Lett., 91:263503-1-263503-3 (2007).
T. Östergård et al., "Langmuir-Blodgett Light-Emitting Diodes of Poly(3-Hexylthiophene) Electro-Optical Characteristics Related to Structure," Synthetic Metals, 88:171-177 (1997).
Takizawa, Shin-ya et al., "Phosphorescent Iridium Complexes Based on 2-Phenylimidazo[1,2-α]pyridine Ligands Tuning of Emission Color toward the Blue Region and Application to Polymer Light-Emitting Devices," Inorg. Chem., 16(10):4308-4319 (2007).
Tang, C.W. and VanSlyke, S.A., "Organic Electroluminescent Diodes," Appl. Phys. Lett., 51(12):913-915 (1987).
Tung, Yung-Liang et al., "Organic Light-Emitting Diodes Based on Charge-Neutral Ru II PHosphorescent Emitters," Adv. Mater., 17(8)1059-1064 (2005).
Van Slyke, S. A. et al., "Organic Electroluminescent Devices with Improved Stability," Appl. Phys. Lett., 69(15):2160-2162 (1996).
Wang, Y. et al., "Highly Efficient Electroluminescent Materials Based on Fluorinated Organometallic Iridium Compounds," Appl. Phys. Lett., 79(4):449-451 (2001).
Wong, Keith Man-Chung et al., A Novel Class of Phosphorescent Gold(III) Alkynyl-Based Organic Light-Emitting Devices with Tunable Colour, Chem. Commun., 2906-2908 (2005).
Wong, Wai-Yeung, "Multifunctional Iridium Complexes Based on Carbazole Modules as Highly Efficient Electrophosphors," Angew. Chem. Int. Ed., 45:7800-7803 (2006).
Extended European Search Report dated Oct. 16, 2020 in corresponding European Patent Application No. 20170371.7.

\* cited by examiner

ORGANIC ELECTROLUMINESCENT MATERIALS AND DEVICES

CROSS-REFERENCE TO RELATED APPLICATIONS

This application is a continuation-in-part of co-pending U.S. patent application Ser. No. 16/683,507, filed on Nov. 14, 2019, which claims priority under 35 U.S.C. § 119(e) to U.S. Provisional Application No. 62/772,403, filed on Nov. 28, 2018, the entire contents of which are incorporated herein by reference.

FIELD

The present disclosure generally relates to organometallic compounds and formulations and their various uses including as emitters in devices such as organic light emitting diodes and related electronic devices.

BACKGROUND

Opto-electronic devices that make use of organic materials are becoming increasingly desirable for various reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting diodes/devices (OLEDs), organic phototransistors, organic photovoltaic cells, and organic photodetectors. For OLEDs, the organic materials may have performance advantages over conventional materials.

OLEDs make use of thin organic films that emit light when voltage is applied across the device. OLEDs are becoming an increasingly interesting technology for use in applications such as flat panel displays, illumination, and backlighting.

One application for phosphorescent emissive molecules is a full color display. Industry standards for such a display call for pixels adapted to emit particular colors, referred to as "saturated" colors. In particular, these standards call for saturated red, green, and blue pixels. Alternatively, the OLED can be designed to emit white light. In conventional liquid crystal displays emission from a white backlight is filtered using absorption filters to produce red, green and blue emission. The same technique can also be used with OLEDs. The white OLED can be either a single emissive layer (EML) device or a stack structure. Color may be measured using CIE coordinates, which are well known to the art.

SUMMARY

An organic light emitting device (OLED) comprising an anode, a cathode, and an organic emissive layer, disposed between the anode and the cathode is disclosed where the organic emissive layer comprises a first host material having a highest occupied molecular orbital (HOMO) energy and a lowest unoccupied molecular orbital (LUMO) energy, and an emitter material having a HOMO energy and a LUMO energy. The emitter is selected from the group consisting of a phosphorescent metal complex, and a delayed fluorescent emitter. The emitter and host materials in the organic emissive layer satisfy the following conditions: $a \leq E_T - \Delta E \leq b$; where $E_T$ is triplet energy $T_1$ of the emitter, which is the lowest $T_1$ energy among all materials in the organic emissive layer; $\Delta E$ is the energy gap between the High HOMO energy and the Low LUMO energy; where a is 0.00 up to 0.15 eV, and b is 0.05 up to 0.45 eV; and where the emission spectrum of the OLED is at least 95% like the emission spectrum of an OLED whose organic emissive layer consists of the first emitter and an inert host. "High HOMO energy" is defined as the highest HOMO energy among all materials in the organic emissive layer and "Low LUMO energy" is defined as the lowest LUMO energy among all materials in the organic emissive layer.

A consumer product comprising the OLED is also disclosed.

DETAILED DESCRIPTION

Figure 1:
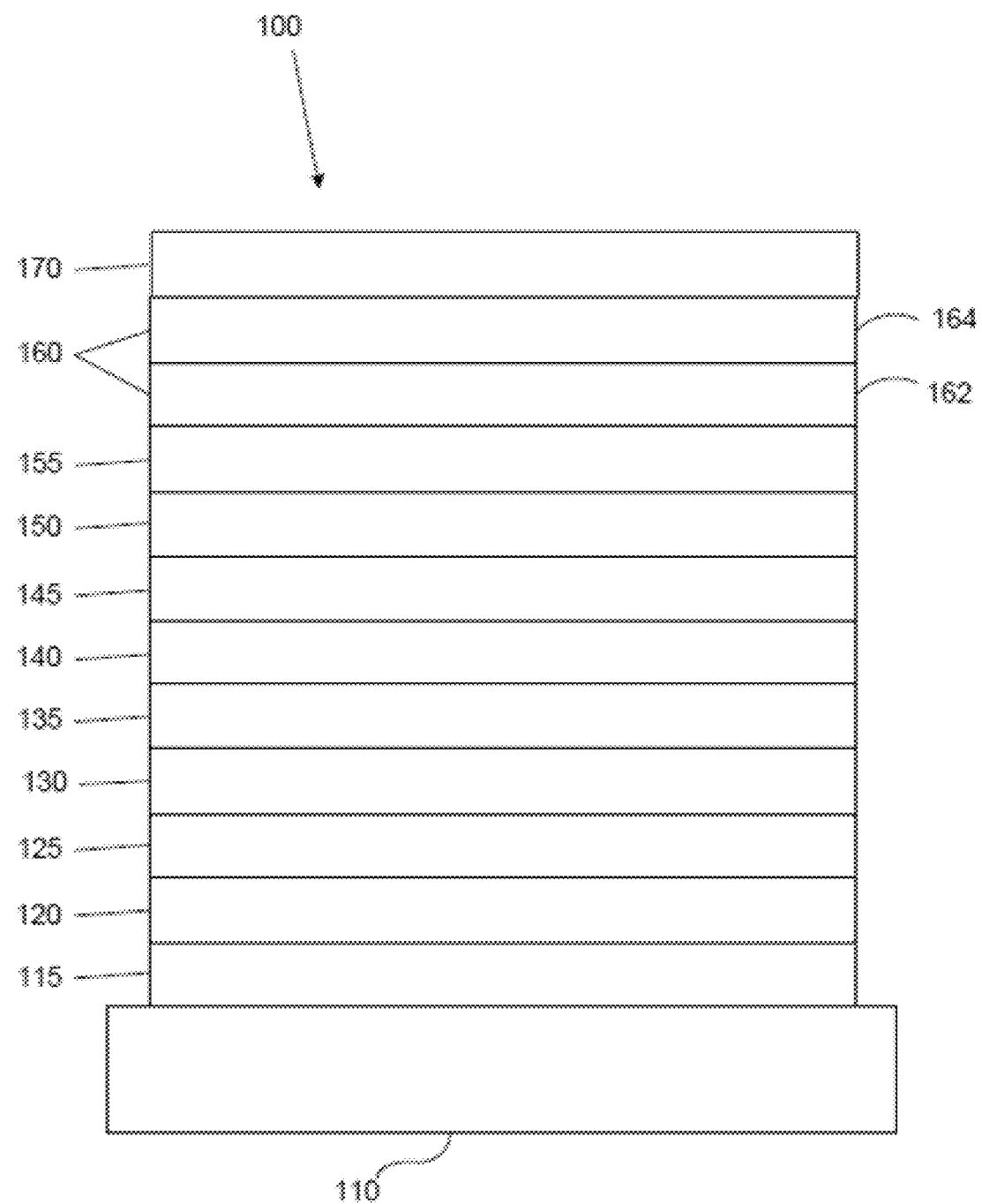
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
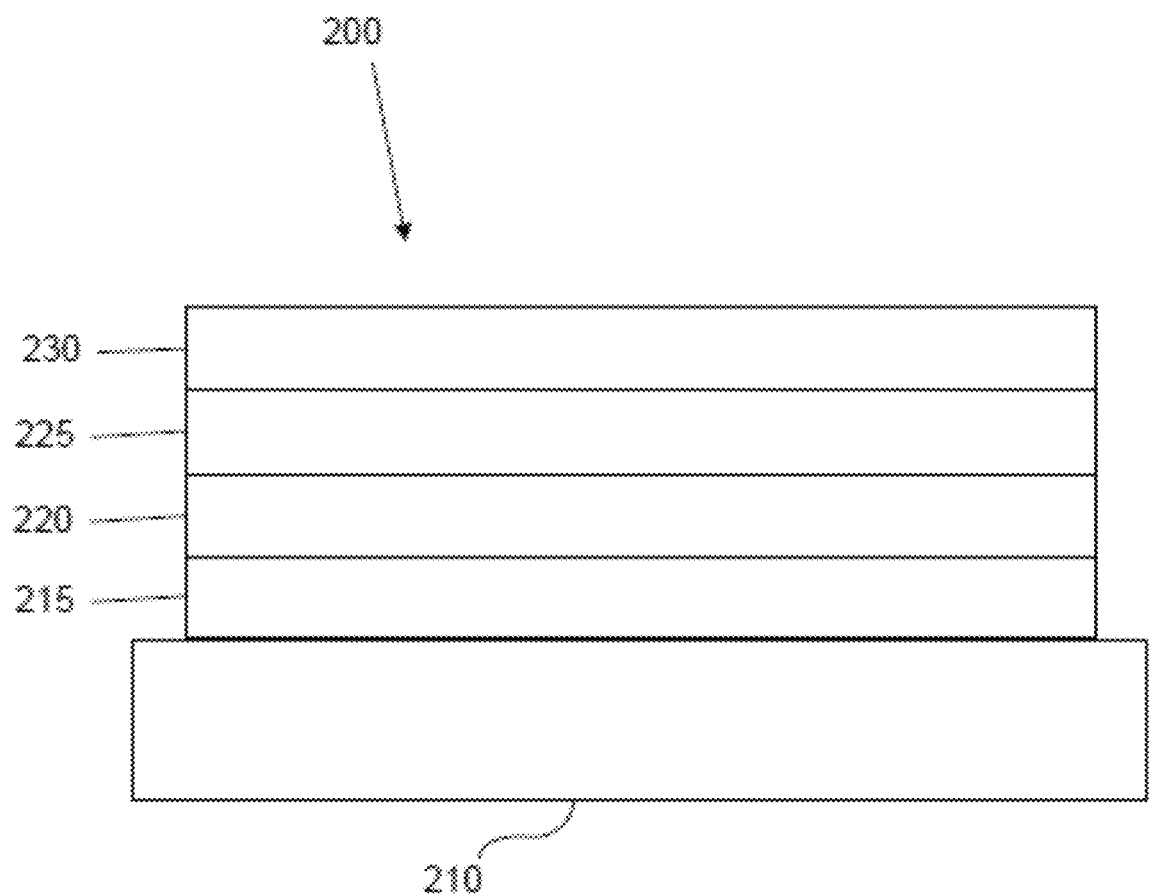
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the present disclosure may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink jet and organic vapor jet printing (OVJP). Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons are a preferred range. Materials with asymmetric structures may have better solution processability than those having symmetric structures, because asymmetric materials may have a lower tendency to recrystallize. Dendrimer substituents may be used to enhance the ability of small molecules to undergo solution processing.

Unless otherwise specified, the below terms used herein are defined as follows:

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with"

the second layer. For example, a cathode may be described as "disposed over" an anode, even though there are various organic layers in between.

As used herein, "solution processable" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative) Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

The terms "halo," "halogen," and "halide" are used interchangeably and refer to fluorine, chlorine, bromine, and iodine.

The term "acyl" refers to a substituted carbonyl radical (C(O)—$R_s$).

The term "ester" refers to a substituted oxycarbonyl (—O—C(O)—$R_s$ or —C(O)—O—$R_s$) radical.

The term "ether" refers to an —O$R_s$ radical.

The terms "sulfanyl" or "thio-ether" are used interchangeably and refer to a —S$R_s$ radical.

The term "sulfinyl" refers to a —S(O)—$R_s$ radical.

The term "sulfonyl" refers to a —$SO_2$—$R_s$ radical.

The term "phosphino" refers to a —P($R_s$)$_3$ radical, wherein each $R_s$ can be same or different.

The term "silyl" refers to a —Si($R_s$)$_3$ radical, wherein each $R_s$ can be same or different.

The term "boryl" refers to a —B($R_s$)$_2$ radical or its Lewis adduct —B($R_s$)$_3$ radical, wherein $R_s$ can be same or different.

In each of the above, $R_s$ can be hydrogen or a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, and combination thereof. Preferred $R_s$ is selected from the group consisting of alkyl, cycloalkyl, aryl, heteroaryl, and combination thereof.

The term "alkyl" refers to and includes both straight and branched chain alkyl radicals. Preferred alkyl groups are those containing from one to fifteen carbon atoms and includes methyl, ethyl, propyl, 1-methylethyl, butyl, 1-methylpropyl, 2-methylpropyl, pentyl, 1-methylbutyl, 2-methylbutyl, 3-methylbutyl, 1,1-dimethylpropyl, 1,2-dimethylpropyl, 2,2-dimethylpropyl, and the like. Additionally, the alkyl group may be optionally substituted.

The term "cycloalkyl" refers to and includes monocyclic, polycyclic, and spiro alkyl radicals. Preferred cycloalkyl groups are those containing 3 to 12 ring carbon atoms and includes cyclopropyl, cyclopentyl, cyclohexyl, bicyclo[3.1.1]heptyl, spiro[4.5]decyl, spiro[5.5]undecyl, adamantyl, and the like. Additionally, the cycloalkyl group may be optionally substituted.

The terms "heteroalkyl" or "heterocycloalkyl" refer to an alkyl or a cycloalkyl radical, respectively, having at least one carbon atom replaced by a heteroatom. Optionally the at least one heteroatom is selected from O, S, N, P, B, Si and Se, preferably, O, S or N. Additionally, the heteroalkyl or heterocycloalkyl group may be optionally substituted.

The term "alkenyl" refers to and includes both straight and branched chain alkene radicals. Alkenyl groups are essentially alkyl groups that include at least one carbon-carbon double bond in the alkyl chain. Cycloalkenyl groups are essentially cycloalkyl groups that include at least one carbon-carbon double bond in the cycloalkyl ring. The term "heteroalkenyl" as used herein refers to an alkenyl radical having at least one carbon atom replaced by a heteroatom. Optionally the at least one heteroatom is selected from O, S, N, P, B, Si, and Se, preferably, O, S, or N. Preferred alkenyl, cycloalkenyl, or heteroalkenyl groups are those containing two to fifteen carbon atoms. Additionally, the alkenyl, cycloalkenyl, or heteroalkenyl group may be optionally substituted.

The term "alkynyl" refers to and includes both straight and branched chain alkyne radicals. Alkynyl groups are essentially alkyl groups that include at least one carbon-carbon triple bond in the alkyl chain. Preferred alkynyl groups are those containing two to fifteen carbon atoms. Additionally, the alkynyl group may be optionally substituted.

The terms "aralkyl" or "arylalkyl" are used interchangeably and refer to an alkyl group that is substituted with an aryl group. Additionally, the aralkyl group may be optionally substituted.

The term "heterocyclic group" refers to and includes aromatic and non-aromatic cyclic radicals containing at least one heteroatom. Optionally the at least one heteroatom is selected from O, S, N, P, B, Si, and Se, preferably, O, S, or N. Hetero-aromatic cyclic radicals may be used interchangeably with heteroaryl. Preferred hetero-non-aromatic cyclic groups are those containing 3 to 7 ring atoms which includes at least one hetero atom, and includes cyclic amines such as morpholino, piperidino, pyrrolidino, and the like, and cyclic ethers/thio-ethers, such as tetrahydrofuran, tetrahydropyran, tetrahydrothiophene, and the like. Additionally, the heterocyclic group may be optionally substituted.

The term "aryl" refers to and includes both single-ring aromatic hydrocarbyl groups and polycyclic aromatic ring systems. The polycyclic rings may have two or more rings in which two carbons are common to two adjoining rings (the rings are "fused") wherein at least one of the rings is an aromatic hydrocarbyl group, e.g., the other rings can be cycloalkyls, cycloalkenyls, aryl, heterocycles, and/or heteroaryls. Preferred aryl groups are those containing six to thirty carbon atoms, preferably six to twenty carbon atoms, more preferably six to twelve carbon atoms. Especially preferred is an aryl group having six carbons, ten carbons or twelve carbons. Suitable aryl groups include phenyl, biphenyl, triphenyl, triphenylene, tetraphenylene, naphthalene, anthracene, phenalene, phenanthrene, fluorene, pyrene, chrysene, perylene, and azulene, preferably phenyl, biphenyl, triphenyl, triphenylene, fluorene, and naphthalene. Additionally, the aryl group may be optionally substituted.

The term "heteroaryl" refers to and includes both single-ring aromatic groups and polycyclic aromatic ring systems that include at least one heteroatom. The heteroatoms include, but are not limited to O, S, N, P, B, Si, and Se. In many instances, O, S, or N are the preferred heteroatoms. Hetero-single ring aromatic systems are preferably single rings with 5 or 6 ring atoms, and the ring can have from one to six heteroatoms. The hetero-polycyclic ring systems can have two or more rings in which two atoms are common to two adjoining rings (the rings are "fused") wherein at least one of the rings is a heteroaryl, e.g., the other rings can be cycloalkyls, cycloalkenyls, aryl, heterocycles, and/or heteroaryls. The hetero-polycyclic aromatic ring systems can have from one to six heteroatoms per ring of the polycyclic aromatic ring system. Preferred heteroaryl groups are those containing three to thirty carbon atoms, preferably three to twenty carbon atoms, more preferably three to twelve carbon atoms. Suitable heteroaryl groups include dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine, preferably dibenzothiophene, dibenzofuran, dibenzoselenophene, carbazole, indolocarbazole, imidazole, pyridine, triazine, benzimidazole, 1,2-azaborine, 1,3-azaborine, 1,4-azaborine, borazine, and aza-analogs thereof. Additionally, the heteroaryl group may be optionally substituted.

Of the aryl and heteroaryl groups listed above, the groups of triphenylene, naphthalene, anthracene, dibenzothiophene, dibenzofuran, dibenzoselenophene, carbazole, indolocarbazole, imidazole, pyridine, pyrazine, pyrimidine, triazine, and benzimidazole, and the respective aza-analogs of each thereof are of particular interest.

The terms alkyl, cycloalkyl, heteroalkyl, heterocycloalkyl, alkenyl, cycloalkenyl, heteroalkenyl, alkynyl, aralkyl, heterocyclic group, aryl, and heteroaryl, as used herein, are independently unsubstituted, or independently substituted, with one or more general substituents.

In many instances, the general substituents are selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acid, ether, ester, nitrile, isonitrile, sulfanyl, sulfinyl, sulfonyl, phosphino, boryl, and combinations thereof.

In some instances, the preferred general substituents are selected from the group consisting of deuterium, fluorine, alkyl, cycloalkyl, heteroalkyl, alkoxy, aryloxy, amino, silyl, alkenyl, cycloalkenyl, heteroalkenyl, aryl, heteroaryl, nitrile, isonitrile, sulfanyl, boryl, and combinations thereof.

In some instances, the more preferred general substituents are selected from the group consisting of deuterium, fluorine, alkyl, cycloalkyl, alkoxy, aryloxy, amino, silyl, boryl, aryl, heteroaryl, sulfanyl, and combinations thereof.

In yet other instances, the most preferred general substituents are selected from the group consisting of deuterium, fluorine, alkyl, cycloalkyl, aryl, heteroaryl, and combinations thereof.

The terms "substituted" and "substitution" refer to a substituent other than H that is bonded to the relevant position, e.g., a carbon or nitrogen. For example, when $R^1$ represents mono-substitution, then one $R^1$ must be other than H (i.e., a substitution). Similarly, when $R^1$ represents di-substitution, then two of $R^1$ must be other than H. Similarly, when $R^1$ represents zero or no substitution, $R^1$, for example, can be a hydrogen for available valencies of ring atoms, as in carbon atoms for benzene and the nitrogen atom in pyrrole, or simply represents nothing for ring atoms with fully filled valencies, e.g., the nitrogen atom in pyridine. The maximum number of substitutions possible in a ring structure will depend on the total number of available valencies in the ring atoms.

As used herein, "combinations thereof" indicates that one or more members of the applicable list are combined to form a known or chemically stable arrangement that one of ordinary skill in the art can envision from the applicable list. For example, an alkyl and deuterium can be combined to form a partial or fully deuterated alkyl group; a halogen and alkyl can be combined to form a halogenated alkyl substituent; and a halogen, alkyl, and aryl can be combined to form a halogenated arylalkyl. In one instance, the term substitution includes a combination of two to four of the listed groups. In another instance, the term substitution includes a combination of two to three groups. In yet another instance, the term substitution includes a combination of two groups. Preferred combinations of substituent groups are those that contain up to fifty atoms that are not hydrogen or deuterium, or those which include up to forty atoms that are not hydrogen or deuterium, or those that include up to thirty atoms that are not hydrogen or deuterium. In many instances, a preferred combination of substituent groups will include up to twenty atoms that are not hydrogen or deuterium.

The "aza" designation in the fragments described herein, i.e. aza-dibenzofuran, aza-dibenzothiophene, etc. means that one or more of the C-H groups in the respective aromatic ring can be replaced by a nitrogen atom, for example, and without any limitation, azatriphenylene encompasses both dibenzo[f,h]quinoxaline and dibenzo[f,h]quinoline. One of ordinary skill in the art can readily envision other nitrogen analogs of the aza-derivatives described above, and all such analogs are intended to be encompassed by the terms as set forth herein.

As used herein, "deuterium" refers to an isotope of hydrogen. Deuterated compounds can be readily prepared using methods known in the art. For example, U.S. Pat. No. 8,557,400, Patent Pub. No. WO 2006/095951, and U.S. Pat. Application Pub. No. US 2011/0037057, which are hereby incorporated by reference in their entireties, describe the making of deuterium-substituted organometallic complexes. Further reference is made to Ming Yan, et al., *Tetrahedron* 2015, 71, 1425-30 and Atzrodt et al., *Angew. Chem. Int. Ed. (Reviews)* 2007, 46, 7744-65, which are incorporated by reference in their entireties, describe the deuteration of the methylene hydrogens in benzyl amines and efficient pathways to replace aromatic ring hydrogens with deuterium, respectively.

It is to be understood that when a molecular fragment is described as being a substituent or otherwise attached to another moiety, its name may be written as if it were a fragment (e.g. phenyl, phenylene, naphthyl, dibenzofuryl) or as if it were the whole molecule (e.g. benzene, naphthalene, dibenzofuran). As used herein, these different ways of designating a substituent or attached fragment are considered to be equivalent.

In some instance, a pair of adjacent substituents can be optionally joined or fused into a ring. The preferred ring is a five, six, or seven-membered carbocyclic or heterocyclic ring, includes both instances where the portion of the ring formed by the pair of substituents is saturated and where the portion of the ring formed by the pair of substituents is unsaturated. As used herein, "adjacent" means that the two substituents involved can be on the same ring next to each other, or on two neighboring rings having the two closest available substitutable positions, such as 2,2' positions in a biphenyl, or 1,8 position in a naphthalene, as long as they can form a stable fused ring system.

The OLED of the Present Disclosure

Exciplex emission spectrum is known to be broad. However, for many OLED applications, it is desirable for the OLED device to have a narrow emission spectrum. For example, to render the most saturated color with the highest efficiency for blue micro-cavity, OLEDs require a narrow spectrum emitter. Further, stabilization of the OLED device (i.e., longer lifetime) may be achieved by using lower LUMO level materials in the device. Thus, formation of exciplex in OLEDs is generally something to be avoided. However, in many cases, an exciplex can be formed between the shallowest (i.e. the highest) HOMO level material in the OLED emissive layer and the deepest (i.e. the lowest) LUMO level material. The overall emission of the OLED device can then be contaminated by the emission from the exciplex. In some cases, the emission can be a mixture of that of the exciplex and that of the emitter and in other cases the emission can be entirely dominated by the exciplex.

Disclosed is an OLED configuration that although comprises an exciplex that has an emission spectrum that is redder than the emission spectrum of the emitter, the emission from the exciplex is suppressed so that the overall OLED emission spectrum is still dominated by the emission of the emitter. This is accomplished by many different avenues. One embodiment is to design the emitter so that exciplex formation between the host material(s) and the emitter is not part of the OLED's emission spectrum even though the energy of the exciplex as dictated by the HOMO and LUMO levels is lower than that of the triplet energy $T_1$ of the emitter.

Previous to the present disclosure, it was not known that exciplex contribution to the emission of an OLED can be suppressed even when the exciplex is the lowest energy state in the OLED.

To help mathematically determine the differences between cases where exciplex formation occurs and where it does not, we utilize the root mean squared (RMSD) function, equation (1) shown below. This function returns a single value that is the average difference between two spectra at all wavelengths.

$$RMSD = \sqrt{\frac{1}{n}\sum_{1}^{n}(I_1(\lambda) - I_2(\lambda))^2} \quad (1)$$

Figure 3:
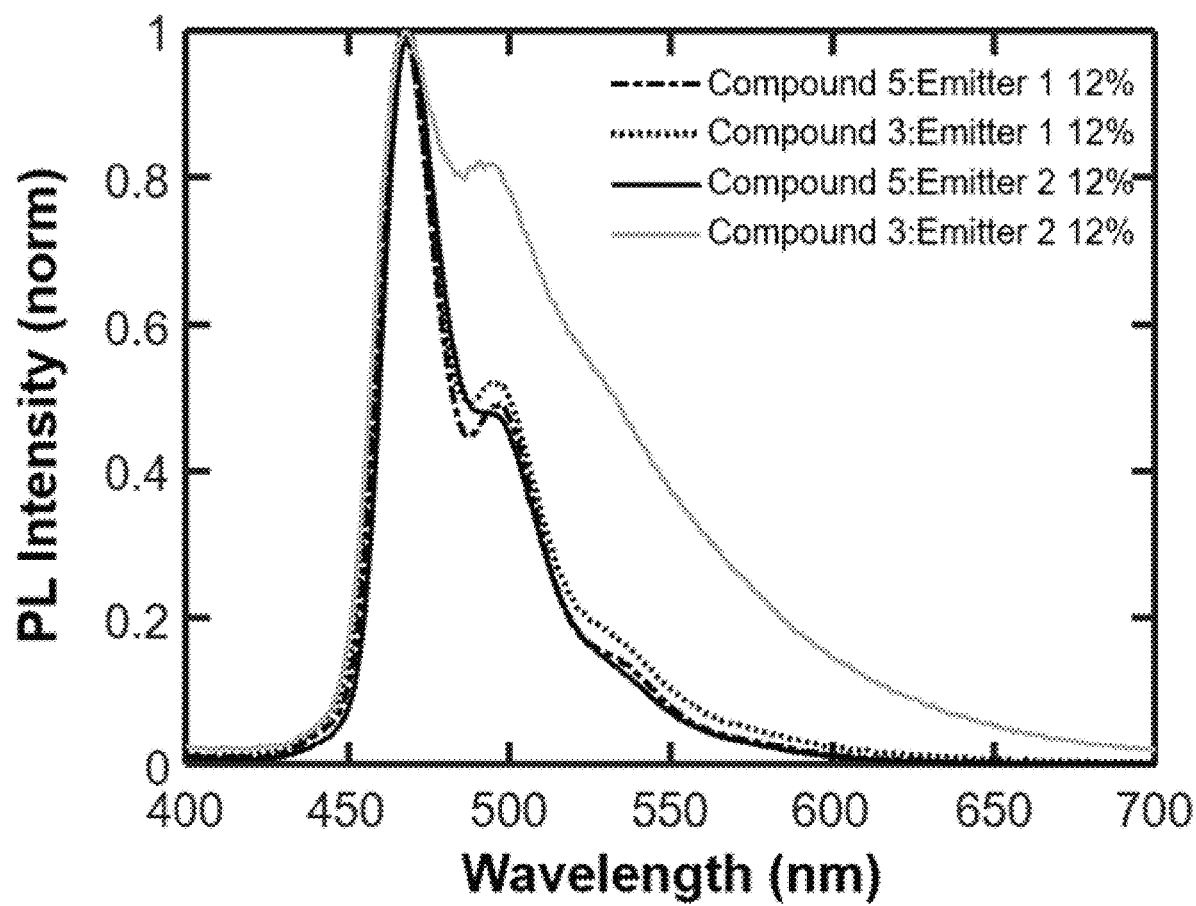
FIG. 3 shows a plot of the measured photoluminescent intensity (PL) of Emitter 1 compound and Emitter 2 compound doped in host compounds 5 and 3 individually where both spectrums are normalized to 1 and shifted to a peak wavelength of 468 nm.

In equation (1), n is the total number of points and $I_1$ and $I_2$ are the normalized intensity spectrums (electroluminescence (EL) or photoluminescence (PL)) as a function of wavelength, $\lambda$. Importantly, the spectrums that are being compared are shifted to the same peak wavelength and normalized which eliminates some of the spectral differences which can originate from putting the material into different dielectric constant materials. Functions $I_1$ and $I_2$ must have exactly the same number of points which can be achieved by interpolating existing data to a fixed number of wavelengths and must cover the same wavelength range, again achievable through interpolation. To demonstrate the versatility of this functional, we first plot the measured photoluminescent intensity (PL) of Emitter 1 and Emitter 2 doped at 12 percent by volume in host compounds 5 and 3 where both spectrums are normalized to a value of one and shifted to peak at the wavelength of 468 nm. This plot is shown in FIG. 3. Based on the energy levels of Compound 5, there is zero possibility of exciplex formation with either emitter. The PL spectrum of each emitter in Compound 5 represents the reference to which one can compare for cases where the energetics of the molecules predict formation of an exciplex. When emitters 1 and 2 are doped into Compound 3, the energy levels of the materials can predict what will happen. For both emitters in Compound 3, the emitter has the highest HOMO and Compound 3 has the lowest LUMO. We can then calculate the energy difference ($\Delta E$) for the exciplex that will occur based on the highest energy HOMO and lowest energy LUMO for each case: $\Delta E_{Emitter1}=|-5.33--2.78|=2.55$ eV and $\Delta E_{Emitter2}=|-5.35--2.78|=2.57$ eV, for these emitters doped into Compound 3. For both Emitter 1 and Emitter 2, $\Delta E$ is smaller than the triplet energy $E_T$ of 2.73 and 2.81 eV, respectively, indicating that an exciplex should form between each emitter and Compound 3. Indeed, for Emitter 2 in Compound 3 and as can be seen in FIG. 3, additional broad and red-shifted emission was observed. We attribute the distortion of the PL spectrum of Emitter 2 in Compound 3 to be indicative of the formation of an exciplex between the two materials. Conversely, there is very little change in the spectrum of Emitter 2 when it is doped into Compound 5 even though it also meets the energy criteria of exciplex formation which is that the triplet energy of the phosphorescent emitter is larger than the energy of the exciplex, $\Delta E$, which can be represented mathematically as $E_T-\Delta E_{Emitters}>0$.

As a stepping stone to calculating a single number to represent the differences in PL spectrum between two different films and provide a quantitative method for determining exciplex formation, we plot the difference as a function of wavelength for the PL spectrums of Emitter 1 and Emitter 2 in host Compounds 3 and 5, respectively. For each emitter, the absolute value of the difference between the normalize and shifted spectrum of the emitter in Compound 3 and Compound 5 is plotted in FIG. 4.

Figure 4:
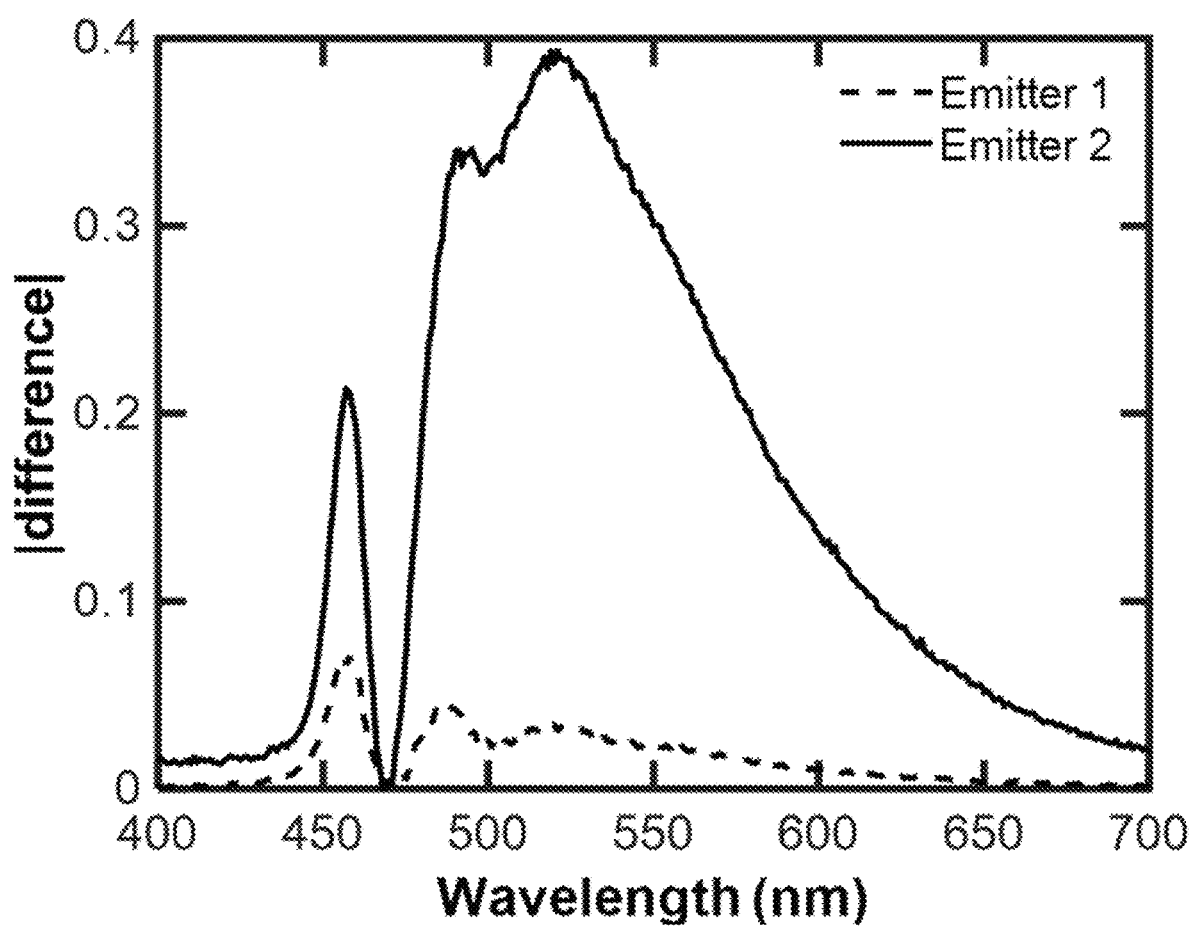
FIG. 4 shows a plot of the absolute value of the differences in PL spectrum, where the spectrums were normalized to 1 and shifted to a peak wavelength of 468 nm, between 2 films: one a film of an emitter doped in host Compound 3 at 12 vol. %; and a second film of the same emitter doped in host Compound 5 at 12 vol. %. The difference between the two films is plotted for Emitter 1 and Emitter 2.

The plot in FIG. 4 shows that Emitter 1 and Emitter 2 behave differently when doped into host Compounds 3 and 5. Emitter 1 exhibited very little difference when doped in the two host compounds. However, at many wavelengths Emitter 2 exhibited significant differences in PL spectrum compared for Compound 5 compared to Compound 3. Importantly, the values of the maximum difference occured over the wavelength range from ~500 nm to >650 nm, which is the same region in the PL spectrum for Emitter 2 in Compound 3 (FIG. 3) that changed compared to the PL in Compound 5. The sharp features from ~430 nm to ~480 nm in both emitters originates from the fact that the shape of the PL intensity around the maximum is slightly different leading to large differences. This difference is to be expected as each material has a different dielectric constant leading to slight differences in the measured PL spectrum around areas of high slope or could originate from differences in the original sampling of data and then the interpolation around those area of high slope.

Given the plot shown in FIG. 4, we can now calculate the RMSD value for each spectrum. We find that the RMSD for Emitter 1 (from comparing the PL spectrum of Emitter 1 doped into host Compounds 3 and 5 at 12 percent by volume) is 0.021 while the RMSD for Emitter 2 (from comparing the PL spectrum of Emitter 2 doped into host Compounds 3 and 5 at 12 percent by volume) is 0.198. The RMSD function is nearly 10× for the host and emitter combination that generates an exciplex (based on experimentally observed exciplex formation seen in FIG. 3), thus demonstrating the validity of using RMSD to determine if a material combination generates an exciplex and generate a quntative number.

Figure 5:
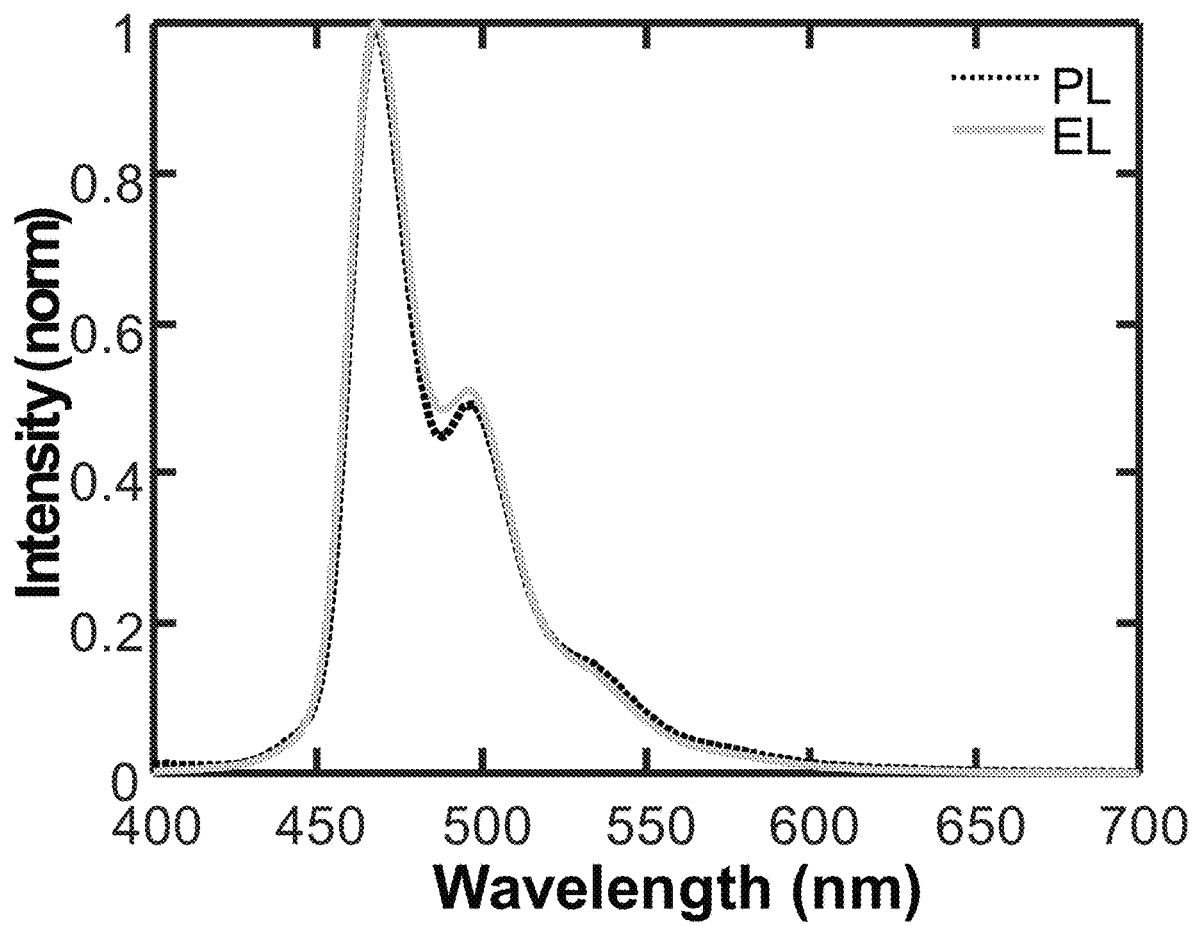
FIG. 5 shows a plot of the normalized and shifted PL spectrum of Emitter 1 doped in host Compound 5 (at 12 vol. %) and the normalized and shifted EL spectrum of Emitter 1 doped in a host (at 12 vol. %) where the host is a mixture of Compound 5 and Compound 4 (60 vol. % of Compound 4).

Next, a baseline level of RMSD that occurs when comparing different spectrums was determined. First, the RMSD value for different types of spectral measurements was calculated. FIG. 5 shows a plot of the normalized and shifted PL spectrum of Emitter 1 in host Compound 5 (12 vol. %) and the EL spectrums of Emitter 1 in a host that is a mixture of Compound 5 and Compound 4 (60 vol. % of Compound 4 and 12 vol. % Emitter 1). The RMSD was 0.012 which is quite low. The RMSD in EL was also calculated where the emissive layer (EML) composition is Compound 5 doped with 40 vol. % Compound 3, and 10 or 15 vol. % Emitter 1. The RMSD was 0.0073. The RMSD in EL was also calculated where the EML composition is Compound 5 doped with 20 vol. % Compound 3 and 15 vol. % Emitter 1 to Compound 5 doped with 60 vol. % Compound 3 and 15 vol. % Emitter 1. The RMSD was 0.0147. Given that the RMSD for comparing spectrum generated from different methods of generating the spectrum (EL vs. PL), varying the percentage of emitter doping, and varying the ratio of hosts in the EML are all low values indicates that RMSD is a robust method for comparing spectrums. We further reviewed many different spectra where there were NO expected exciplex, we fould that a RMSD difference of greater than 0.05 is meaningful and a good value at which exciplex formation can be considered significant.

At times, the conversion of a purely mathematical expression to a verbal description is useful. The RMSD can be recast into a description of likeness. For example, if the 2 spectrums compared are identical, then the RMSD is 0. Such two spectrums are exactly alike or 100% alike. Thus, one can define and quantify the likeness between two spectrums as a percentage using the following realation: (1-RMSD) *100. Thus, in the present context, all spectrums that are ≥95% alike will be considered to be the same due to the fact that values of RDMS less than 0.05 are not meaningfully different.

Table 1 below lists the HOMO, LUMO, triplet energy $T_1$, and predicted excimer energy levels for Compounds 1 through 5, and Emitters 1 and 2. For both Emitters 1 and 2, Compounds 1, 2, and 3 should form exciplexes based on the energy levels while Compounds 4 and 5 should not. The HOMO energy is estimated from the first oxidation potential derived from cyclic voltammetry. The LUMO energy is estimated from the first reduction potential derived from cyclic voltammetry. The triplet energy $T_1$ of the emitter compounds is measured using the peak wavelength from the photoluminescence at 77K. In choosing the emitter-host combination, if the condition $a \leq E_T - \Delta E \leq b$ is met, exciplex should form. In $a \leq E_T - \Delta E \leq b$, $E_T$ is triplet energy $T_1$ of the emitter, which is the lowest $T_1$ energy among all materials in the organic emissive layer, $\Delta E$ is the energy gap between the HOMO energy of the material having the highest HOMO energy in the organic emissive layer and the LUMO energy of the material having the lowest LUMO energy in the organic emissive layer, a has a value of 0.00 up to 0.15 eV, and b has a value of 0.05 up to 0.45 eV. Although, the above condition is met, by designing an appropriate emitter, the OLED will have an emission spectrum that is at least 95% like the emission spectrum of an OLED whose organic emissive layer consists of the emitter and an inert host.

Figure 6:
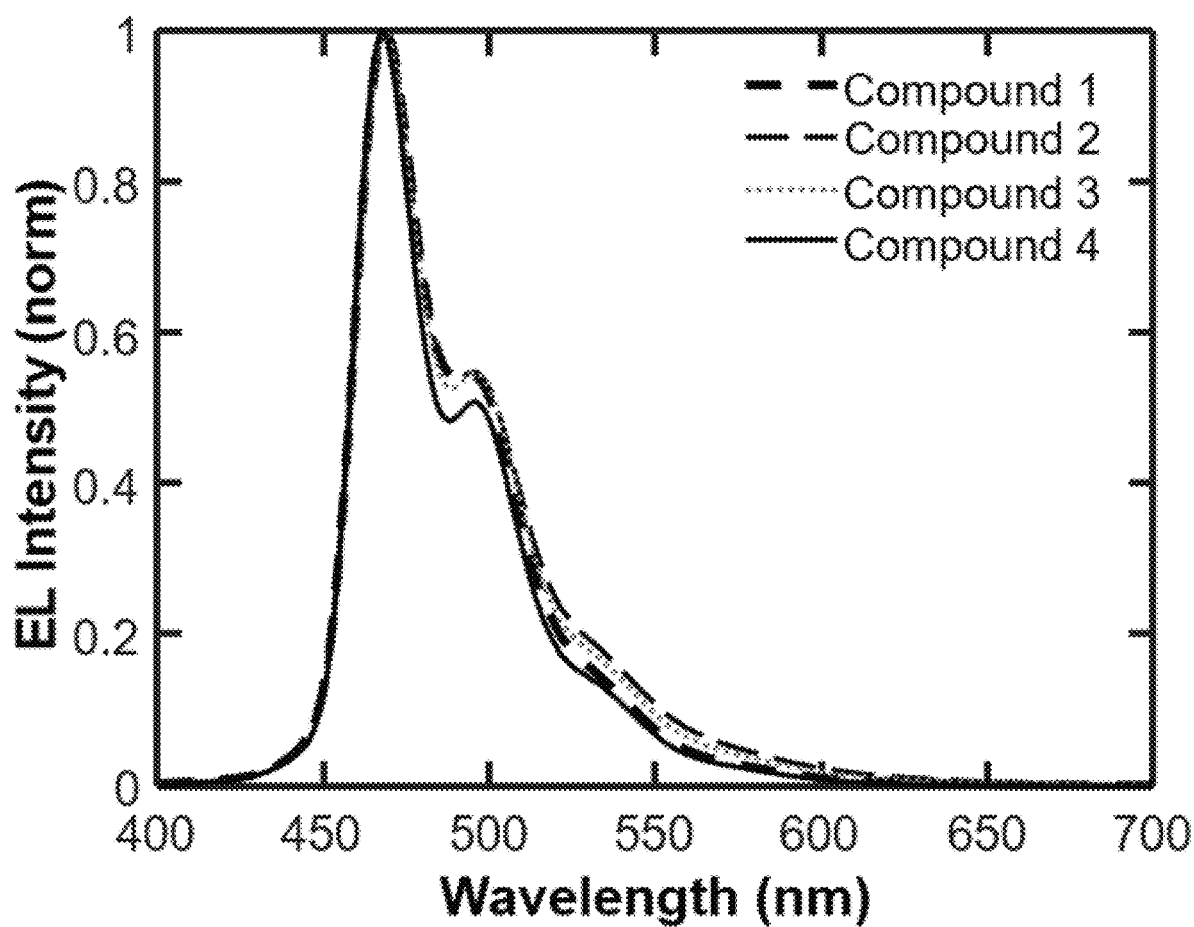
FIG. 6 shows the normalized and shifted EL spectra of Emitter 1 doped in four different mixtures of Compound 5 and Compounds 1, 2, 3, and 4.

Shown in FIG. 6 is the EL spectra of Emitter 1 doped in four different mixtures of Compound 5 and Compounds 1, 2, 3, and 4. For each host Compound 1-4 the mixtures prepared according to the following the formula: Compound 5 doped with 40 vol. % of Compound 1 and 12 vol. % of Emitter 1; Compound 5 doped with 40 vol. % of Compound 2 and 12 vol. % of Emitter 1; Compound 5 doped with 40 vol. % of Compound 3 and 12 vol. % of Emitter 1; Compound 5 doped with 40 vol. % of Compound 4 and 12 vol. % of Emitter 1. We find that the RMSD of comparing mixtures with Compound 5 and 1, 2 or 3 to Compound 5 doped with Compound 4 where exciplex formation is not energetically predicted are 0.0201, 0.0306, and 0.0239 respectively. Or in plain language, EMLs of the same composition as but varying the host from Compound 4 to Compounds 1, 2, or 3 all within 3% like each other and thus are effectively the same. Thus, there is NO excimer formation between Emitter 1 and these hosts even though the energetics of the HOMO level of the emitter and the LUMO level of the host predict that there should be excimer formation. This result is completely unexpected. Without being bound by any theories, this unexpected result may be due to the steric effect from the emitter. The energy of an exciton has a spatial component and increases as the distances between the hole and electron parts of the wavefunction increases. If the steric component of the emitter increases the distance over which the exciplex between the emitter and E-type host is formed, that would lead to a higher exciplex energy and push the energy of the exciplex to be greater than the triplet energy $T_1$ of the emitter. Thus, emitter molecules with greater steric protection enables the use of E-type hosts with lower LUMO levels which in turn leads to stabilization of the overall device. The advantage of expanding the energy level range that can be used in the devices is especially beneficial for blue emitters. Thus, the OLED configuration disclosed herein provides a roadmap for designing emitter molecules and choosing proper host system, especially an e-host, to achieve a stable OLED, especially, a stable blue phosphorescent OLED.

Table 1: Energy levels and predictions of excimer formation based on the energy levels for the emitters and host compounds.

TABLE 1

Energy levels and predictions of excimer formation based on the energy levels for the emitters and host compounds.

| Material | Triplet energy $T_1$ [eV] | HOMO [eV] | LUMO [eV] | $\Delta E_{Emitter1}$; $E_{TEmitter1}$- $\Delta E_{Emitter1}$ (Possible exciplex); (reality) | $\Delta E_{Emitter2}$; $E_{TEmitter2}$- $\Delta E_{Emitter2}$ (Possible exciplex); (reality) |
|---|---|---|---|---|---|
| Host Compound 1 | 3.00 | −5.76 | −2.65 | 2.68; 0.05 (Yes); (No) | 2.70; 0.11 (Yes); (Yes) |
| Host Compound 2 | 2.97 | −5.74 | −2.75 | 2.58; 0.15 (Yes); (No) | 2.60; 0.21 (Yes); (Yes) |
| Host Compound 3 | 2.98 | <−5.8 | −2.78 | 2.55; 0.18 (Yes); (No) | 2.57; 0.24 (Yes); (Yes) |
| Host Compound 4 | 2.95 | −5.7 | −2.46 | 2.87; −0.14 (No); (No) | 2.89; −0.08 (No); (No) |
| Host Compound 5 | 2.99 | −5.46 | −1.96 | 3.26; −0.53 (No); (No) | 3.18; −0.37 (No); (No) |
| Emitter 1 | 2.73 | −5.33 | −2.07 | — | — |
| Emitter 2 | 2.81 | −5.35 | −2.17 | — | — |

In Table 1, ΔE for each EML mixture is calculated by first determining which compound in the mixture has the High HOMO energy (the highest HOMO energy among all materials in the EML mixture) and which compound in the mixture has the Low LUMO energy (the lowest LUMO energy among all materials in the EML mixture). Then, ΔE is the energy gap between the High HOMO energy and the Low LUMO energy. Then, one determines $E_T$–ΔE and whether the following condition, a≤$E_T$–ΔE≤b, is satisfied, where $E_T$ is the triplet energy $T_1$ of the first emitter, which is the lowest $T_1$ energy among all materials in the organic emissive layer, and wherein a is 0.00 up to 0.15 eV, and b is 0.05 up to 0.45 eV.

The compounds referenced in the data shown in Table 1 are shown below:

Compound 1

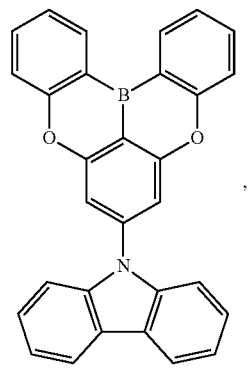

,

Compound 2

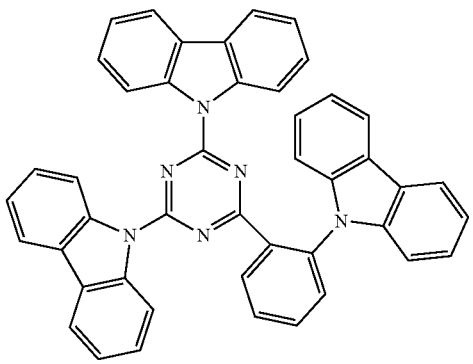

,

Compound 3

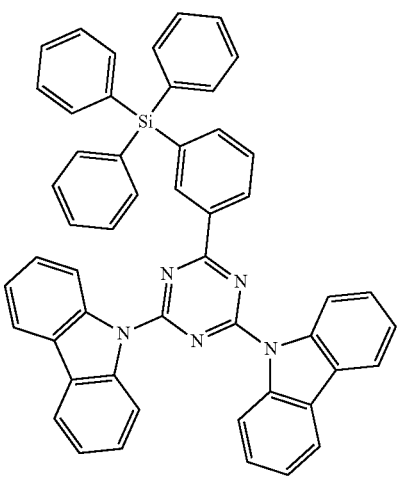

,

Compound 4

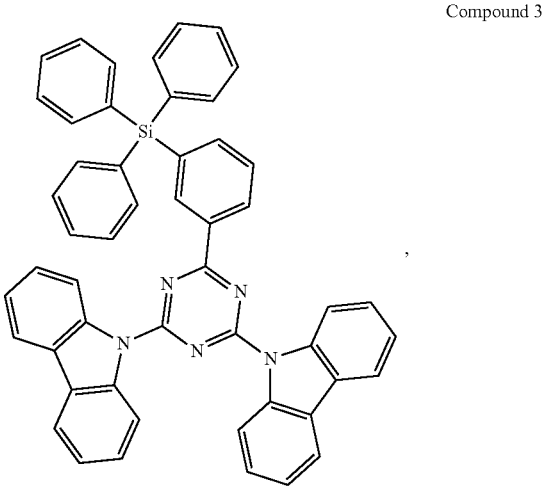

,

Compound 5

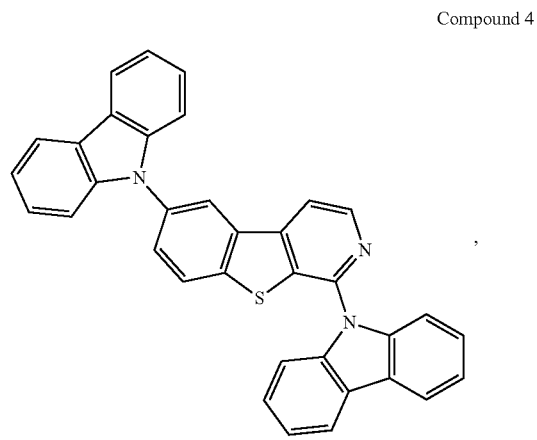

,

-continued

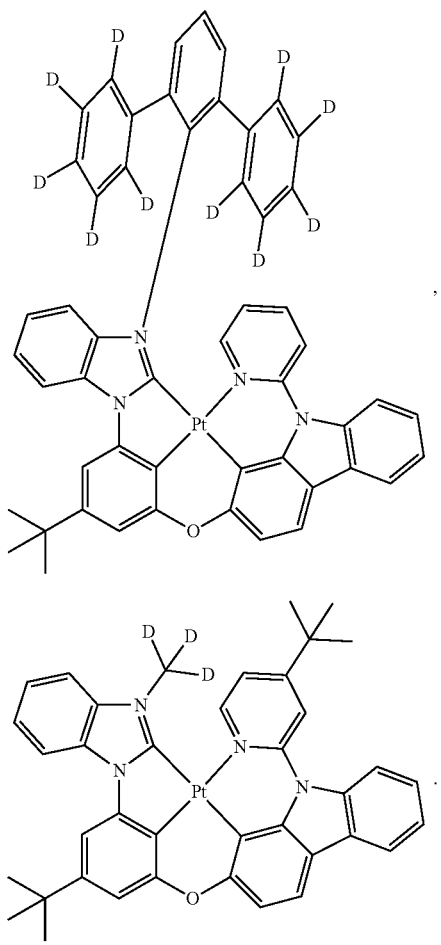

Emitter 1

Emitter 2

Solution cyclic voltammetry and differential pulsed voltammetry were performed using a CH Instruments model 6201B potentiostat using anhydrous dimethylformamide solvent and tetrabutylammonium hexafluorophosphate as the supporting electrolyte. Glassy carbon, and platinum and silver wires were used as the working, counter and reference electrodes, respectively. Electrochemical potentials were referenced to an internal ferrocene-ferroconium redox couple (Fc+/Fc) by measuring the peak potential differences from differential pulsed voltammetry. The $E_{HOMO}=-[(E_{ox1}$ vs Fc+/Fc)+4.8]$, and the $E_{LUMO}=-[(E_{red1}$ vs Fc+/Fc)+4.8]$, wherein $E_{ox1}$ is the first oxidation potential, and the $E_{red1}$ is the first reduction potential.

Disclosed herein is an organic light emitting device (OLED) comprising an anode, a cathode, and an organic emissive layer, disposed between the anode and the cathode. The organic emissive layer comprises a first host material having a highest occupied molecular orbital (HOMO) energy and a lowest unoccupied molecular orbital (LUMO) energy, and an emitter material having a HOMO energy and a LUMO energy. The emitter is selected from the group consisting of a phosphorescent metal complex, and a delayed fluorescent emitter. The emitter and host materials in the organic emissive layer satisfy the following conditions: $a \leq E_T - \Delta E \leq b$; where $E_T$ is triplet energy $T_1$ of the emitter, which is the lowest $T_1$ energy among all materials in the organic emissive layer; $\Delta E$ is the energy gap between the High HOMO energy and the Low LUMO energy; where a is 0.00 up to 0.15 eV, and b is 0.05 up to 0.45 eV; and where the emission spectrum of the OLED is at least 95% like the emission spectrum of an OLED whose organic emissive layer consists of the first emitter and an inert host. "High HOMO energy" is defined as the highest HOMO energy among all materials in the organic emissive layer and "Low LUMO energy" is defined as the lowest LUMO energy among all materials in the organic emissive layer.

In some embodiments, all materials in the organic emissive layer can be in a mixture. The mixture can be a homogeneous mixture or the compoents of the organic emissive layer can be in graded concentrations through the thickness of the emissive layer. The concentration grading can be linear, non-linear, sinusoidal, etc.

The emitter can be a phosphorescent metal complex or a delayed fluorescent emitter.

In some embodiments of the OLED, a is 0.15 eV. In some embodiments, a is 0.10 eV. In some embodiments a is preferably 0.05 eV. In some embodiments, b is 0.05 eV. In some embodiments, b is 0.15 eV. In some embodiments, b is 0.25 eV. In some embodiments, b is preferably 0.35 eV. In some embodiments, $E_T$ is at least 2.60 eV. In some embodiments, $E_T$ is at least 2.65 eV. In some embodiments $E_T$ is at least 2.70 eV. In some embodiments $E_T$ is preferably at least 2.75 eV.

In some embodiments of the OLED, the High HOMO energy is the HOMO energy of the emitter, and the Low LUMO energy is the LUMO energy of the first host. In some embodiments, the High HOMO energy is the HOMO energy of the first host, and the Low LUMO energy is the LUMO energy of the emitter.

In some embodiments, the OLED further comprises a second host, where the High HOMO energy is the HOMO energy of the first host, and the Low LUMO energy is the LUMO energy of the second host. In some embodiments, the High HOMO energy is the HOMO energy of the second host, and the Low LUMO energy is the LUMO energy of the first host.

In some embodiments of the OLED that comprises a second host, the first host, the second host, and the emitter are the only components in the emissive layer. In some embodiments, the first host, the second host, and the emitter are the only components in the emissive layer.

In some embodiments, the OLED has an operation voltage less than 6.0 V at 10 mA/cm². In some embodiments, the OLED has an operation voltage less than 5.0 V at 10 mA/cm². In some embodiments, the OLED has an operation voltage less than 4.0 V at 10 mA/cm².

In some embodiments of the OLED, the first host comprises at least one chemical moiety selected from the group consisting of triphenylene, carbazole, indolocarbazole, benzothiophene, benzofuran, dibenzothiophene, dibenzofuran, pyridine, pyridazine, pyrimidine, pyrazine, triazine, imidazole, boryl, 5,9-dioxa-13b-boranaphtho[3,2,1-de]anthracene, and aza-variants thereof.

In some embodiments of the OLED, the emitter is a phosphorescent blue emitter. Blue emitter here refers to a phosphorescent emitter whose emission λmax is less than 490 nm, less than 480 nm, less then 470 nm, or preferably less than 460 nm, or whose emission in CIE coordinate is: X<0.3, <0.25, <0.2, or preferably <0.18, and Y<0.5, <0.4, <0.3, or preferably <0.2.

In some embodiments of the OLED, the emitter has the formula of $M(L^1)x(L^2)y(L^3)z$; where, $L^1$, $L^2$ and $L^3$ can be the same or different; xis 1, 2, or 3; y is 0, 1, or 2; z is 0, 1, or 2; x+y+z is the oxidation state of the metal M; $L^1$, $L^2$, and $L^3$ are each independently selected from the group consisting of:

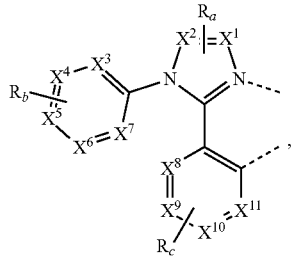

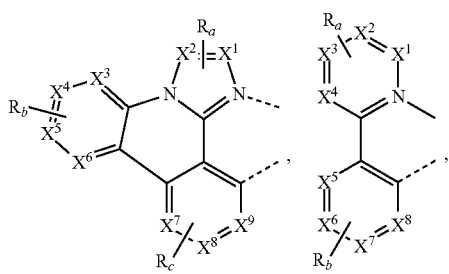

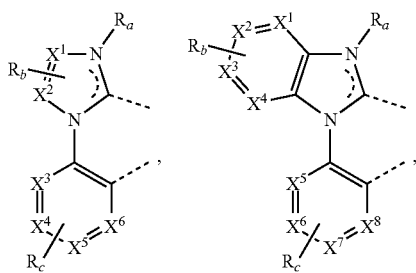

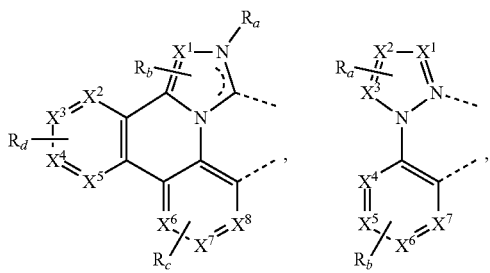

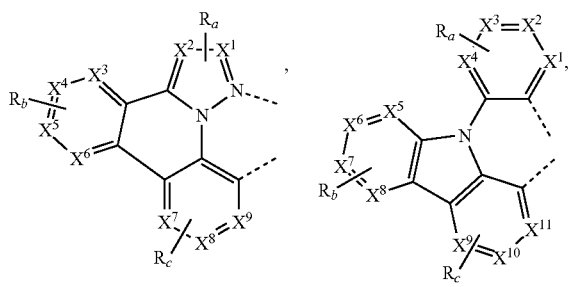

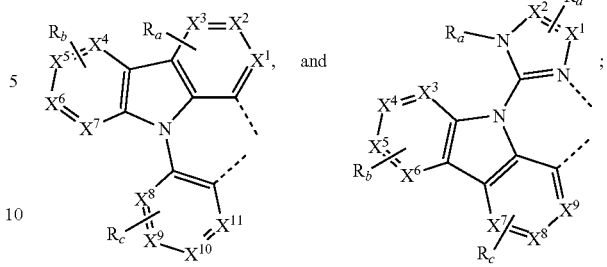

where, each $X^1$ to $X^{11}$ are independently selected from the group consisting of carbon and nitrogen; each $R_a$, $R_b$, $R_c$, and $R_d$ may represent from mono substitution to the possible maximum number of substitution, or no substitution; $R_a$, $R_b$, $R_c$, and $R_d$ are each independently a hydrogen or a substituent selected from the group consisting of the general substituents defined herein; and any two $R_a$, $R_b$, $R_c$, and $R_d$ are optionally fused or joined to form a ring or form a multidentate ligand.

In some embodiments, at least one of $R_a$, $R_b$, $R_c$, and $R_d$ comprises a chemical group containing at least three 6-membered aromatic rings that are not fused next to each other. In some embodiments, at least one of $R_a$, $R_b$, $R_c$, and $R_d$ comprises a chemical group containing at least four 6-membered aromatic rings that are not fused next to each other. In some embodiments, at least one of $R_a$, $R_b$, $R_c$, and $R_d$ comprises a chemical group containing at least five 6-membered aromatic rings that are not fused next to each other. In some embodiments, at least one of $R_a$, $R_b$, $R_c$, and $R_d$ comprises a chemical group containing at least six 6-membered aromatic rings that are not fused next to each other. In some embodiments, at least one of $R_a$, $R_b$, $R_c$, and $R_d$ comprises a chemical group containing terphenyl (more preferably meta-terphenyl) or N-phenyl carbazole. In some embodiments, $R_a$ comprises a chemical group as described herein. The more detailed descriptions of adding bulky group to the ligand periphery of the emitter complex has been disclosed in detail elsewhere, such as in U.S. application Ser. No. 16/807,877, the entire contents of which are incorporated herein by reference.

In some embodiments of the OLED where the emitter has the formula of $M(L^1)_x(L^2)_y(L^3)_z$, the emitter can have the formula selected from the group consiting of $Ir(L^1)(L^2)(L^3)$, $Ir(L^1)_2(L^2)$, and $Ir(L^1)_3$, where $L^1$, $L^2$, and $L^3$ are different and each is independently selected from the group consisting of:

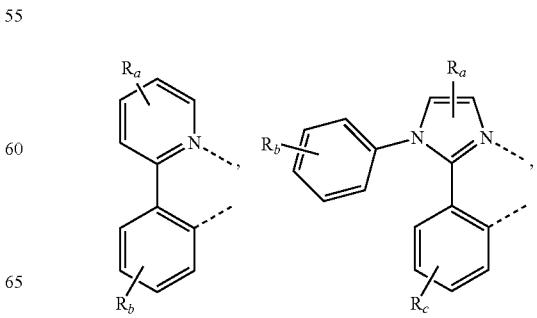

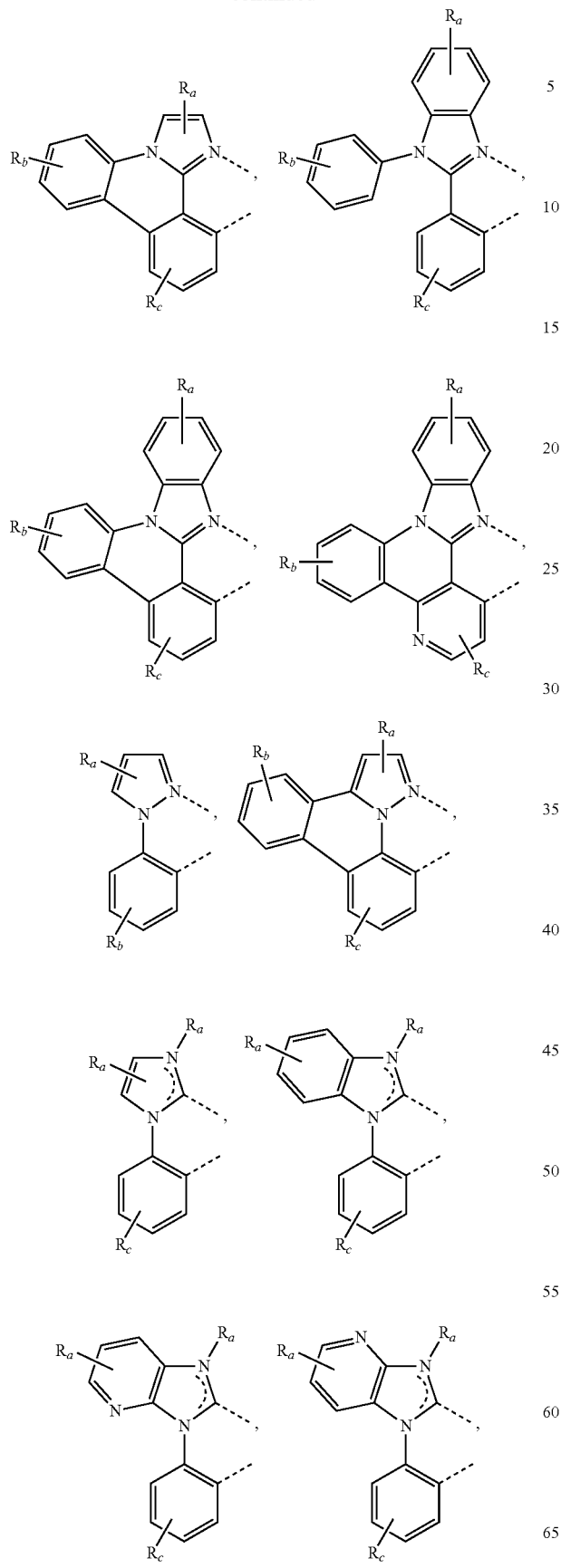
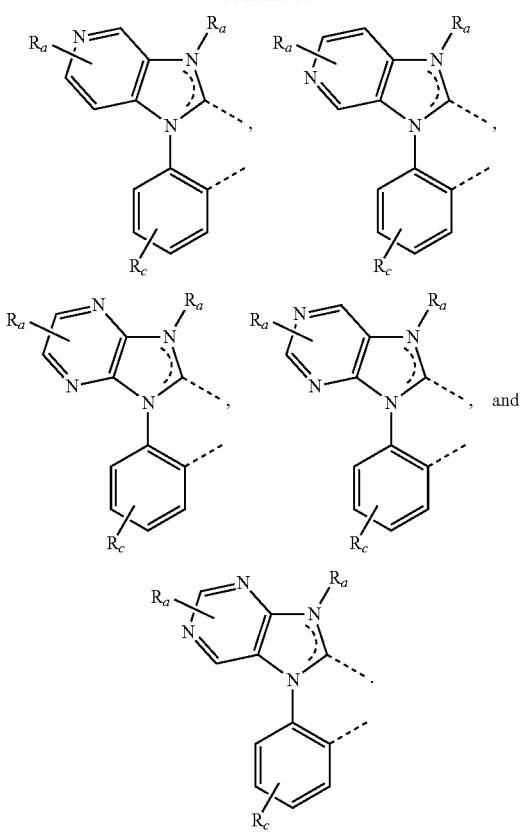

In some embodiments of the compound where the emitter has the formula of $M(L^1)_x(L^2)_y(L^3)_z$, the emitter can have the formula of $Pt(L^1)_2$ or $Pt(L^1)(L^2)$ and $L^1$ and $L^2$ are each a different bidentate ligand. In some embodiments, $L^1$ is connected to the other $L^1$ or $L^2$ to form a tetradentate ligand. In some embodiments, the emitter has the formula of $M(L^1)_2$ or $M(L^1)(L^2)$, where M is Ir, Rh, Re, Ru, or Os, and $L^1$ and $L^2$ are each a different tridentate ligand. In some embodiments, $L^1$ is selected from the group consisting of:

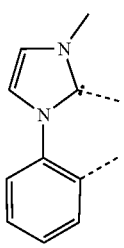

$L_{B1}$

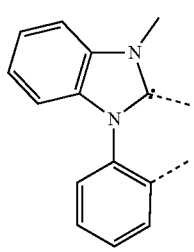

$L_{B2}$

L<sub>B3</sub>
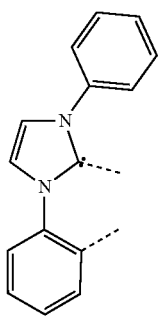
L<sub>B4</sub>
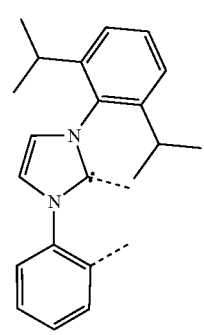
L<sub>B5</sub>
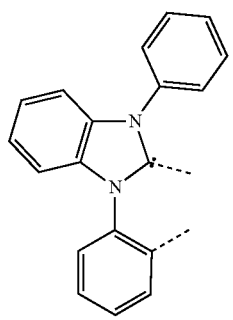
L<sub>B6</sub>
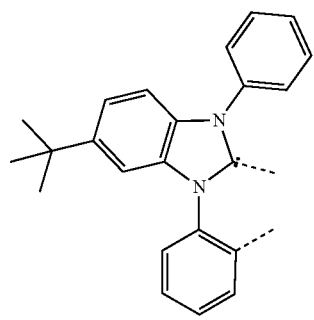
L<sub>B7</sub>
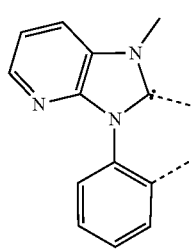
L<sub>B8</sub>
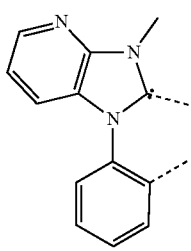
L<sub>B9</sub>
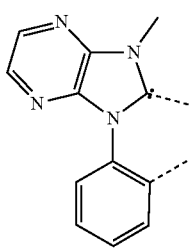
L<sub>B10</sub>
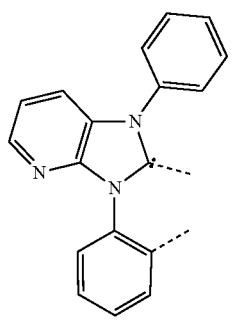
L<sub>B11</sub>
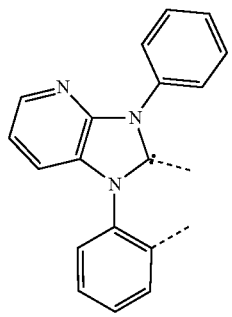
L<sub>B12</sub>
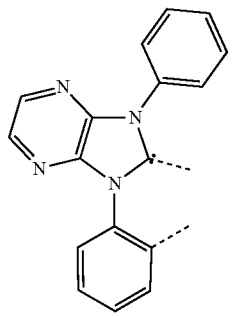

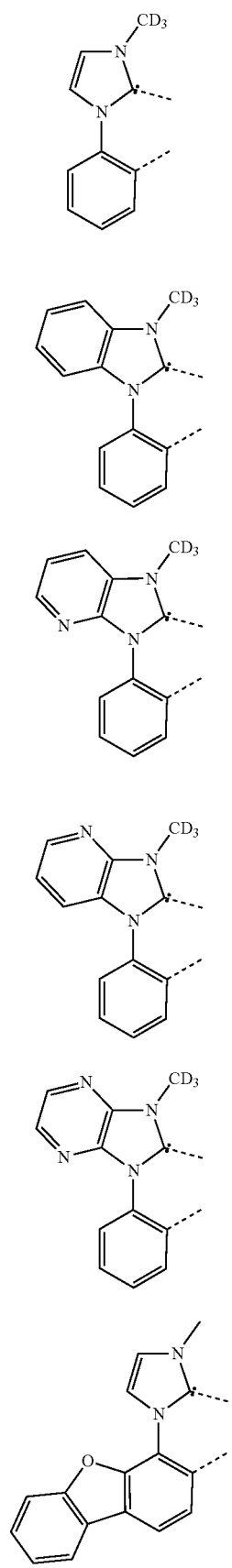
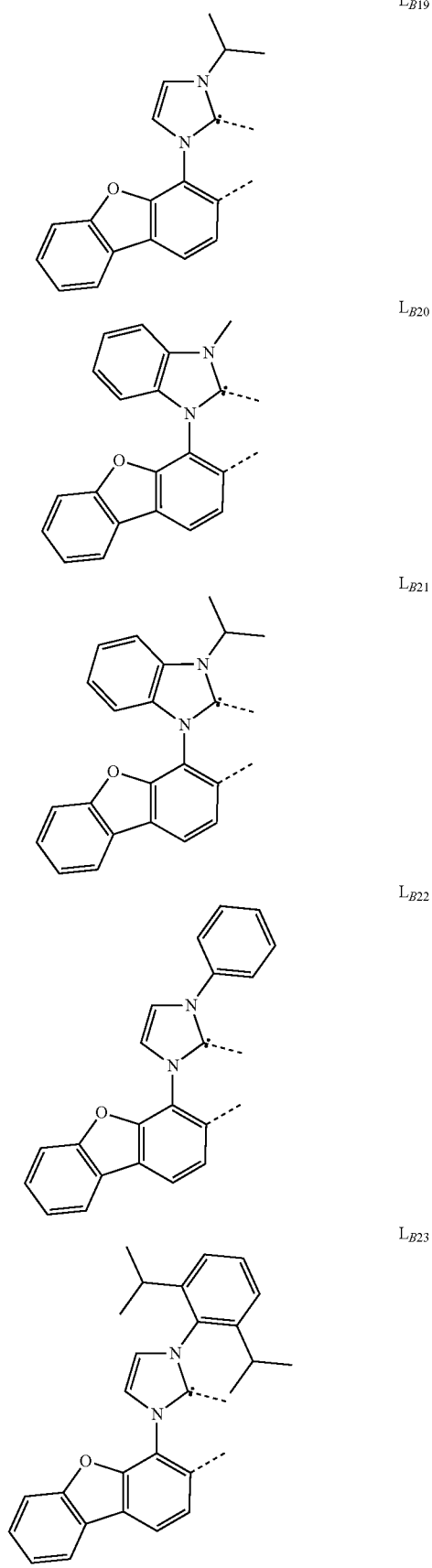

L_{B24}
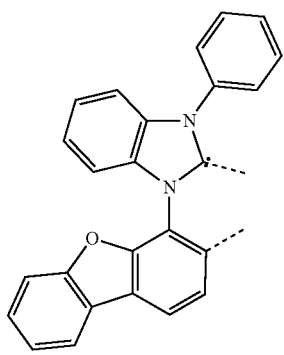
L_{B25}
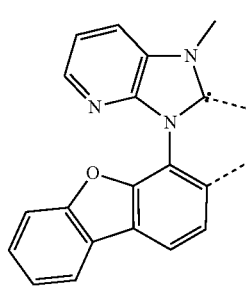
L_{B26}
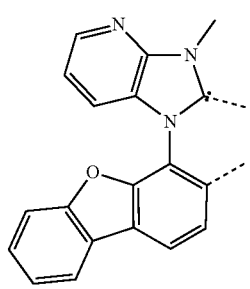
L_{B27}
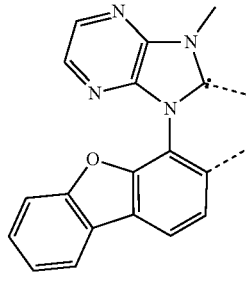
L_{B28}
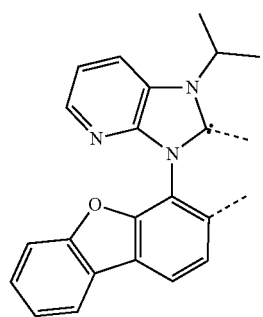
L_{B29}
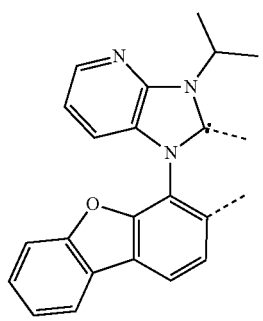
L_{B30}
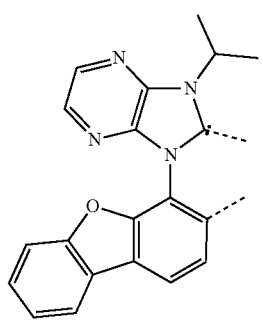
L_{B31}
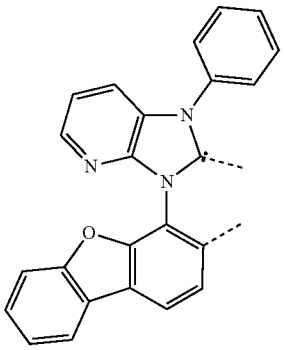
L_{B32}
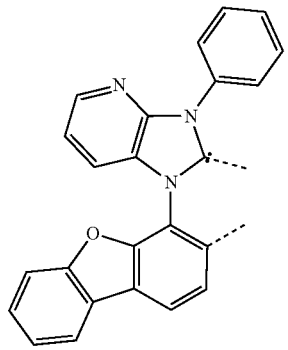

L_{B33}
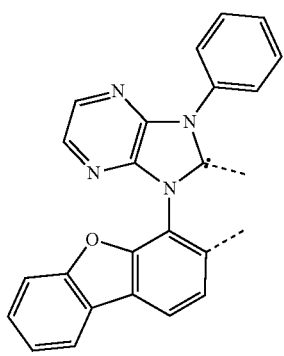
L_{B34}
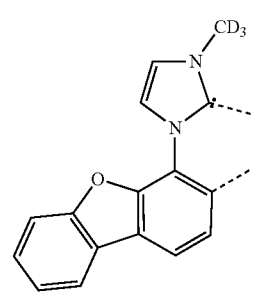
L_{B35}
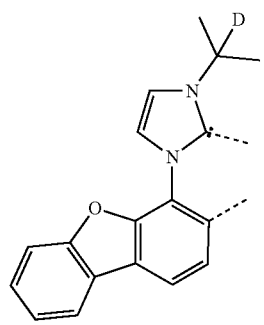
L_{B36}
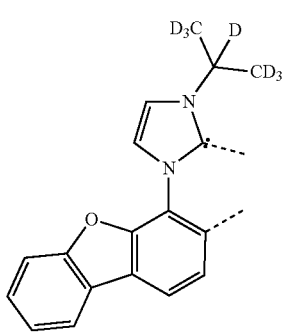
L_{B37}
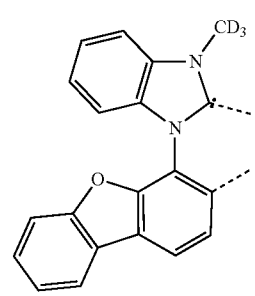
L_{B38}
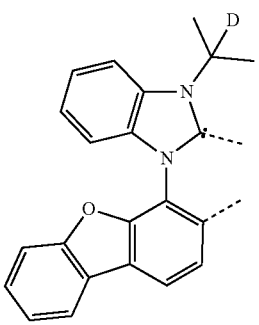
L_{B39}
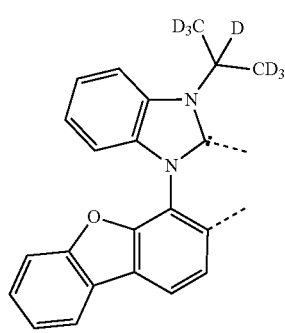
L_{B40}
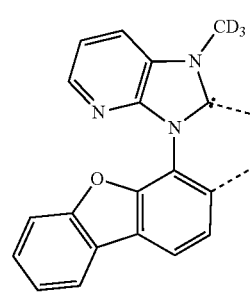
L_{B41}
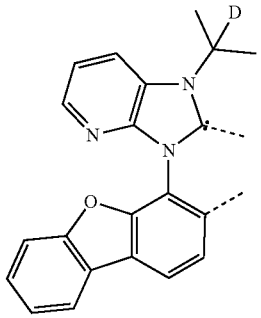
L_{B42}
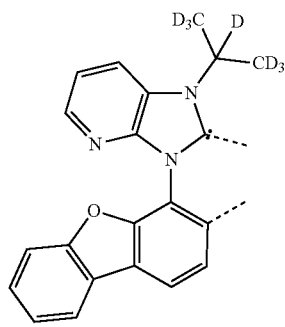

L<sub>B43</sub> 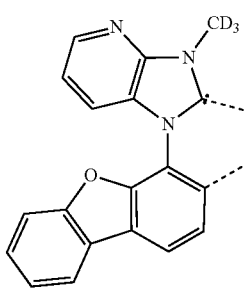
L<sub>B44</sub> 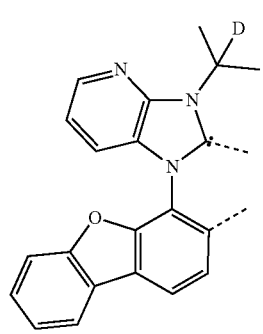
L<sub>B45</sub> 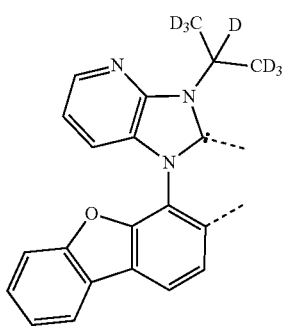
L<sub>B46</sub> 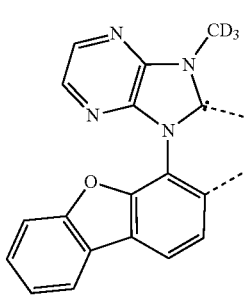
L<sub>B47</sub> 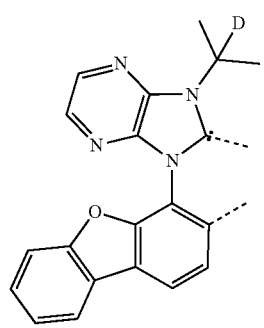
L<sub>B48</sub> 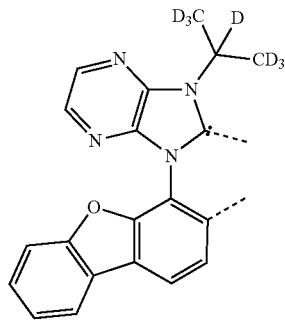
L<sub>B49</sub> 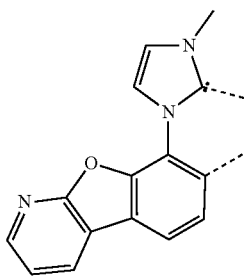
L<sub>B50</sub> 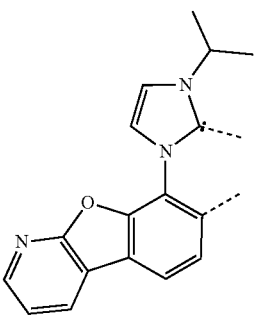
L<sub>B51</sub> 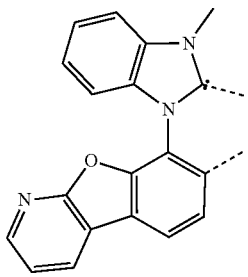
L<sub>B52</sub> 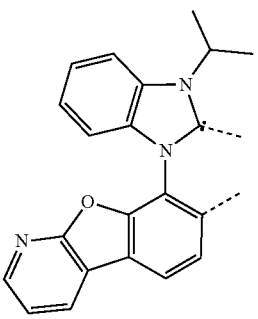

L_B53 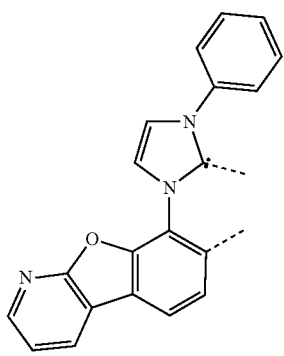
L_B54 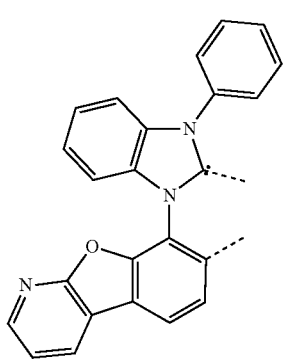
L_B55 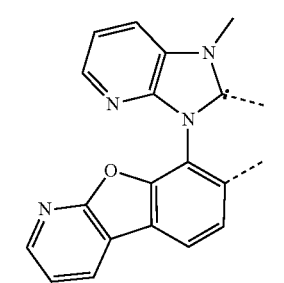
L_B56 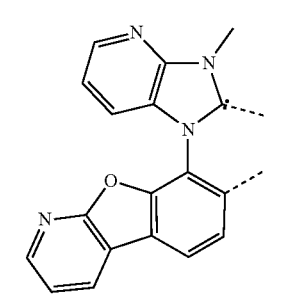
L_B57 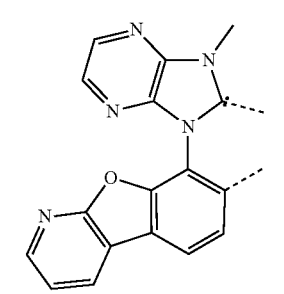
L_B58 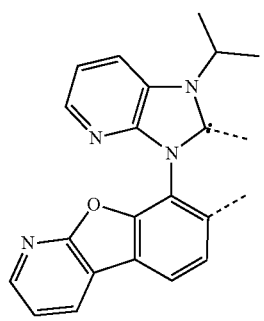
L_B59 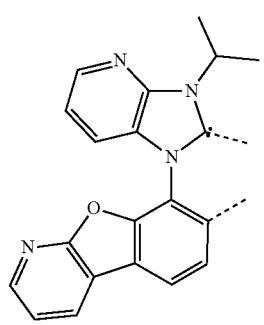
L_B60 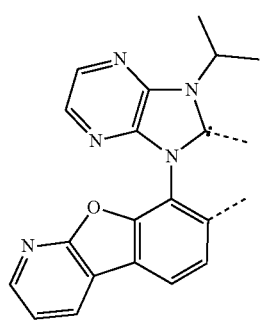
L_B61 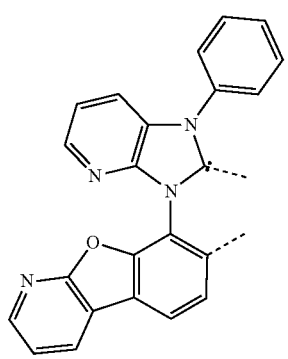

L_B62 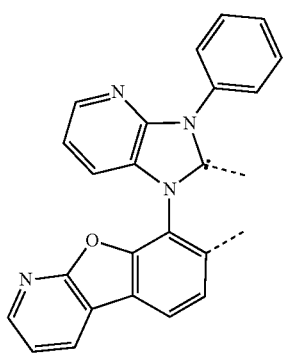
L_B63 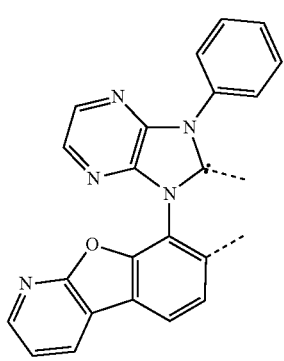
L_B64 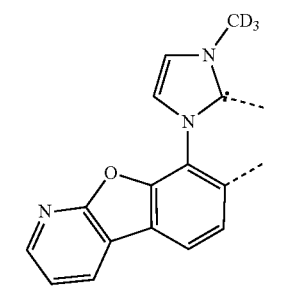
L_B65 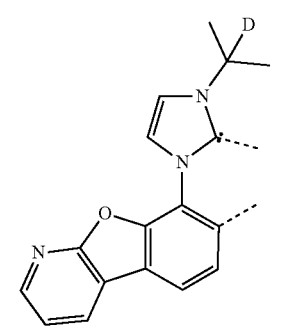
L_B66 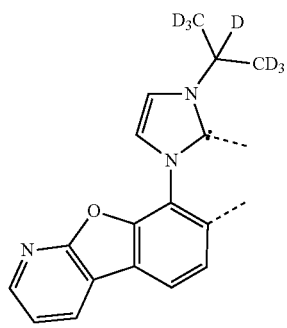
L_B67 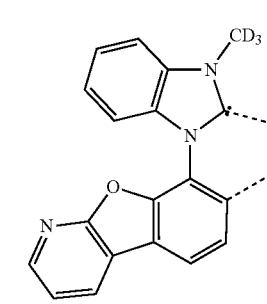
L_B68 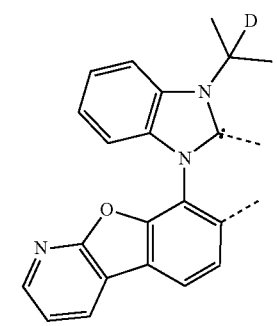
L_B69 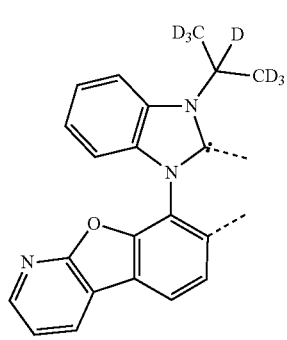
L_B70 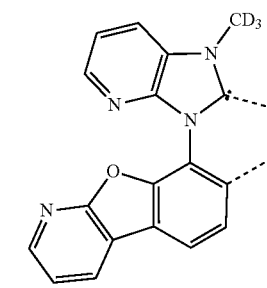

-continued
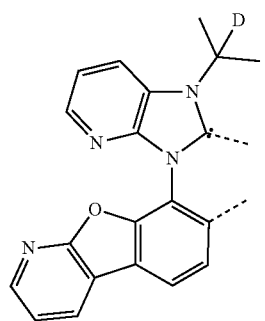
L_{B71}
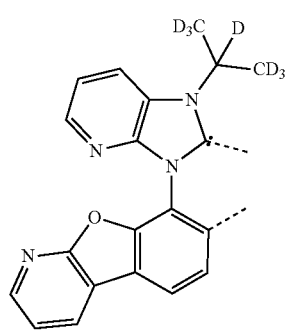
L_{B72}
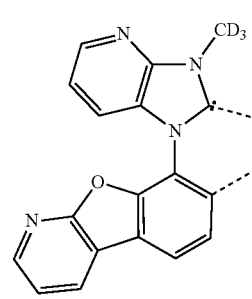
L_{B73}
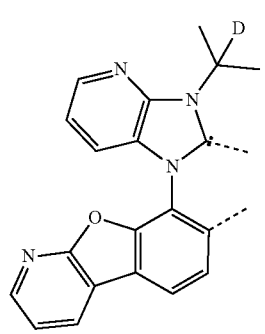
L_{B74}
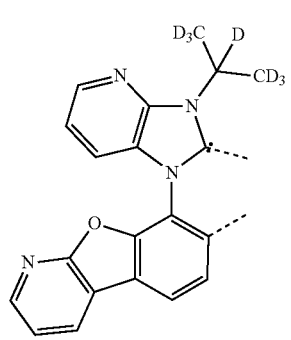
L_{B75}
-continued
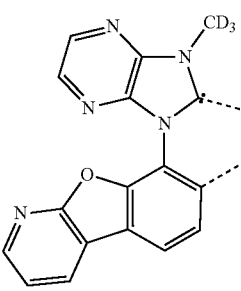
L_{B76}
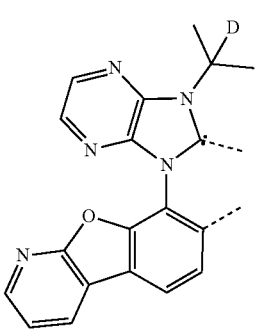
L_{B77}
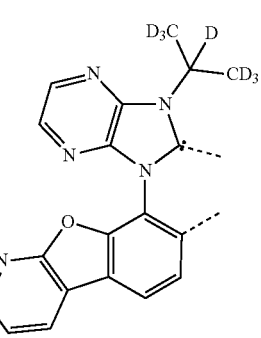
L_{B78}
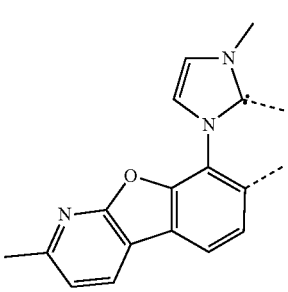
L_{B79}
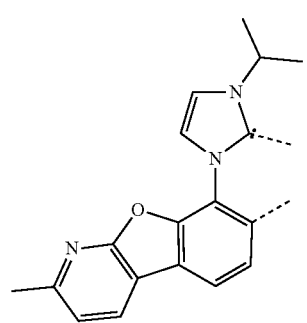
L_{B80}

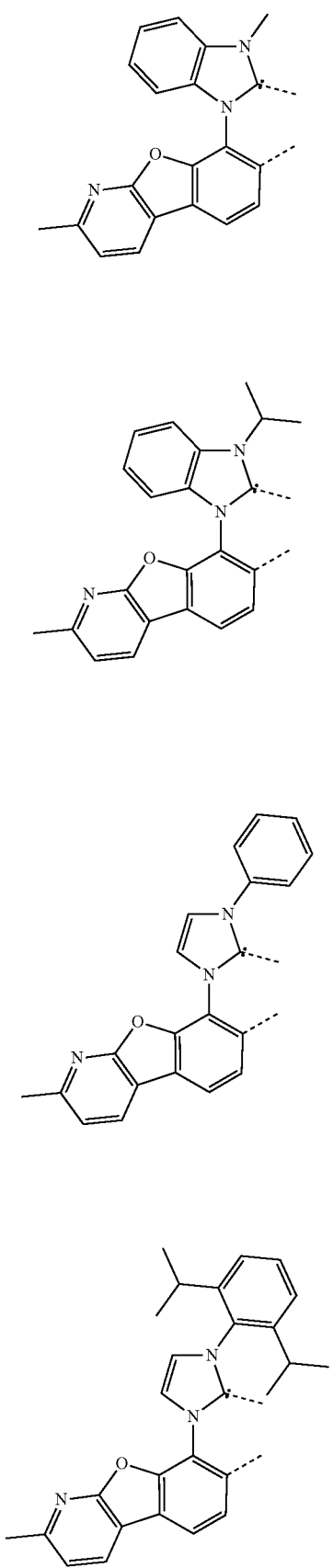
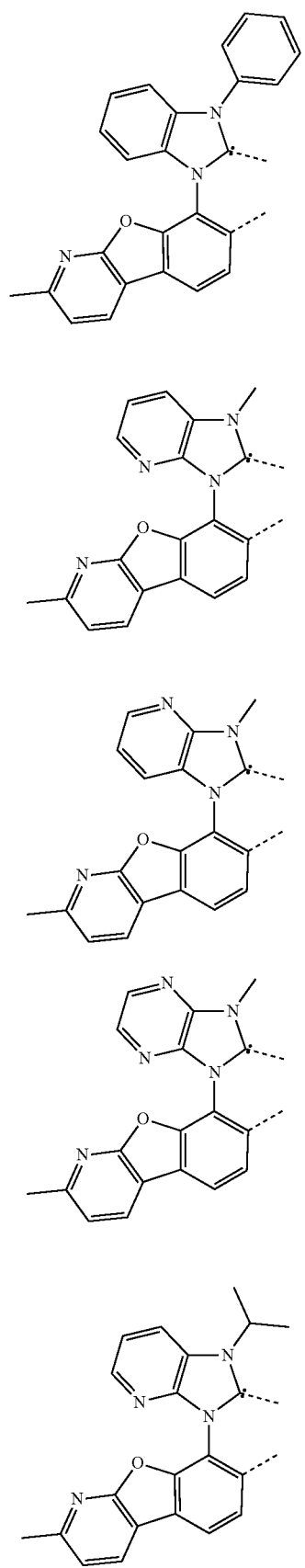

L$_{B90}$ 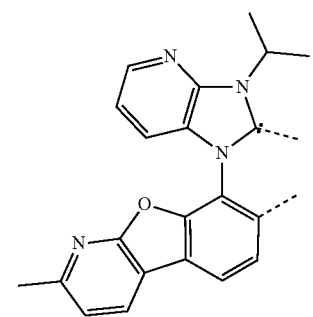
L$_{B91}$ 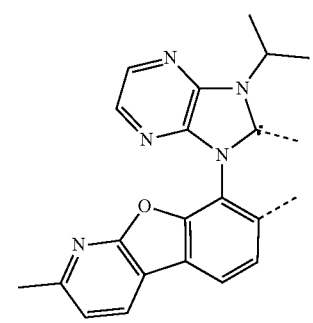
L$_{B92}$ 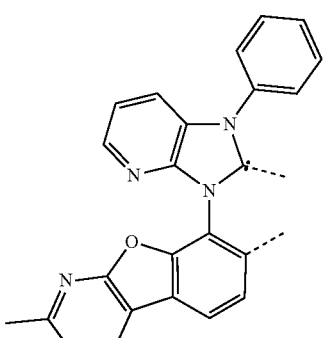
L$_{B93}$ 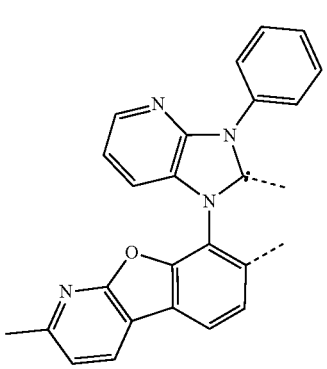
L$_{B94}$ 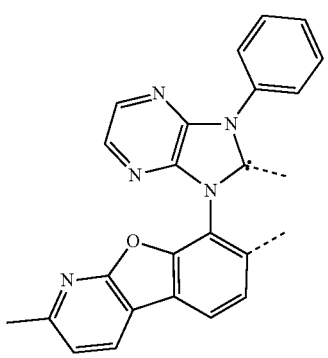
L$_{B95}$ 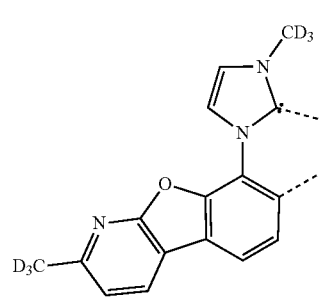
L$_{B96}$ 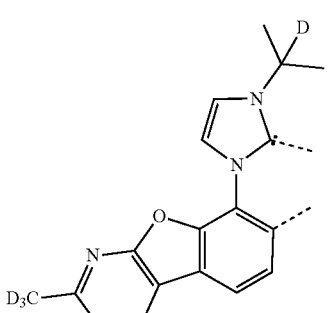
L$_{B97}$ 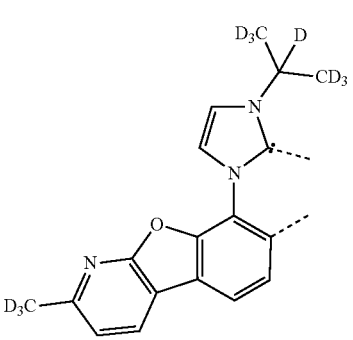
L$_{B98}$ 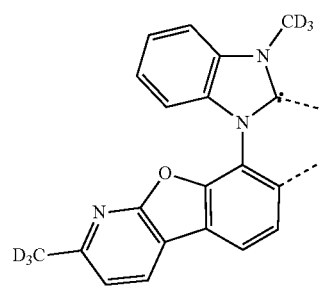

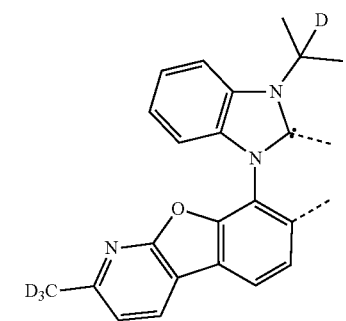 L_{B99}
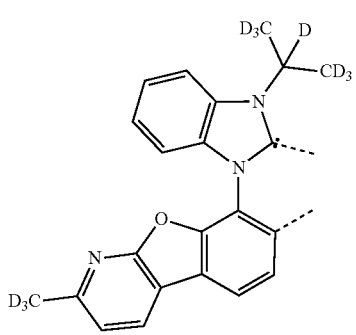 L_{B100}
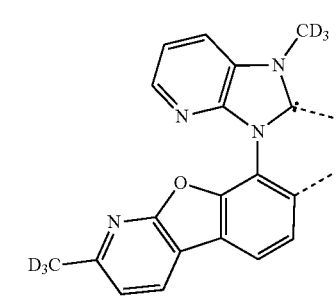 L_{B101}
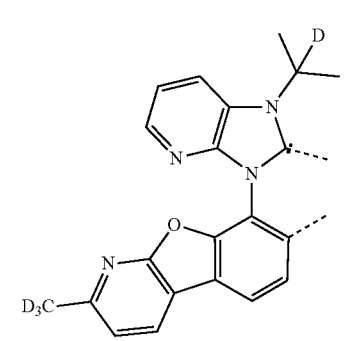 L_{B102}
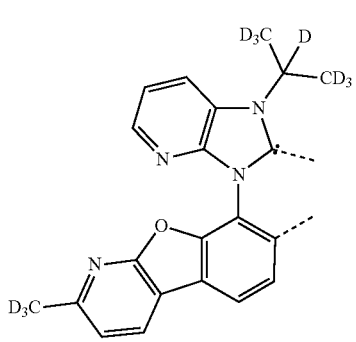 L_{B103}
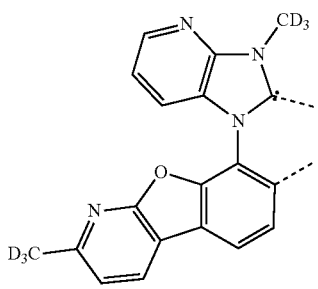 L_{B104}
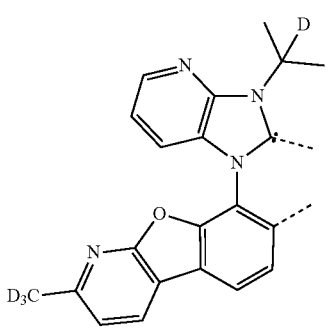 L_{B105}
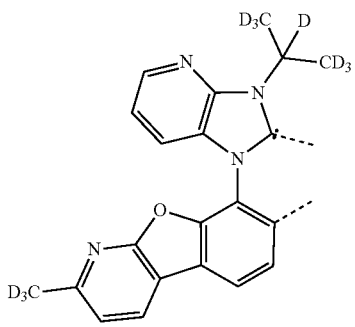 L_{B106}
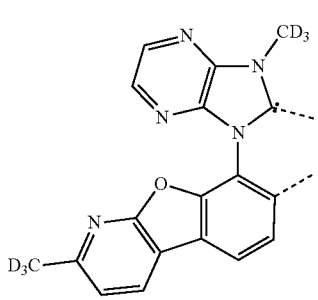 L_{B107}
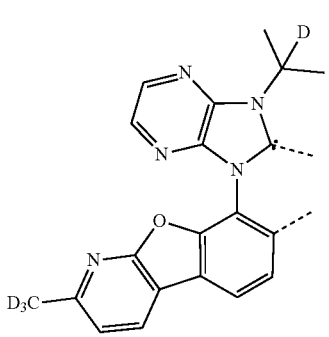 L_{B108}

L_{B109}
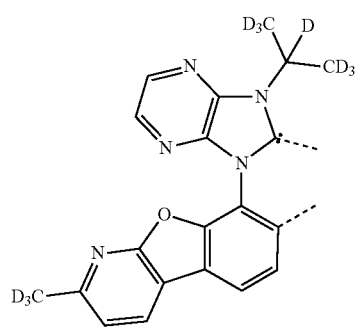
L_{B110}
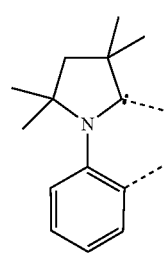
L_{B111}
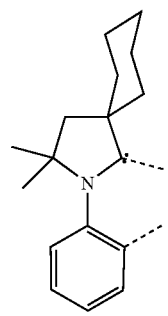
L_{B112}
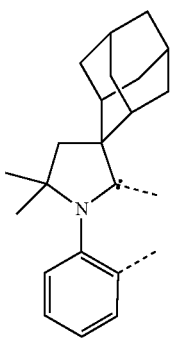
L_{B113}
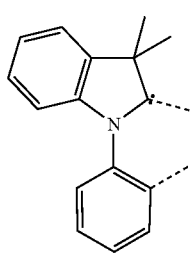
L_{B114}
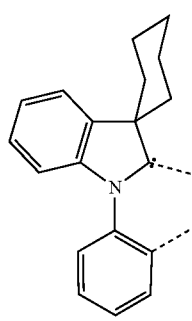
L_{B115}
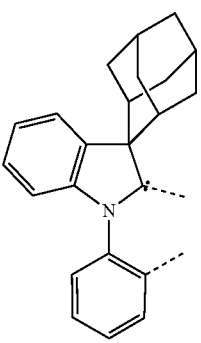
L_{B116}
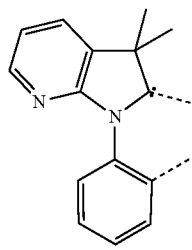
L_{B117}
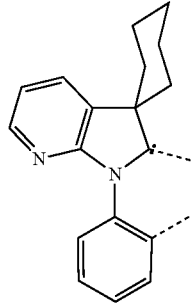
L_{B118}
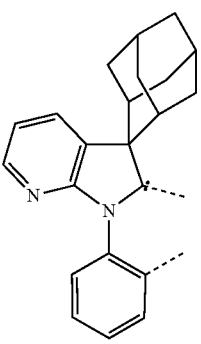

L_B119 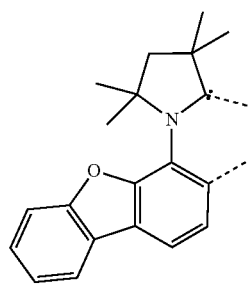
L_B120 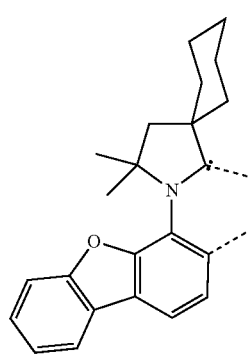
L_B121 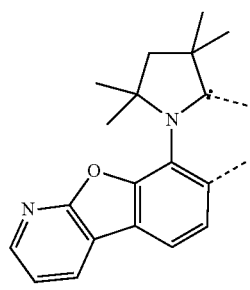
L_B122 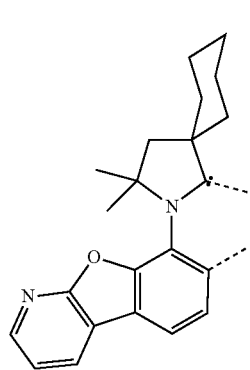
L_B123 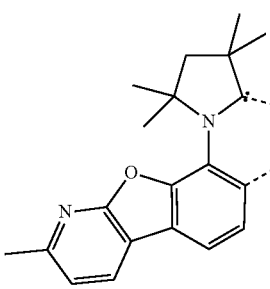
L_B124 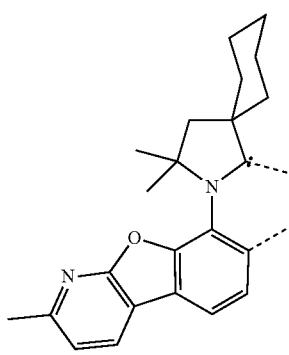
L_B125 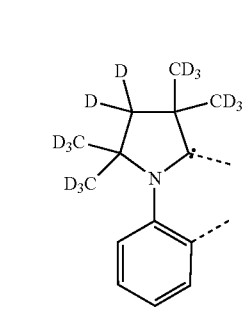
L_B126 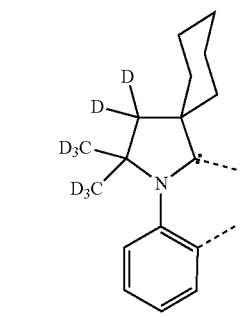
L_B127 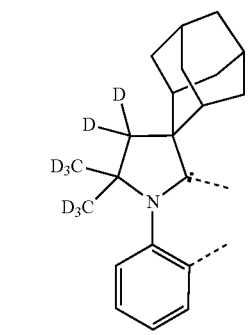
L_B128 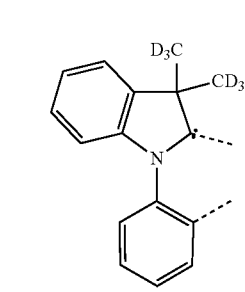

-continued
L<sub>B129</sub>
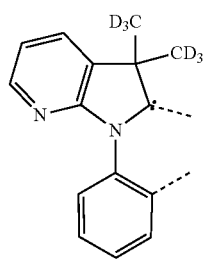
L<sub>B130</sub>
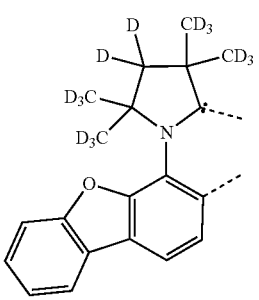
L<sub>B131</sub>
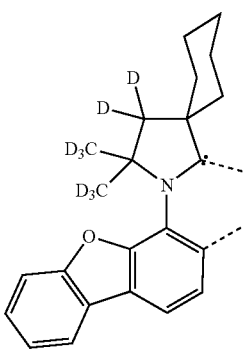
L<sub>B132</sub>
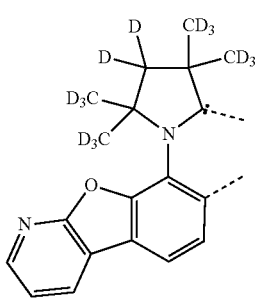
L<sub>B133</sub>
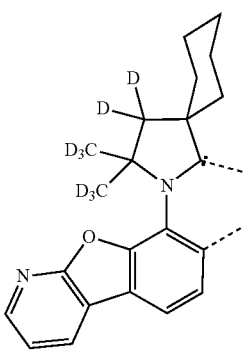
-continued
L<sub>B134</sub>
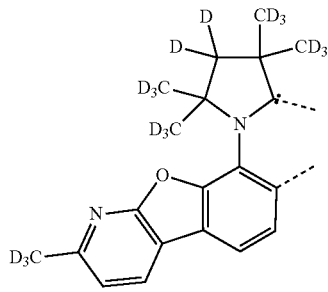
L<sub>B135</sub>
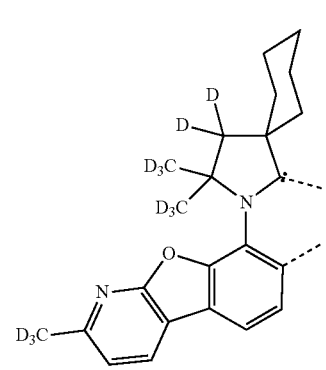
L<sub>B136</sub>
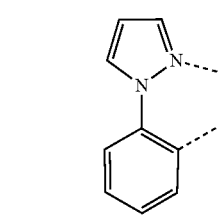
L<sub>B137</sub>
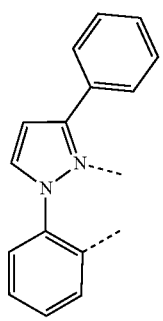
L<sub>B138</sub>
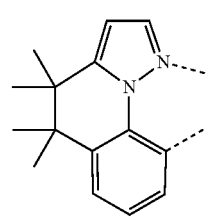

L<sub>B139</sub> 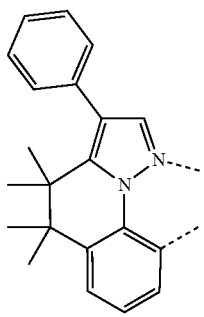
L<sub>B140</sub> 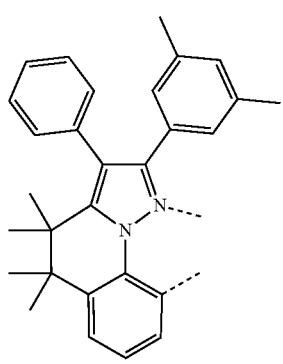
L<sub>B141</sub> 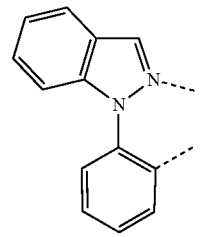
L<sub>B142</sub> 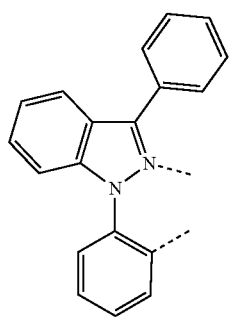
L<sub>B143</sub> 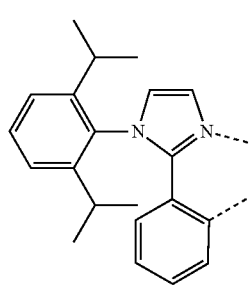
L<sub>B144</sub> 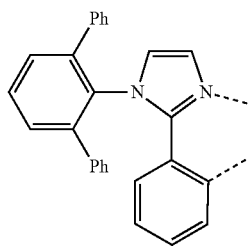
L<sub>B145</sub> 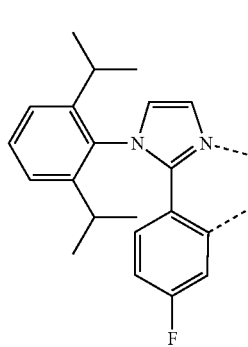
L<sub>B146</sub> 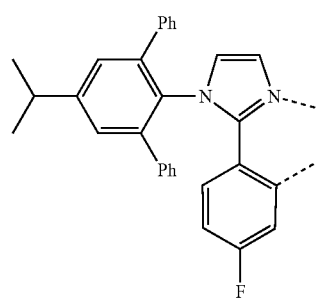
L<sub>B147</sub> 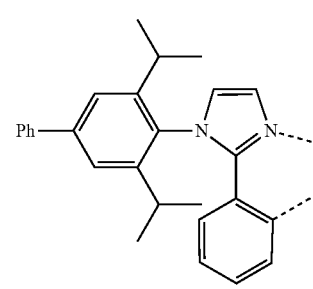
L<sub>B148</sub> 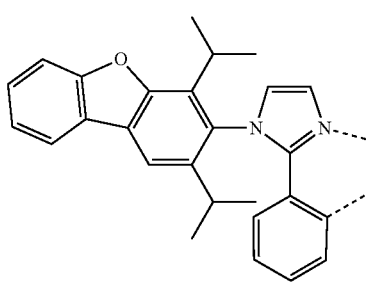

L_{B149}
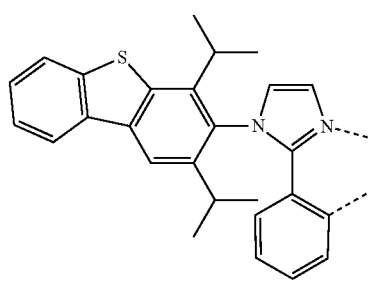
L_{B150}
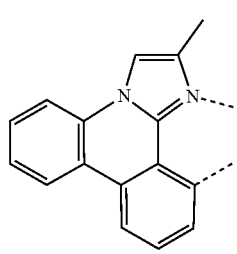
L_{B151}
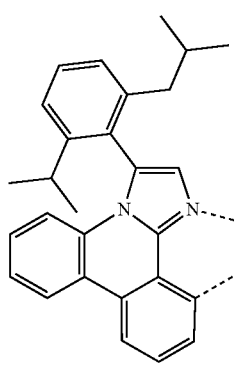
L_{B152}
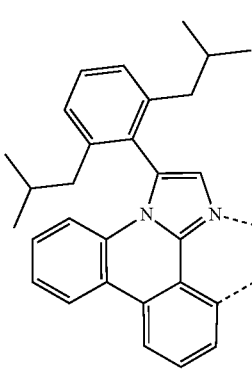
L_{B153}
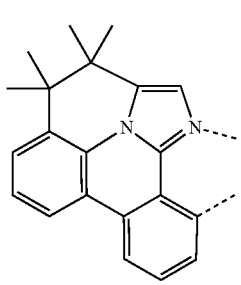
L_{B154}
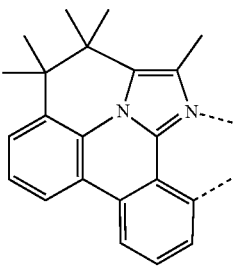
L_{B155}
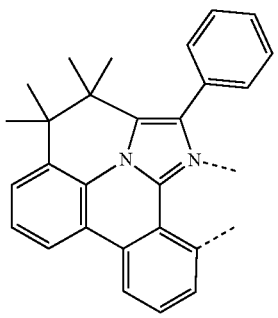
L_{B156}
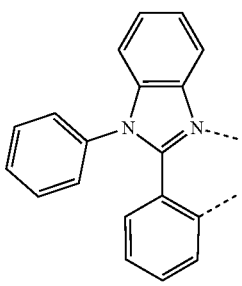
L_{B157}
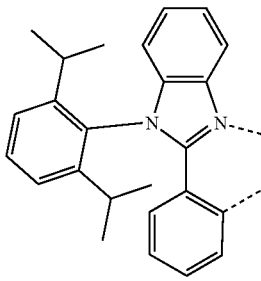
In some embodiments of the OLED where the emitter has the formula of Pt(L$^1$)$_2$ or Pt(L$^1$)(L$^2$), the emitter is selected from the following Group 1 consisting of:
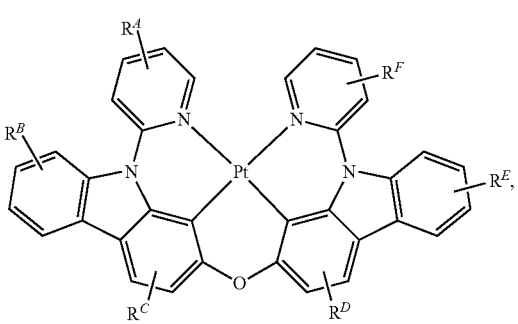

-continued

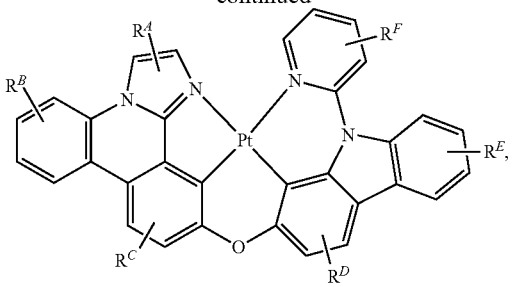

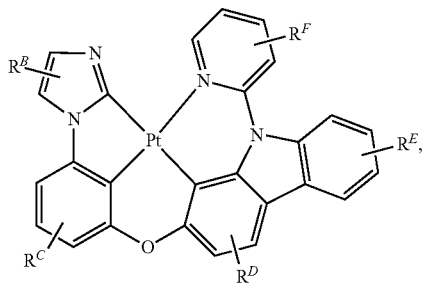

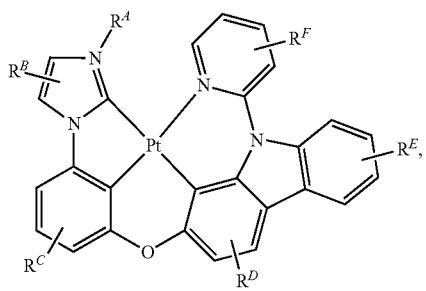

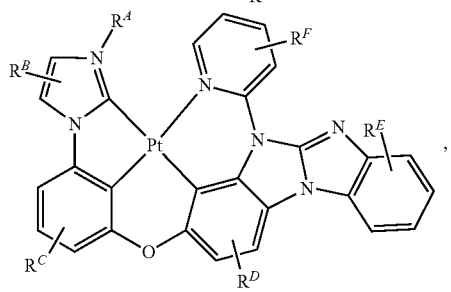

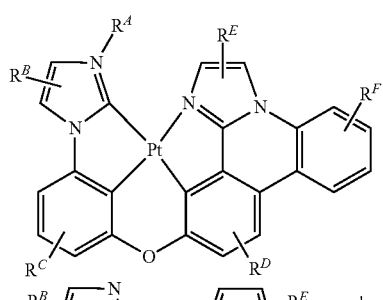

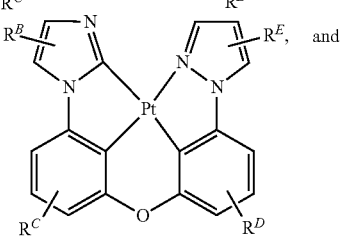
and

-continued

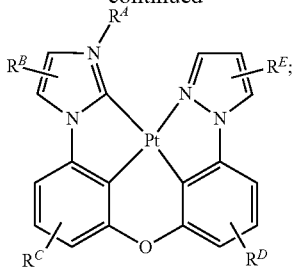

where each $R^A$ to $R^F$ may represent from mono substitution to the possible maximum number of substitution, or no substitution; $R^A$ to $R^F$ are each independently a hydrogen or a substitution selected from the group consisting of the general substituents defined herein; and any two $R^A$ to $R^F$ are optionally fused or joined to form a ring or form a multi-dentate ligand. In some embodiments, at least one of $R^A$ to $R^F$ comprises a chemical group containing at least three 6-membered aromatic rings that are not fused next to each other.

In some embodiments of the OLED where the emitter has the formula of $Pt(L^1)_2$ or $Pt(L^1)(L^2)$ and the emitter is selected from the Group 1, $R^A$ comprises a chemical group containing at least three 6-membered aromatic rings that are not fused next to each other.

In some embodiments of the OLED the emitter is an E-type delayed fluorescent emitter.

In some embodiments, the emitter has the formula of D-L-A; and wherein D is an electron donor group, A is an electron acceptor group, and L is a direct bond or linker. In some embodiments, the electron donor group comprises at least one chemical moiety selected from the group consisting of amino, indole, carbazole, indolocarbazole, benzothiohpene, benzofuran, dibenzothiophene, dibenzofuran, and combinations thereof. In some embodiments, the electron acceptor group comprises at least one chemical moiety selected from the group consisting of pyridine, pyridazine, pyrimidine, pyrazine, triazine, nitrile, isonitrile, and boryl.

According to another aspect, a consumer product comprising the inventive OLED disclosed herein is also disclosed. The consumer product can be one of a flat panel display, a computer monitor, a medical monitor, a television, a billboard, a light for interior or exterior illumination and/or signaling, a heads-up display, a fully or partially transparent display, a flexible display, a laser printer, a telephone, a cell phone, tablet, a phablet, a personal digital assistant (PDA), a wearable device, a laptop computer, a digital camera, a camcorder, a viewfinder, a micro-display that is less than 2 inches diagonal, a 3-D display, a virtual reality or augmented reality display, a vehicle, a video wall comprising multiple displays tiled together, a theater or stadium screen, a light therapy device, and a sign.

Generally, any metal complexes or organic compounds may be used as host materials in the OLEDs of the present disclosure as long as the energy requirement described above is met in the EML. For example, it can be an electron transporting host (e-host) with a hole transporting emitter, or vice versa. A family of such e-hosts are disclosed in U.S. patent application Ser. No. 16/683,507, filed on Nov. 14, 2019, the contents of which are incorporated herein by reference.

The host compounds for the OLED of the present disclosure can be metal complexes. Examples of metal complexes used as host are preferred to have the following general formula:

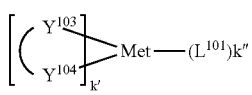

wherein Met is a metal; $(Y^{103}\text{-}Y^{104})$ is a bidentate ligand, $Y^{103}$ and $Y^{104}$ are independently selected from C, N, O, P, and S; $L^{101}$ is an another ligand; k' is an integer value from 1 to the maximum number of ligands that may be attached to the metal; and k'+k" is the maximum number of ligands that may be attached to the metal.

In one aspect, the metal complexes are:

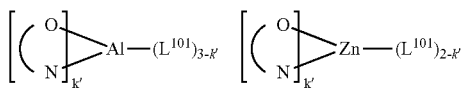

wherein (O—N) is a bidentate ligand, having metal coordinated to atoms O and N.

In another aspect, Met is selected from Ir and Pt. In a further aspect, $(Y^{103}\text{-}Y^{104})$ is a carbene ligand.

In one aspect, the host compound contains at least one of the following groups selected from the group consisting of aromatic hydrocarbon cyclic compounds such as benzene, biphenyl, triphenyl, triphenylene, tetraphenylene, naphthalene, anthracene, phenalene, phenanthrene, fluorene, pyrene, chrysene, perylene, and azulene; the group consisting of aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and the group consisting of 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group. Each option within each group may be unsubstituted or may be substituted by a substituent selected from the group consisting of deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acids, ether, ester, nitrile, isonitrile, sulfanyl, sulfinyl, sulfonyl, phosphino, and combinations thereof.

In one aspect, the host compound contains at least one of the following groups in the molecule:

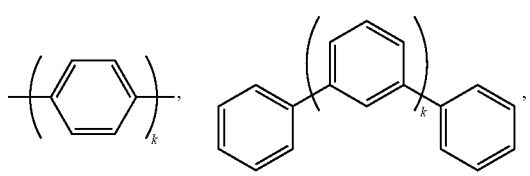

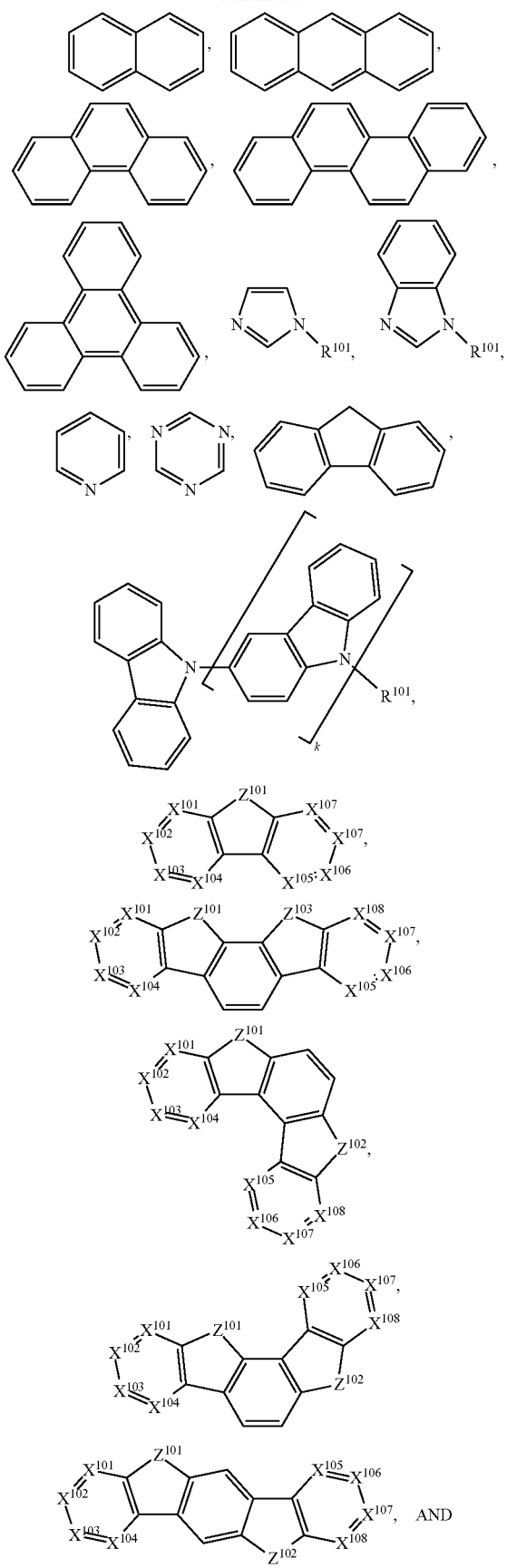

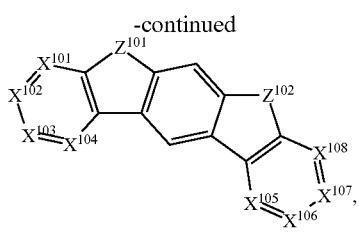

wherein R[101] is selected from the group consisting of hydrogen, deuterium, halogen, alkyl, cycloalkyl, heteroalkyl, heterocycloalkyl, arylalkyl, alkoxy, aryloxy, amino, silyl, alkenyl, cycloalkenyl, heteroalkenyl, alkynyl, aryl, heteroaryl, acyl, carboxylic acids, ether, ester, nitrile, isonitrile, sulfanyl, sulfinyl, sulfonyl, phosphino, and combinations thereof, and when it is aryl or heteroaryl, it has the similar definition as Ar's mentioned above. k is an integer from 0 to 20 or 1 to 20. $X^{101}$ to $X^{108}$ are independently selected from C (including CH) or N. $Z^{101}$ and $Z^{102}$ are independently selected from $NR^{101}$, O, or S.

Non-limiting examples of the host materials that may be used in an OLED in combination with materials disclosed herein are exemplified below together with references that disclose those materials: EP2034538, EP2034538A, EP2757608, JP2007254297, KR20100079458, KR20120088644, KR20120129733, KR20130115564, TW201329200, US20030175553, US20050238919, US20060280965, US20090017330, US20090030202, US20090167162, US20090302743, US20090309488, US20100012931, US20100084966, US20100187984, US2010187984, US2012075273, US2012126221, US2013009543, US2013105787, US2013175519, US2014001446, US20140183503, US20140225088, US2014034914, U.S. Pat. No. 7,154,114, WO2001039234, WO2004093207, WO2005014551, WO2005089025, WO2006072002, WO2006114966, WO2007063754, WO2008056746, WO2009003898, WO2009021126, WO2009063833, WO2009066778, WO2009066779, WO2009086028, WO2010056066, WO2010107244, WO2011081423, WO2011081431, WO2011086863, WO2012128298, WO2012133644, WO2012133649, WO2013024872, WO2013035275, WO2013081315, WO2013191404, WO2014142472, US20170263869, US20160163995, U.S. Pat. No. 9,466,803,

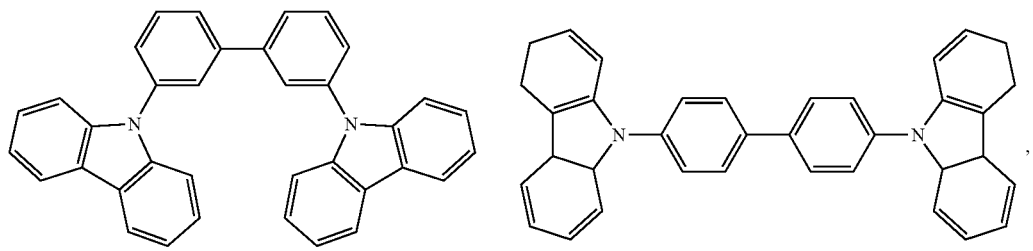

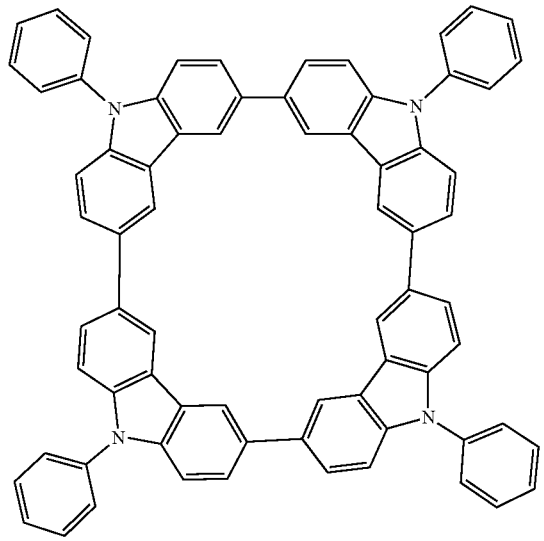

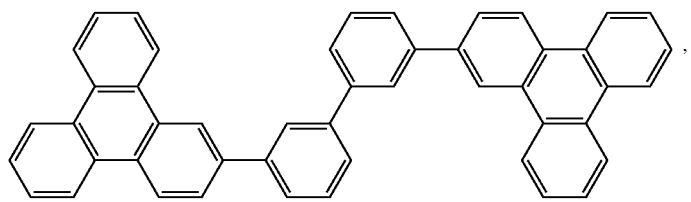

-continued
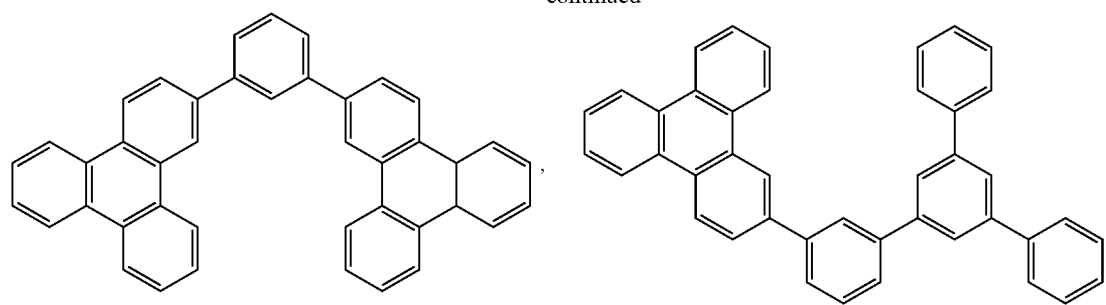
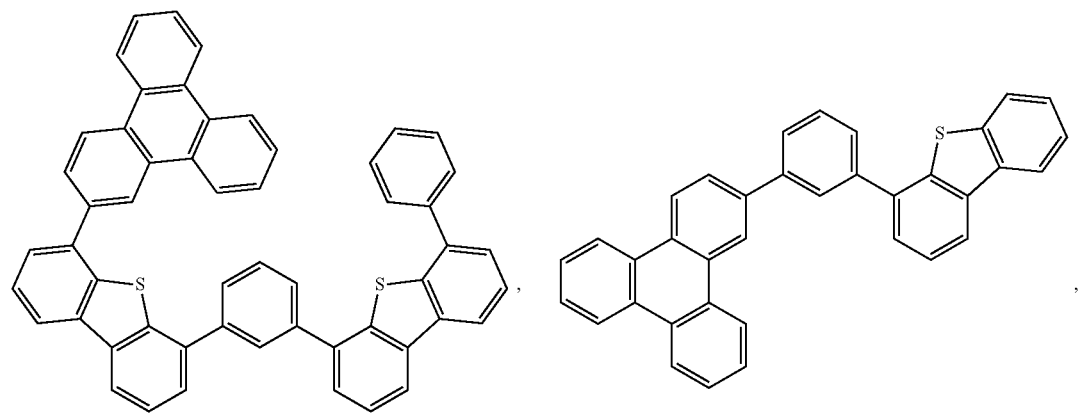
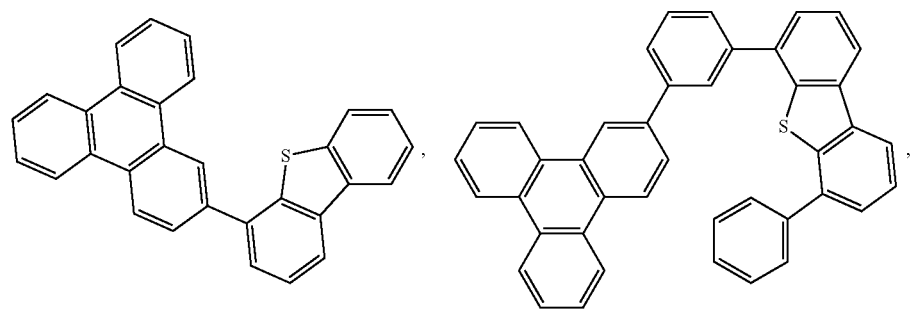
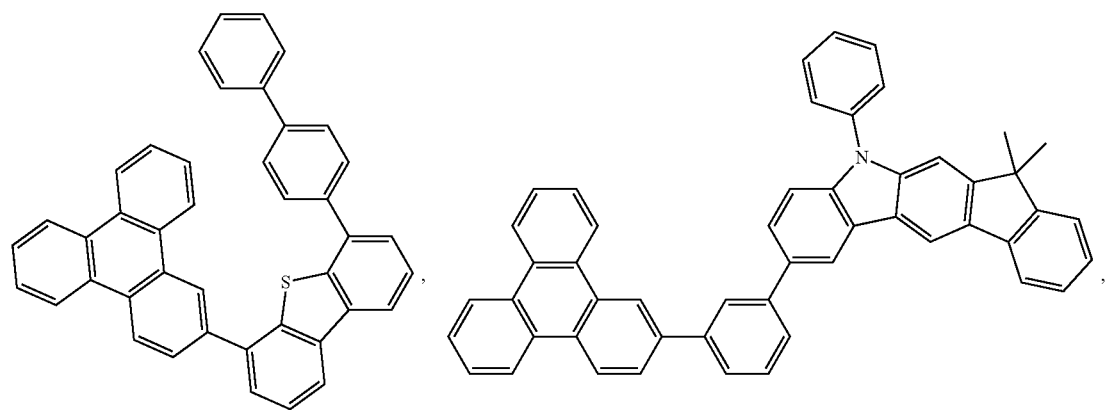

-continued
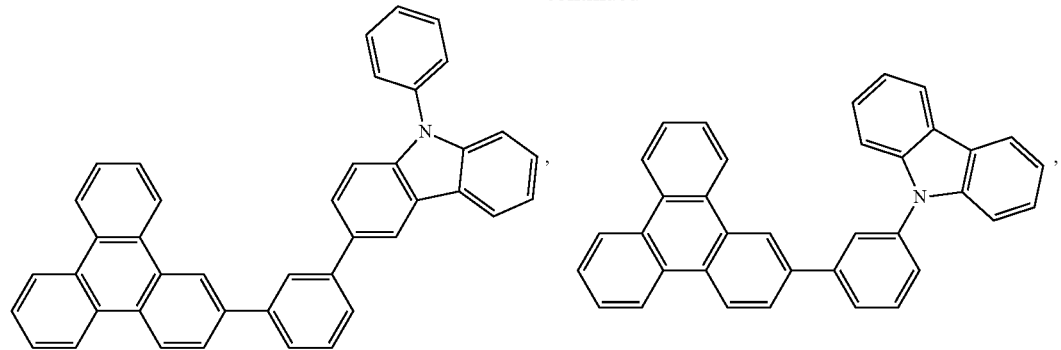
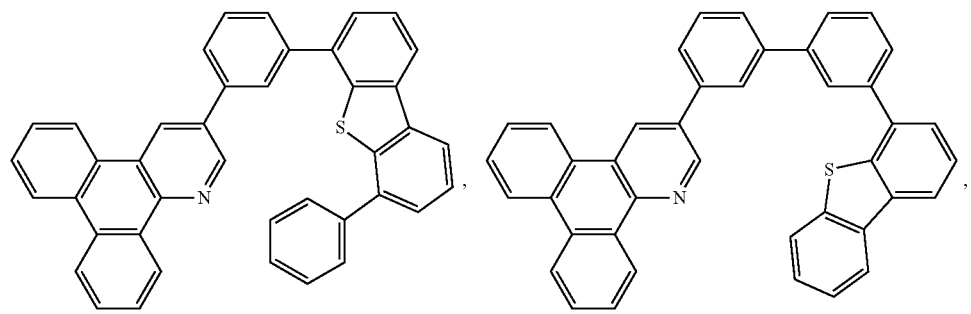
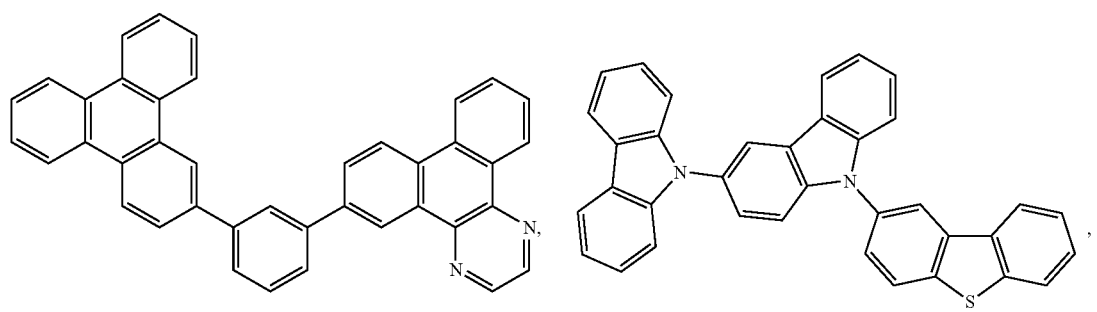
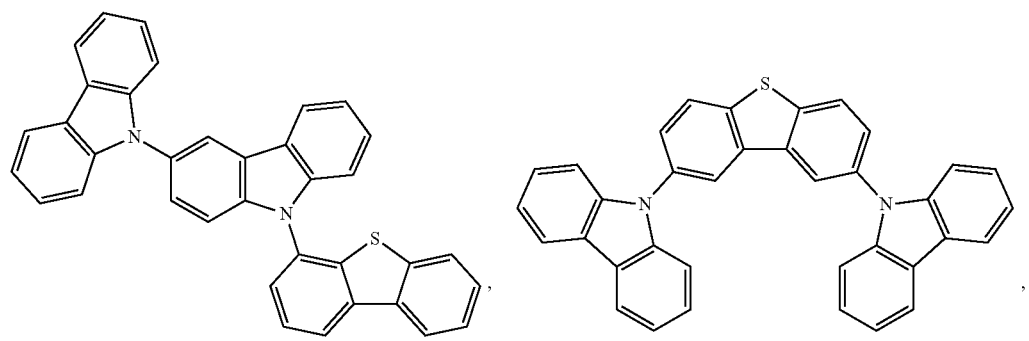
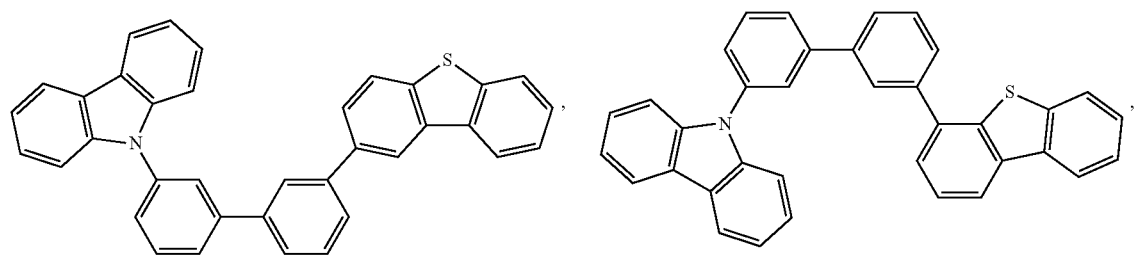

-continued
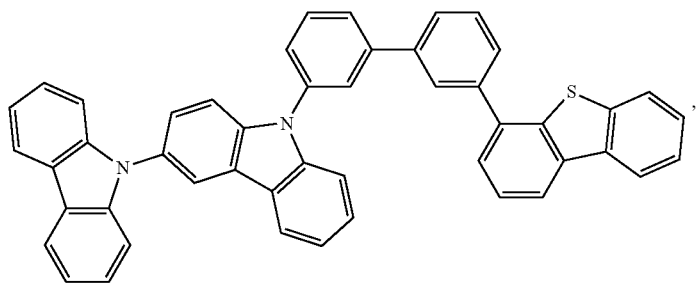
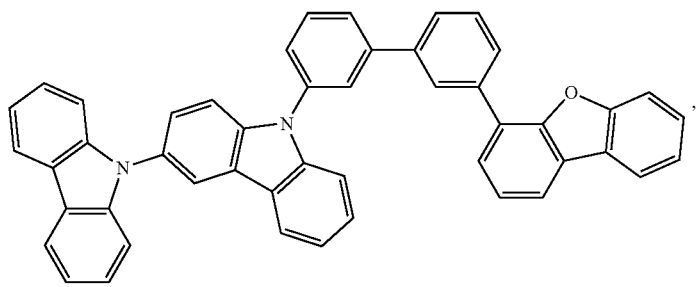
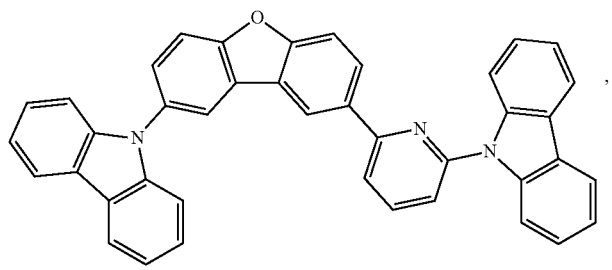
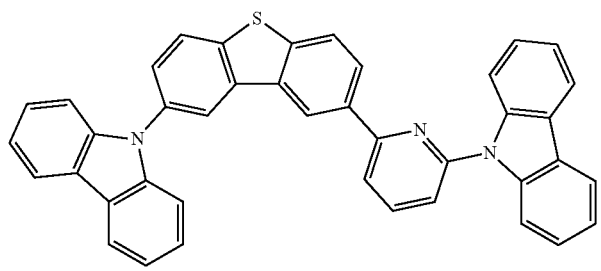
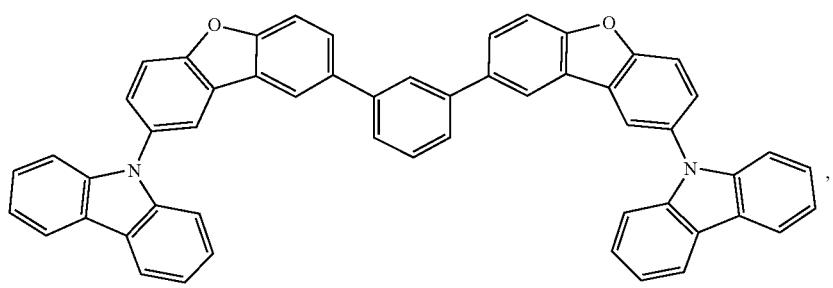
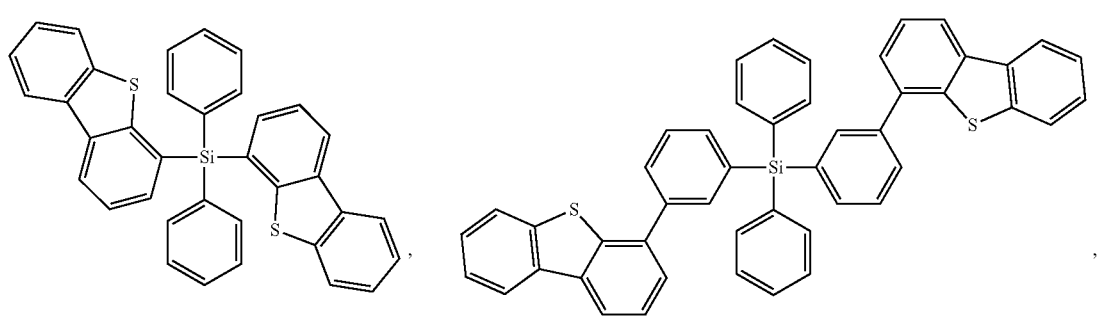

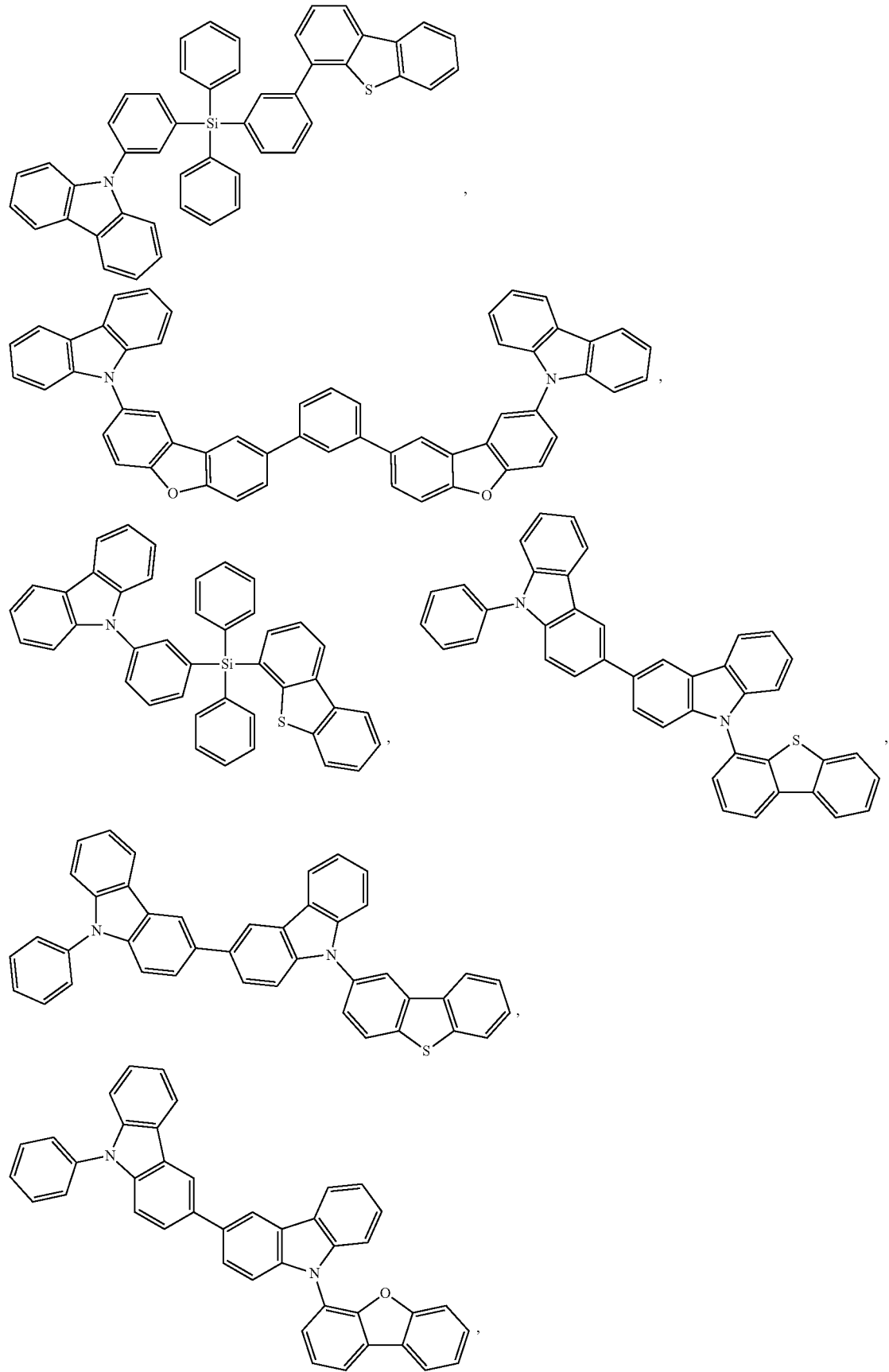

67 68
-continued
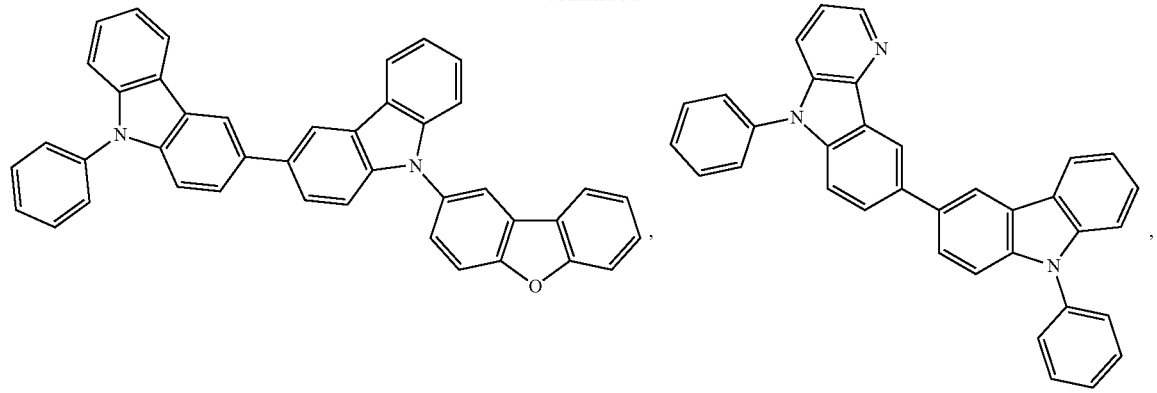
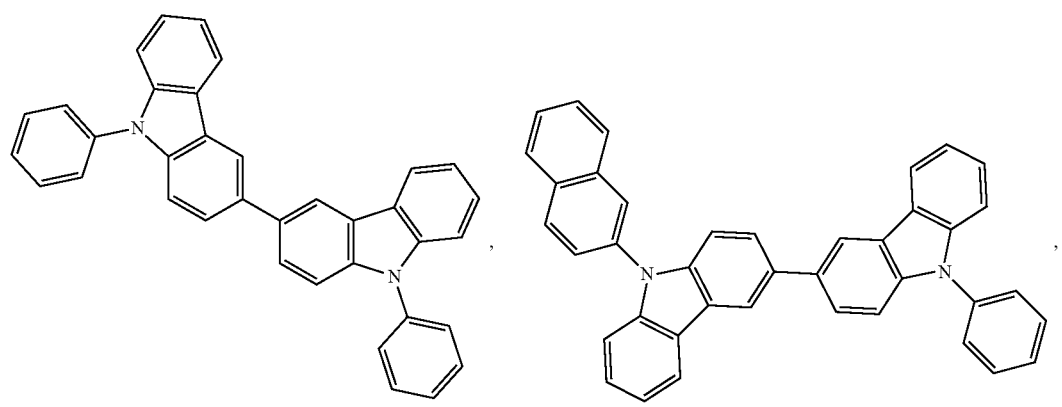
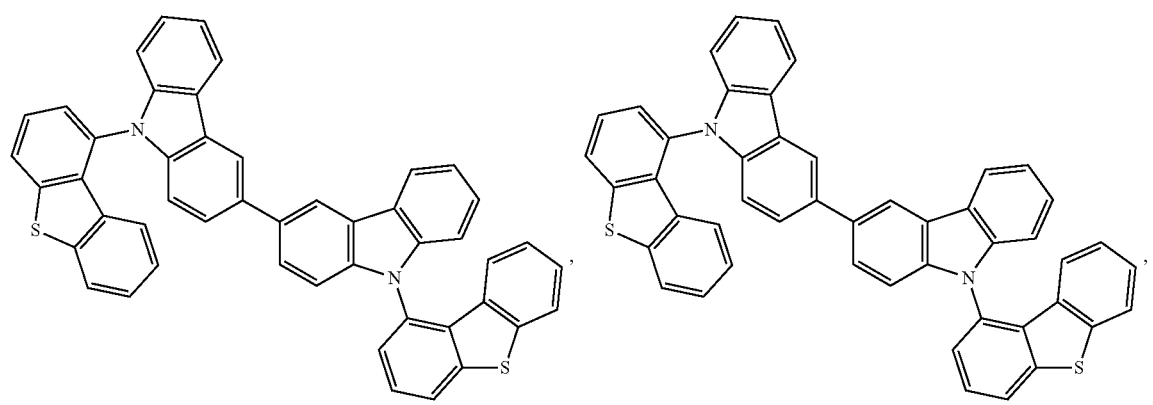
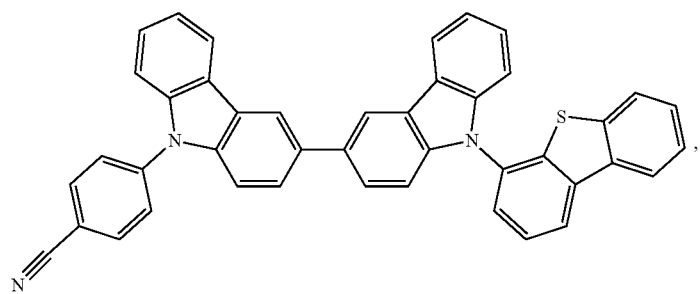

-continued
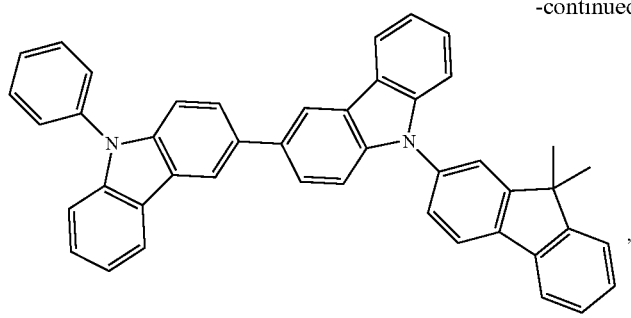
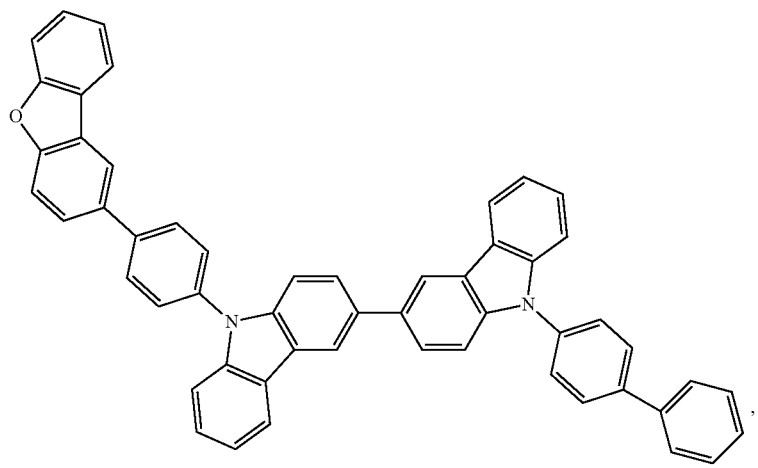
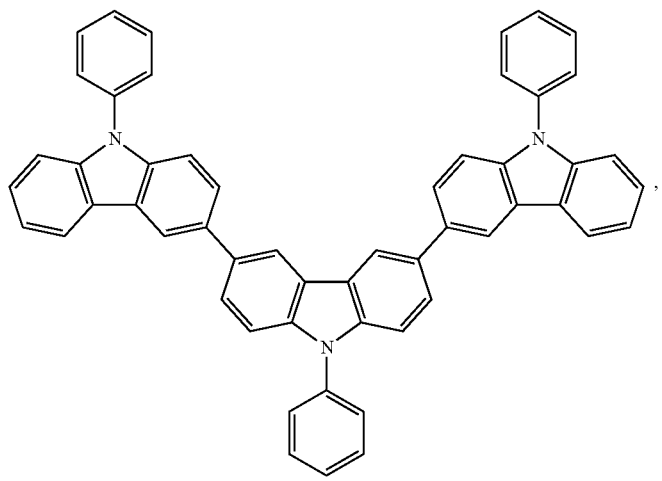
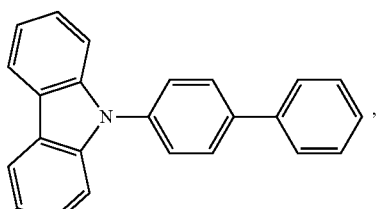

-continued
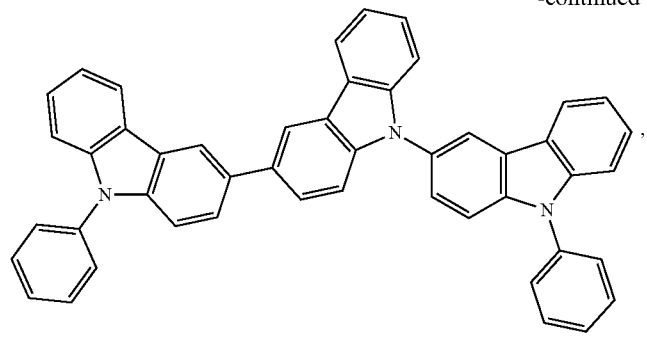
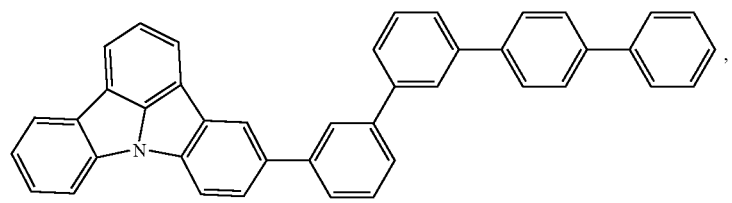
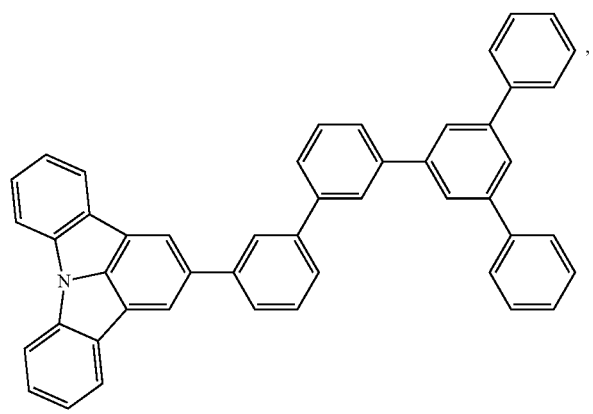
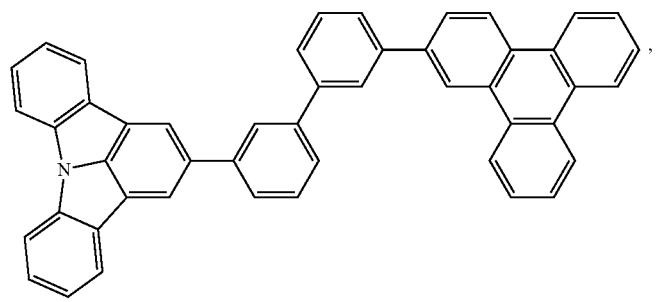
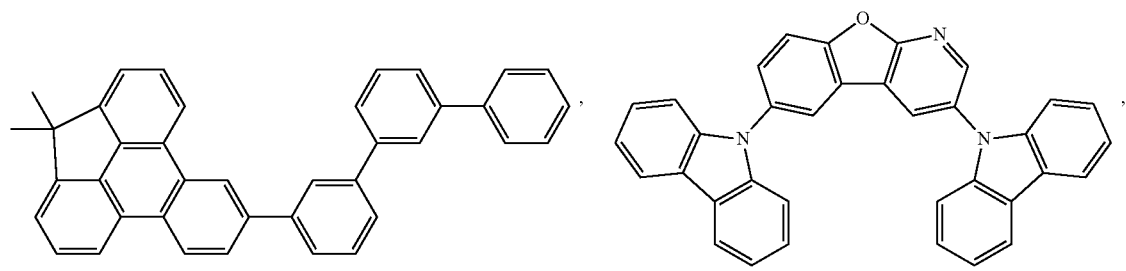

-continued
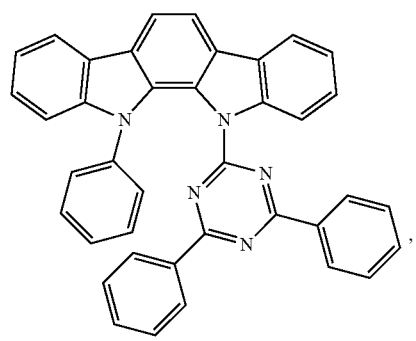
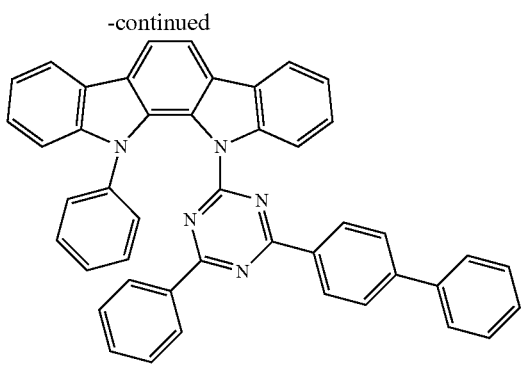
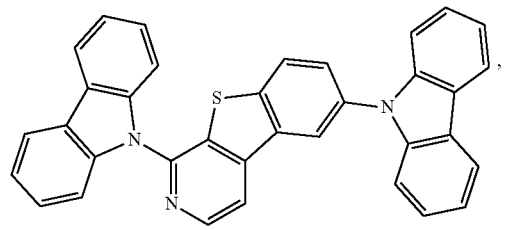
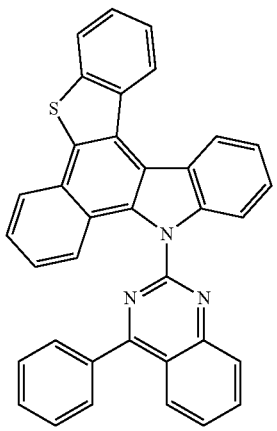
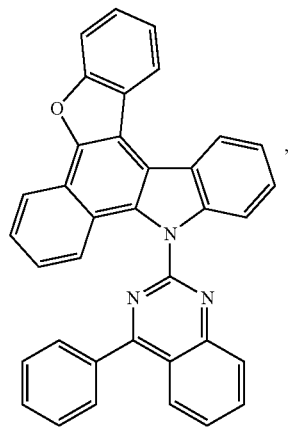
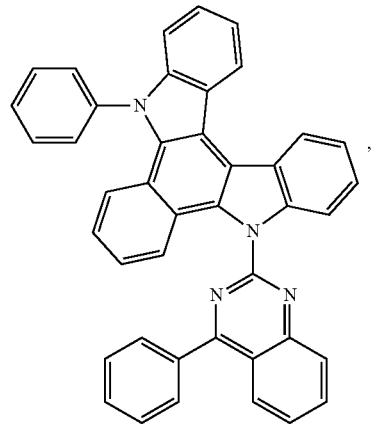
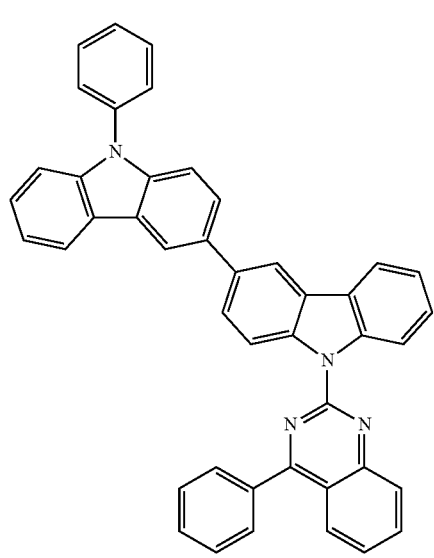
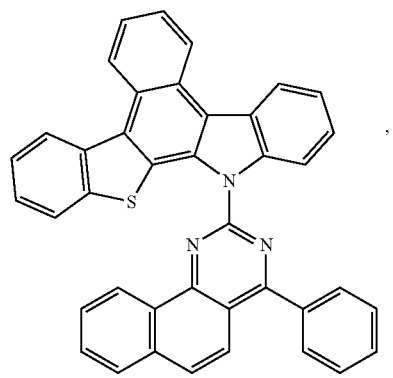
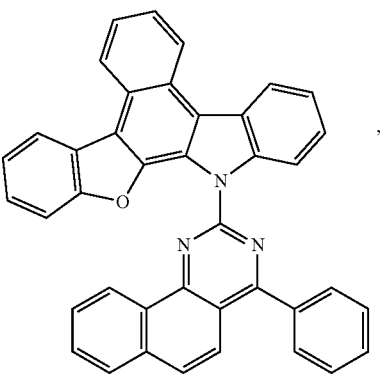

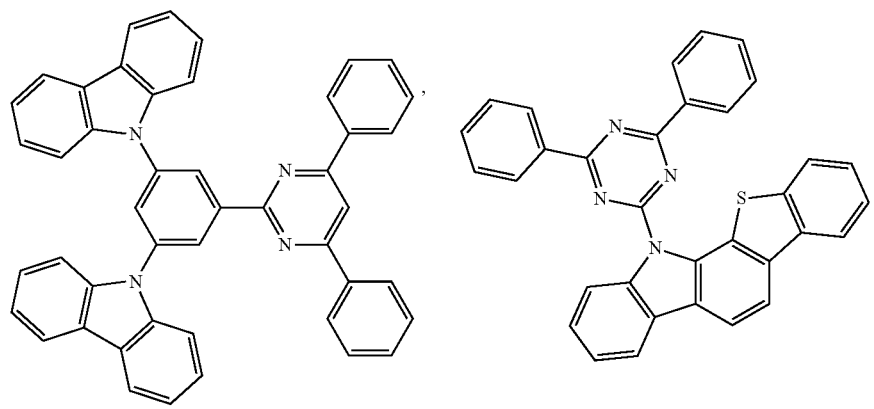
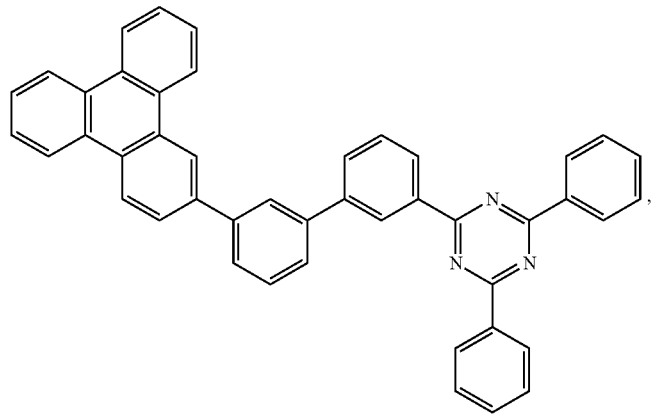
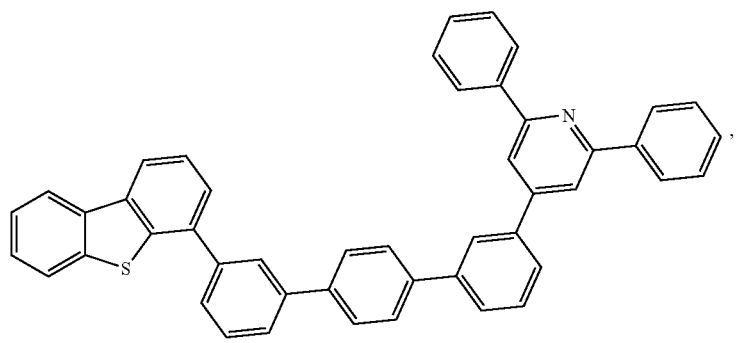
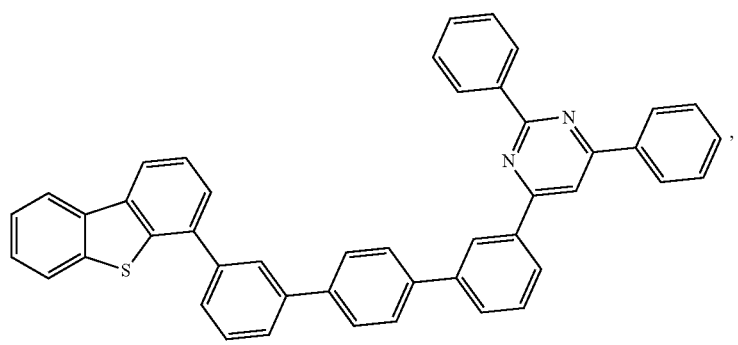

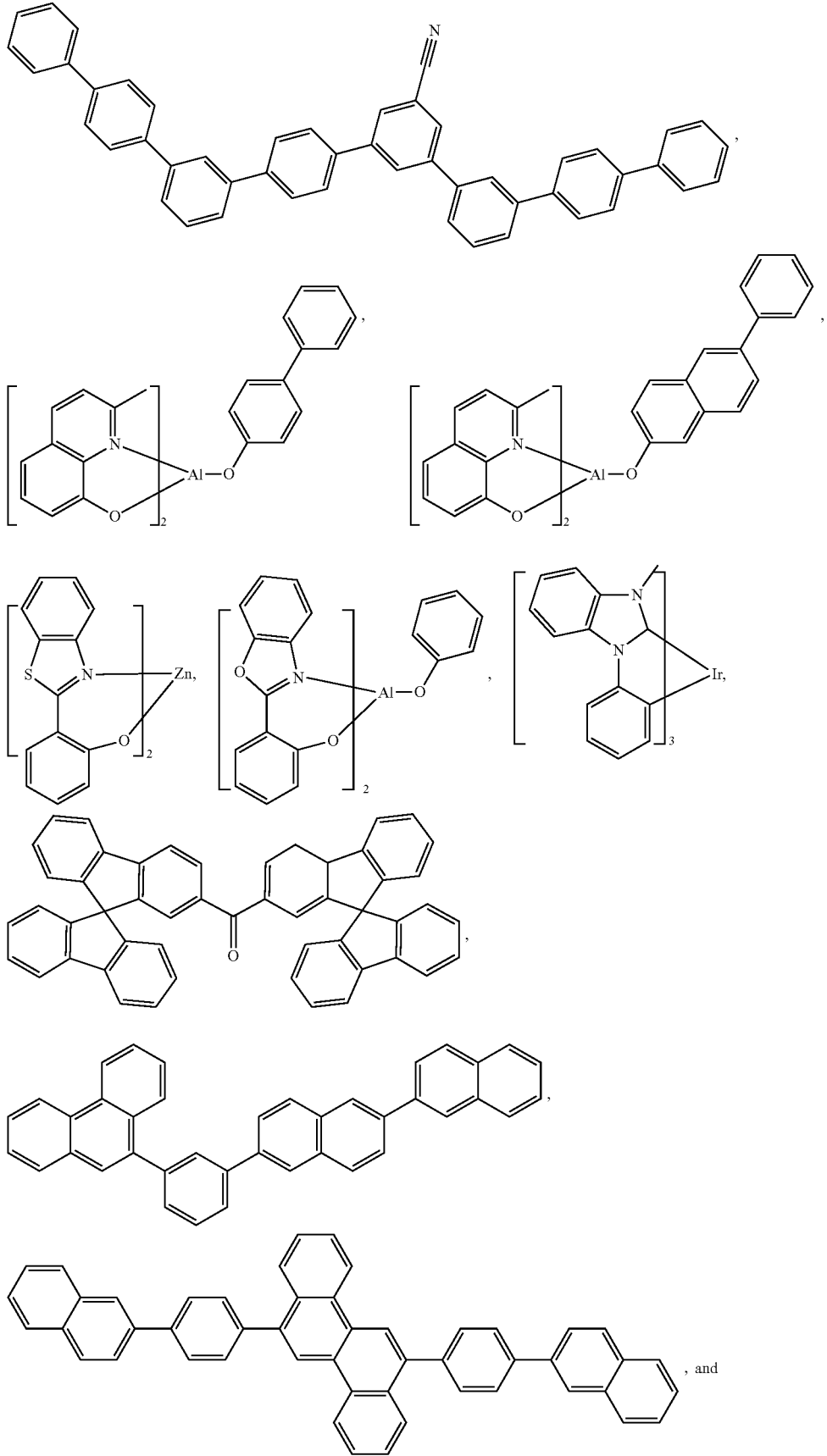

-continued

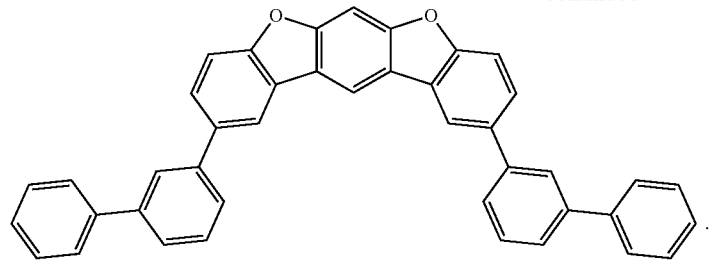 [SMILES: c1ccc(-c2cccc(-c3ccc4oc5cc6oc7ccc(-c8cccc(-c9ccccc9)c8)cc7c6cc5c4c3)c2)cc1]

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

Several OLED materials and configurations are described in U.S. Pat. Nos. 5,844,363, 6,303,238, and 5,707,745, which are incorporated herein by reference in their entirety.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), are incorporated by reference in their entireties. Phosphorescence is described in more detail in U.S. Pat. No. 7,279,704 at cols. 5-6, which are incorporated by reference.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with F4-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the present disclosure may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink jet and organic vapor jet printing (OVJP). Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons are a preferred range. Materials with asymmetric structures may have better solution processability than those having symmetric structures, because asymmetric materials may have a lower tendency to recrystallize. Dendrimer substituents may be used to enhance the ability of small molecules to undergo solution processing.

Devices fabricated in accordance with embodiments of the present disclosure may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

It is understood that the various embodiments described herein are by way of example only and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

We claim:

1. An organic light emitting device (OLED) having an emission spectrum, the OLED comprising:
   an anode;
   a cathode; and
   an organic emissive layer, disposed between the anode and the cathode, comprising:
      a first host material having a highest occupied molecular orbital (HOMO) energy and a lowest unoccupied molecular orbital (LUMO) energy; and
      an emitter material having a HOMO energy and a LUMO energy;
   wherein,
      all materials in the organic emissive layer are mixed together;
      the emitter material is selected from the group consisting of a phosphorescent metal complex, and a delayed fluorescent emitter;
      High HOMO energy is the highest HOMO energy among all materials in the organic emissive layer;
      Low LUMO energy is the lowest LUMO energy among all materials in the organic emissive layer;
      $a \leq E_T - \Delta E \leq b$, wherein $E_T$ is triplet energy $T_1$ of the emitter material, which is the lowest $T_1$ energy among all materials in the organic emissive layer, $\Delta E$ is the energy gap between the High HOMO energy and the Low LUMO energy, a is 0.00 up to 0.15 eV, and b is 0.05 up to 0.45 eV; and
   wherein root mean squared function (RMSD) value for the emission spectrum of the OLED and an emission spectrum of a reference OLED, whose organic emissive layer consists of the emitter material and an inert host, is not greater than 0.05,
      wherein RMSD value is a single value that represents the average difference between the emission spectrum of the OLED and the emission spectrum of the reference OLED at all wavelengths obtained by the following equation:

$$RMSD = \sqrt{1/n \Sigma^n_1 (I_1(\lambda) - I_2(\lambda))^2},$$

wherein n is the number of points on the two emission spectrums being compared, and $I_1$ and $I_2$ are the normalized intensity spectrums as a function of wavelength, $\lambda$.

2. The OLED of claim 1, wherein the emitter material is a phosphorescent metal complex.

3. The OLED of claim 1, wherein the emitter material is a delayed fluorescent emitter.

4. The OLED of claim 1, wherein $E_T$ is at least 2.60 eV.

5. The OLED of claim 1, wherein the High HOMO energy is the HOMO energy of the emitter material, and the Low LUMO energy is the LUMO energy of the first host.

6. The OLED of claim 1, wherein the High HOMO energy is the HOMO energy of the first host, and the Low LUMO energy is the LUMO energy of the emitter material.

7. The OLED of claim 1, wherein the OLED further comprises a second host, wherein the High HOMO energy is the HOMO energy of the first host, and the Low LUMO energy is the LUMO energy of the second host.

8. The OLED of claim 1, wherein the OLED further comprises a second host, wherein the High HOMO energy is the HOMO energy of the second host, and the Low LUMO energy is the LUMO energy of the first host.

9. The OLED of claim 1, wherein the device has an operation voltage less than 6.0 V at 10 mA/cm².

10. The OLED of claim 1, wherein the first host comprises at least one chemical moiety selected from the group consisting of triphenylene, carbazole, indolocarbazole, benzothiophene, benzofuran, dibenzothiophene, dibenzofuran, pyridine, pyridazine, pyrimidine, pyrazine, triazine, imidazole, boryl, 5,9-dioxa-13b-boranaphtho[3,2,1-de]anthracene, and aza-variants thereof.

11. The OLED of claim 1, wherein the emitter material is a phosphorescent blue emitter.

12. The OLED of claim 1, wherein the emitter material has the formula of $M(L^1)_x(L^2)_y(L^3)_z$;

wherein, $L^1$, $L^2$ and $L^3$ can be the same or different;

x is 1, 2, or 3;

y is 0, 1, or 2;

z is 0, 1, or 2;

x+y+z is the oxidation state of the metal M;

$L^1$, $L^2$, and $L^3$ are each independently selected from the group consisting of:

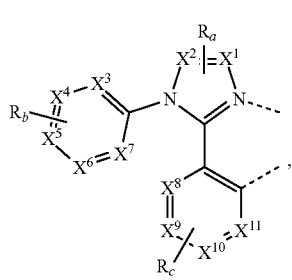

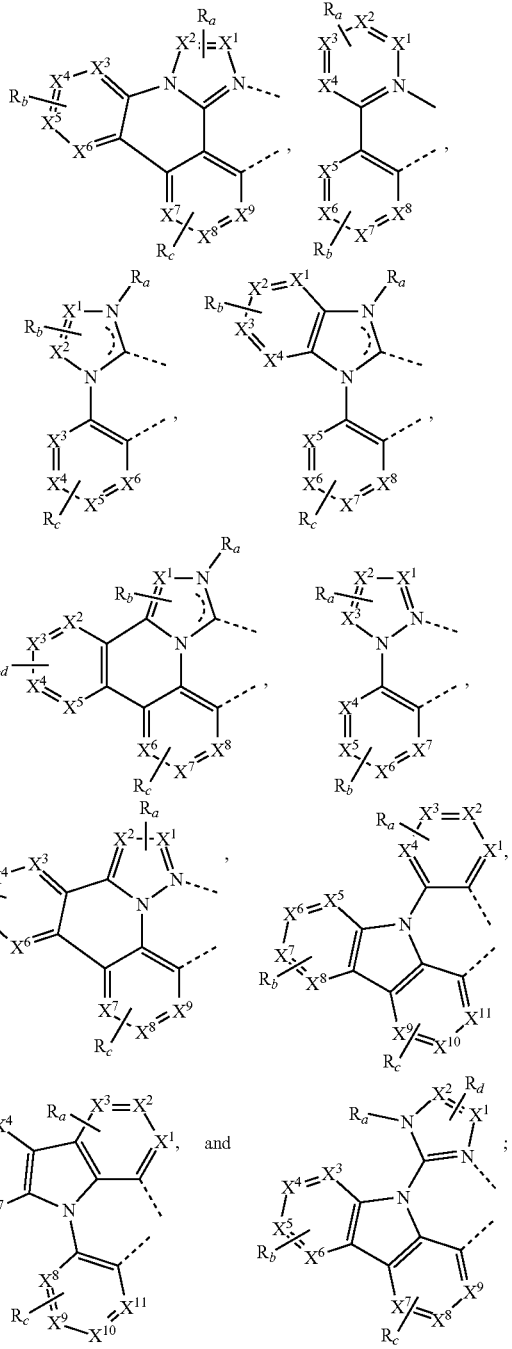

wherein, each $X^1$ to $X^1$ are independently selected from the group consisting of carbon and nitrogen;

each $R_a$, $R_b$, $R_c$, and $R_d$ may represent from mono substitution to the possible maximum number of substitution, or no substitution;

$R_a$, $R_b$, $R_c$, and $R_d$ are each independently a hydrogen or a substituent selected from the group consisting of deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, boryl, and combinations thereof; and any two $R_a$, $R_b$, $R_c$, and $R_d$ are optionally fused or joined to form a ring or form a multidentate ligand.

13. The OLED of claim 12, wherein at least one of $R_a$, $R_b$, $R_c$, and $R_d$ comprises a chemical group containing at least three 6-membered aromatic rings that are not fused next to each other.

14. The OLED of claim 12, wherein the emitter material has the formula selected from the group consiting of $Ir(L^1)(L^2)(L^3)$, $Ir(L^1)_2(L^2)$, and $Ir(L^1)_3$;
wherein $L^1$, $L^2$, and $L^3$ are different and each is independently selected from the group consisting of:

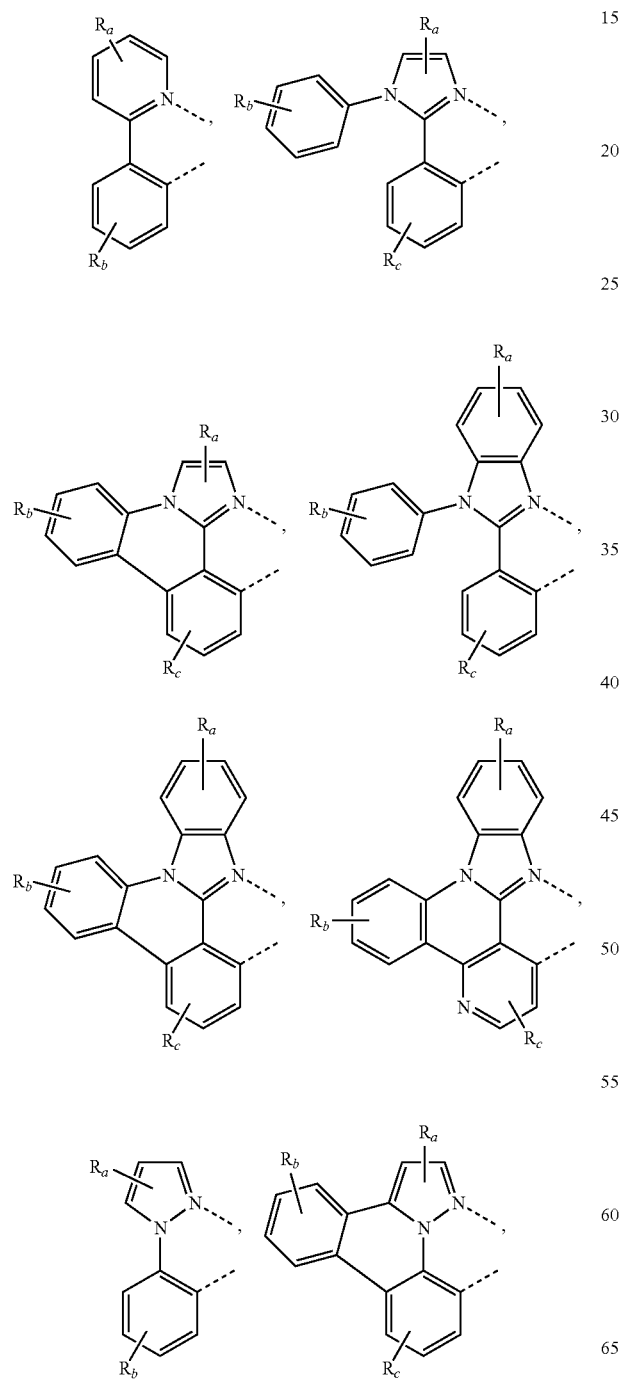
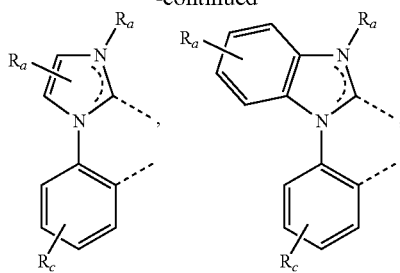
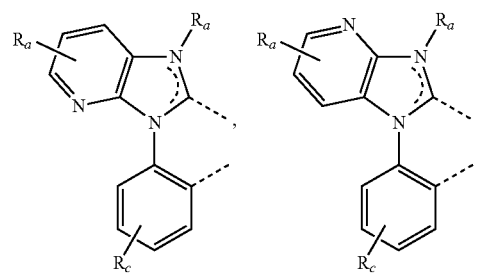
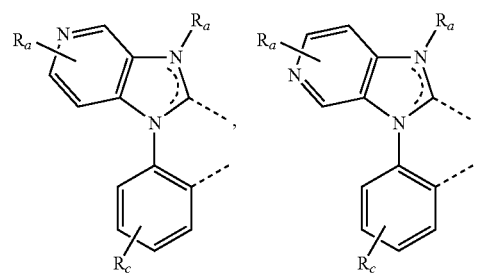
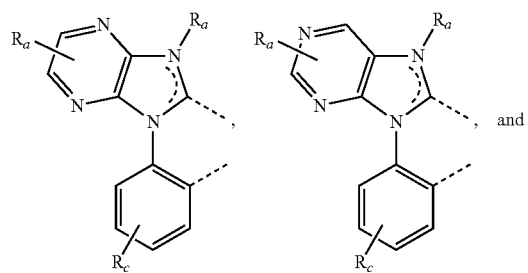
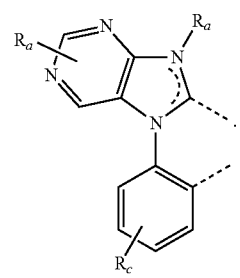
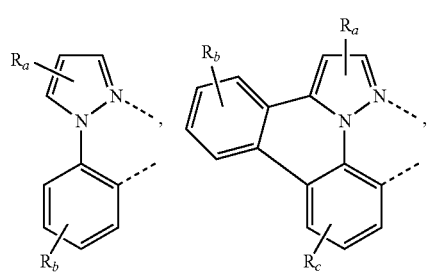

15. The OLED of claim 12, wherein the emitter material has the formula of $M(L^1)_2$ or $M(L^1)(L^2)$;
wherein M is Pt, and $L^1$ and $L^2$ are each a different bidentate ligand; or M is Ir, Rh, Re, Ru, or Os, and $L^1$ and $L^2$ are each a different tridentate ligand.

16. The OLED of claim 12, wherein $L^1$ is selected from the group consisting of:

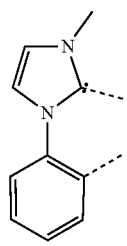 L_{B1}
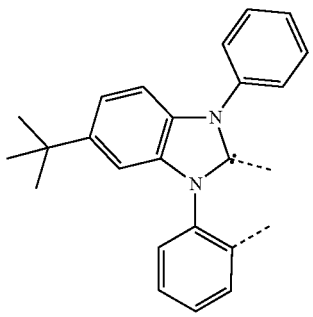 L_{B6}
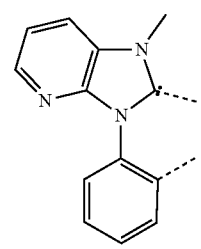 L_{B2}
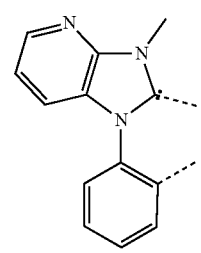 L_{B7}
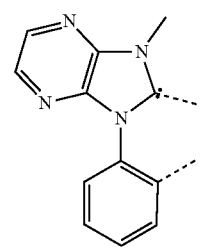 L_{B3}
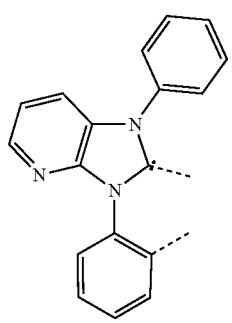 L_{B8}
L_{B4}
L_{B9}
L_{B5}
L_{B10}

L_{B11}
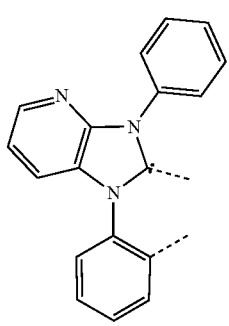
L_{B12}
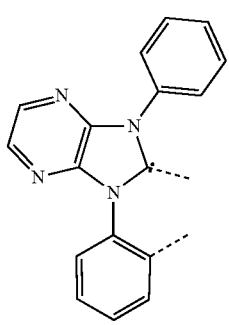
L_{B13}
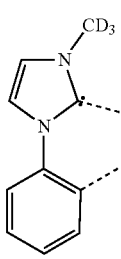
L_{B14}
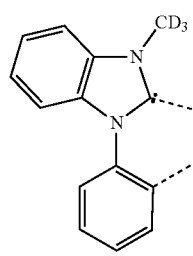
L_{B15}
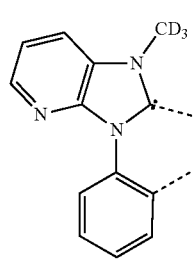
L_{B16}
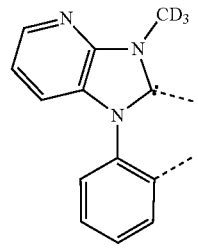
L_{B17}
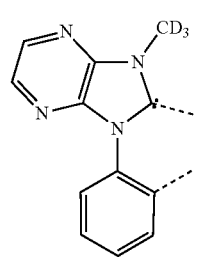
L_{B18}
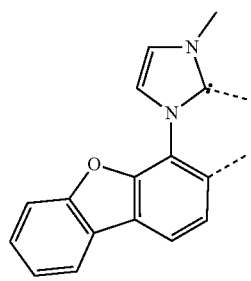
L_{B19}
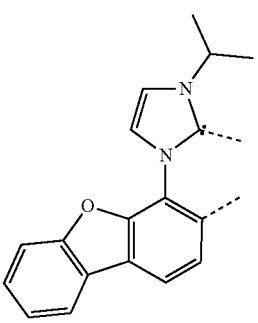
L_{B20}
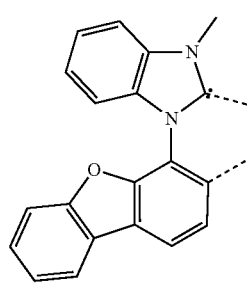

L<sub>B21</sub>
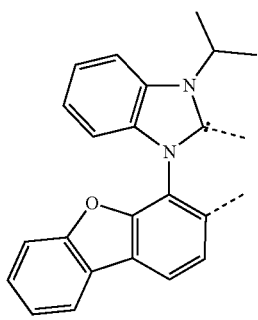
L<sub>B22</sub>
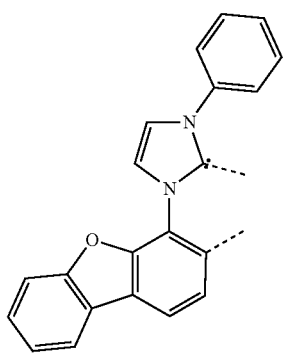
L<sub>B23</sub>
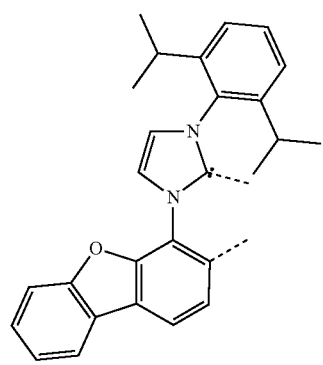
L<sub>B24</sub>
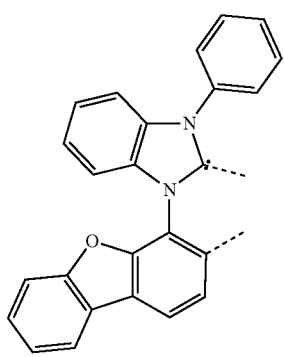
L<sub>B25</sub>
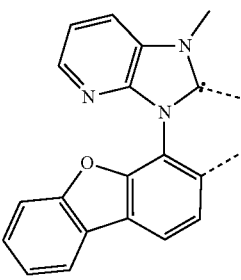
L<sub>B26</sub>
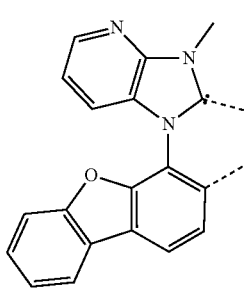
L<sub>B27</sub>
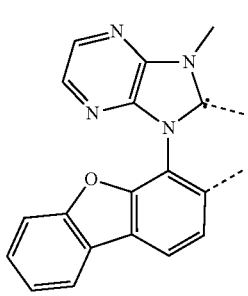
L<sub>B28</sub>
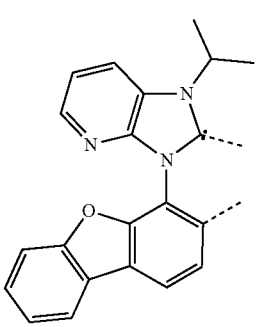
L<sub>B29</sub>
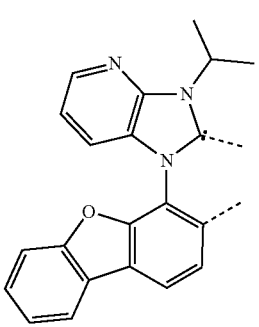

L<sub>B30</sub> 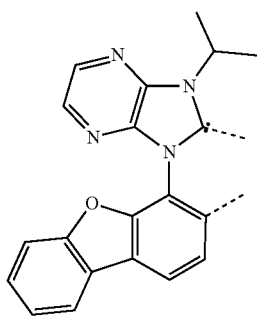
L<sub>B31</sub> 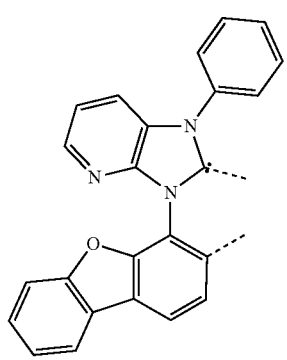
L<sub>B32</sub> 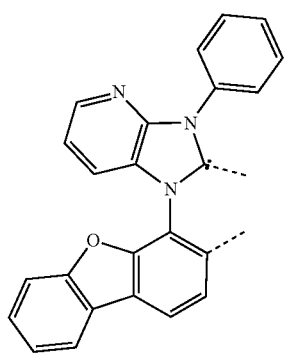
L<sub>B33</sub> 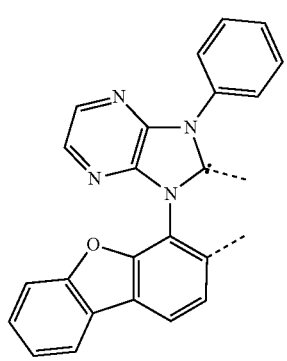
L<sub>B34</sub> 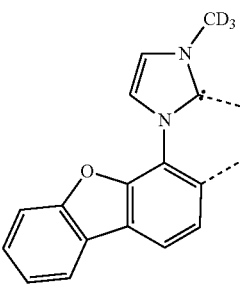
L<sub>B35</sub> 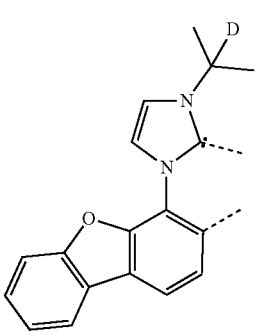
L<sub>B36</sub> 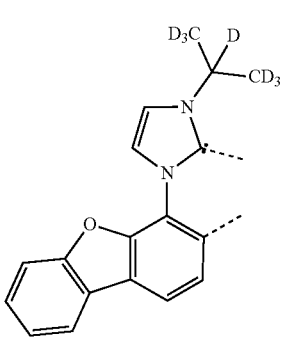
L<sub>B37</sub> 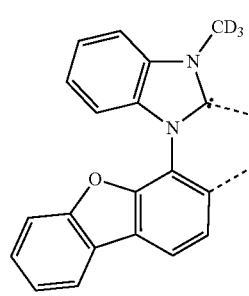
L<sub>B38</sub> 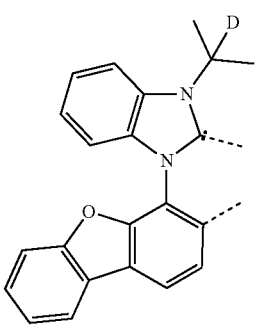

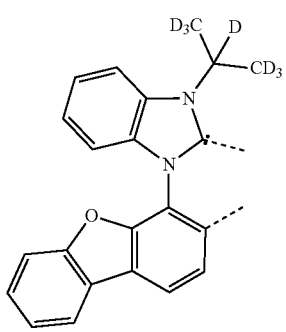 L_{B38}
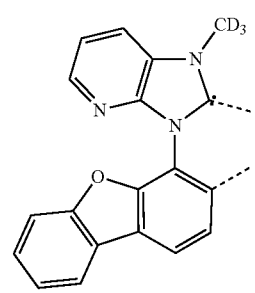 L_{B40}
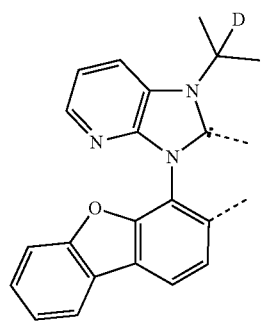 L_{B41}
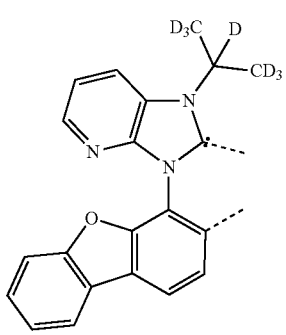 L_{B42}
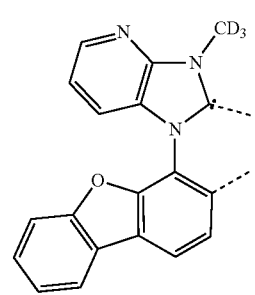 L_{B43}
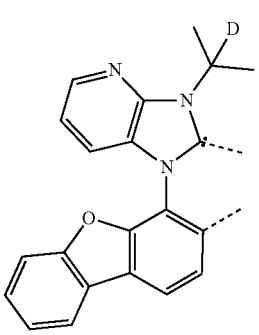 L_{B44}
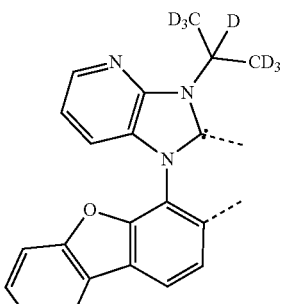 L_{B45}
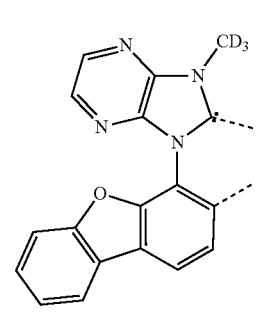 L_{B46}
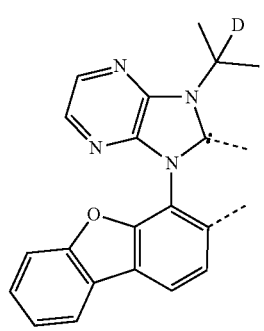 L_{B47}
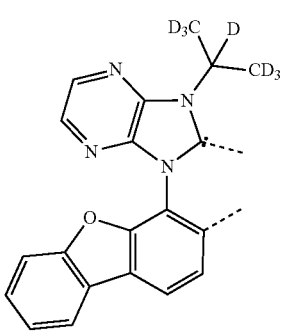 L_{B48}

L_{B49}
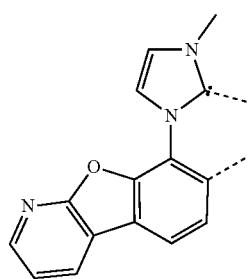
L_{B50}
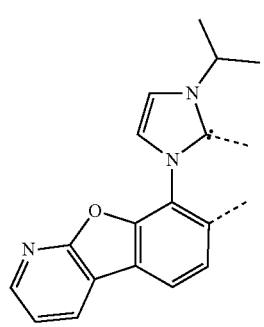
L_{B51}
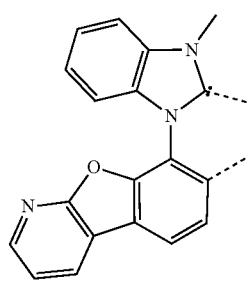
L_{B52}
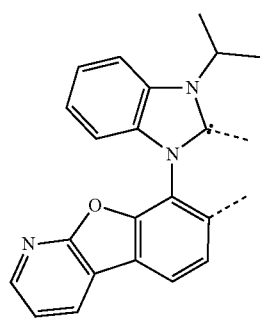
L_{B53}
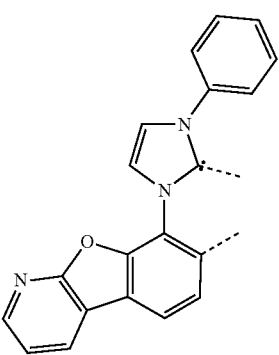
L_{B54}
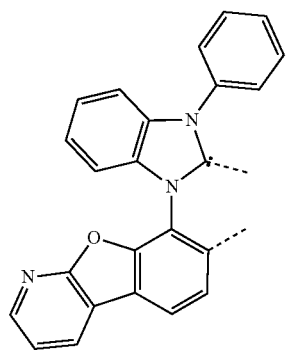
L_{B55}
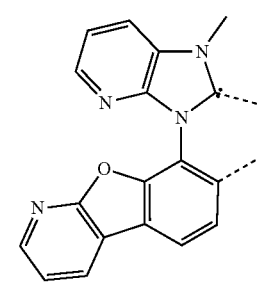
L_{B56}
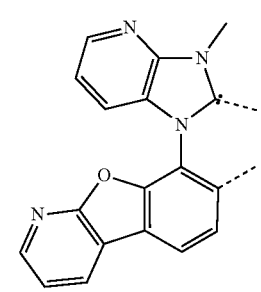
L_{B57}
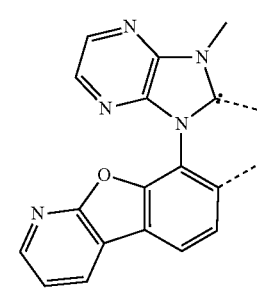
L_{B58}
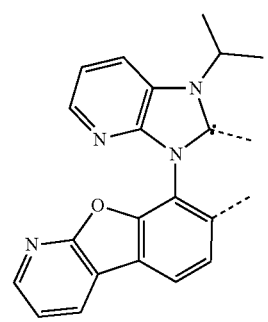

L_B59
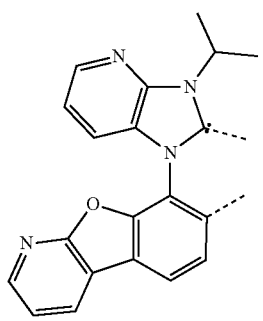
L_B60
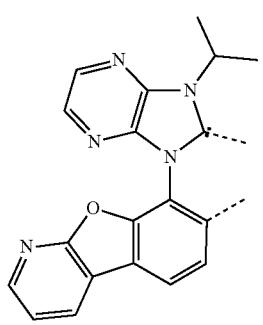
L_B61
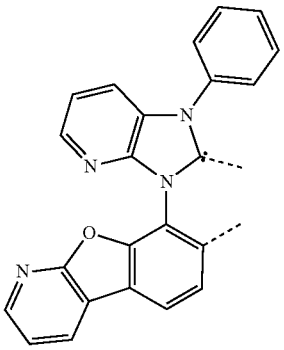
L_B62
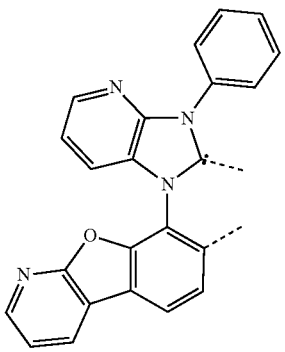
L_B63
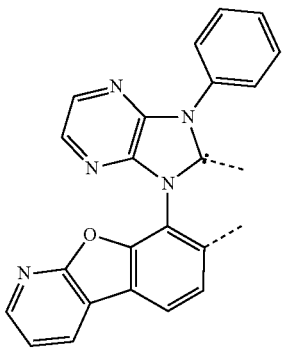
L_B64
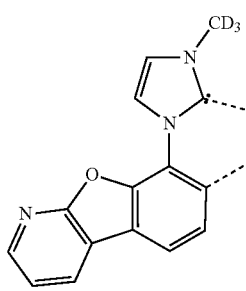
L_B65
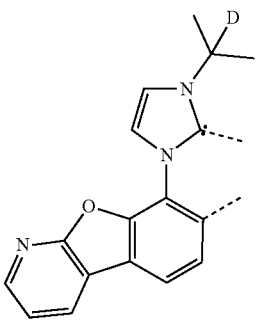
L_B66
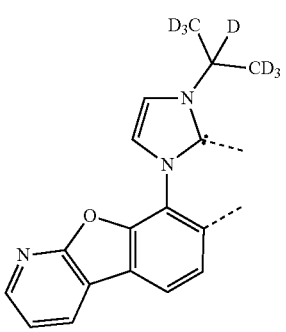
L_B67
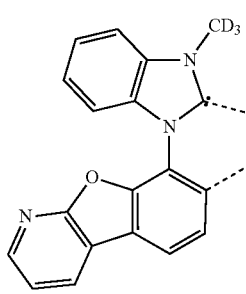

L$_{B68}$ 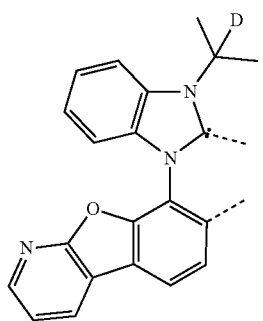
L$_{B69}$ 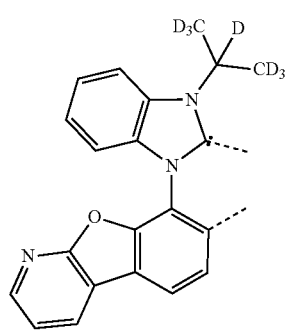
L$_{B70}$ 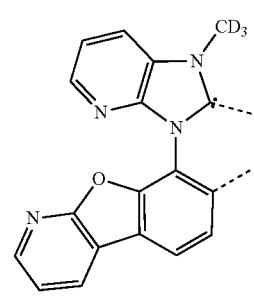
L$_{B71}$ 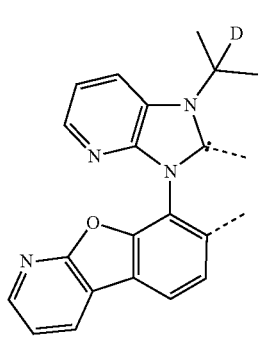
L$_{B72}$ 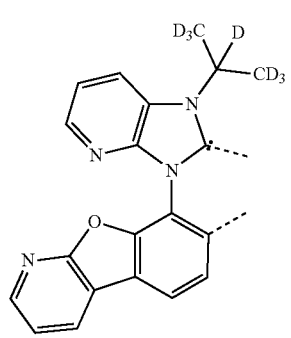
L$_{B73}$ 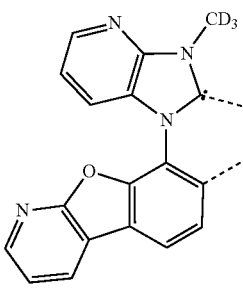
L$_{B74}$ 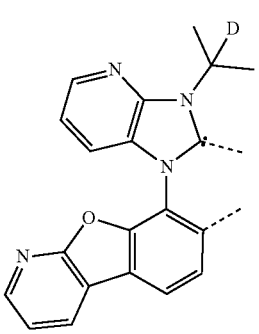
L$_{B75}$ 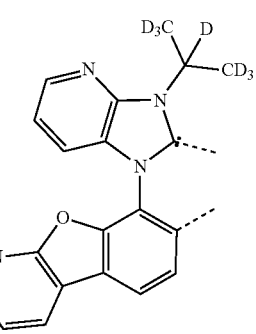
L$_{B76}$ 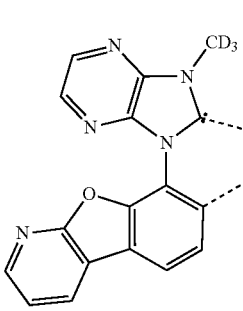
L$_{B77}$ 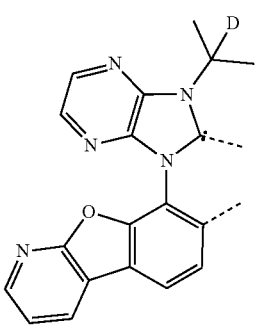

| | |
|---|---|
| L$_{B78}$ 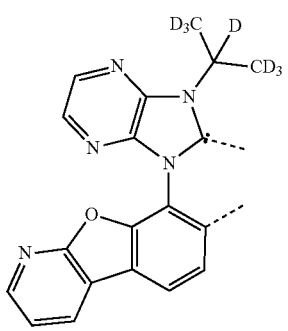 | L$_{B83}$ 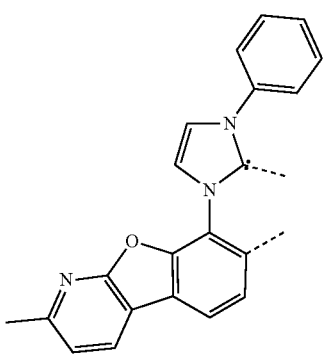 |
| L$_{B79}$ 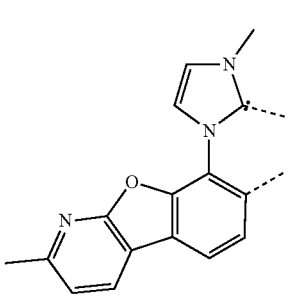 | L$_{B84}$ 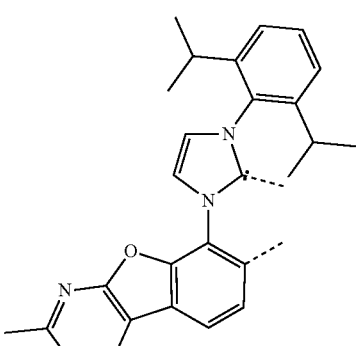 |
| L$_{B80}$ 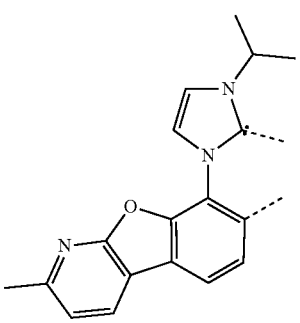 | L$_{B85}$ 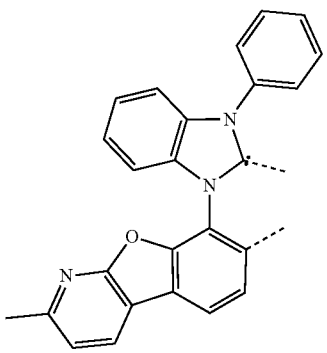 |
| L$_{B81}$ 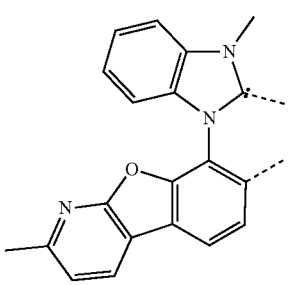 | L$_{B86}$ 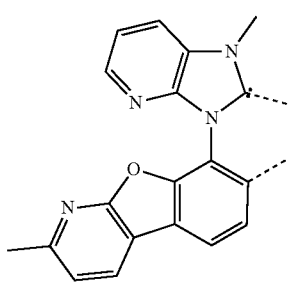 |
| L$_{B82}$ 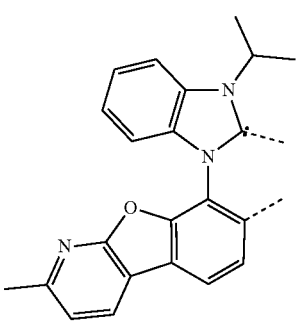 | L$_{B87}$ 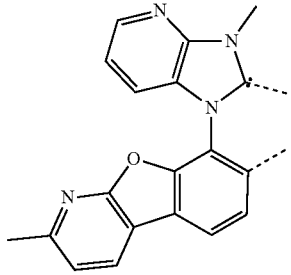 |

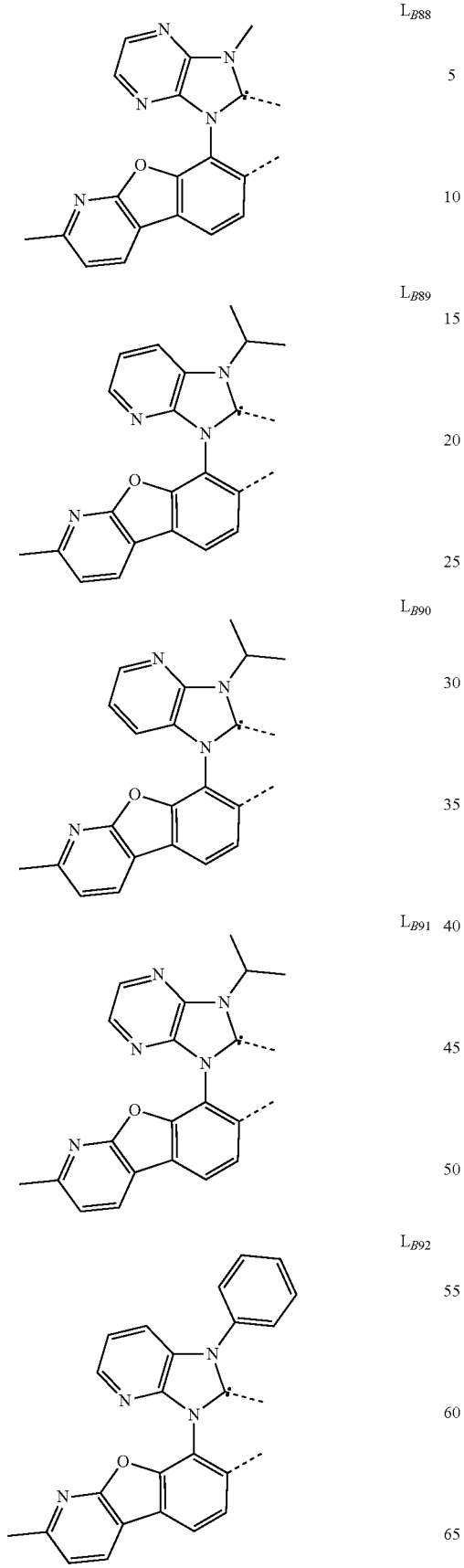
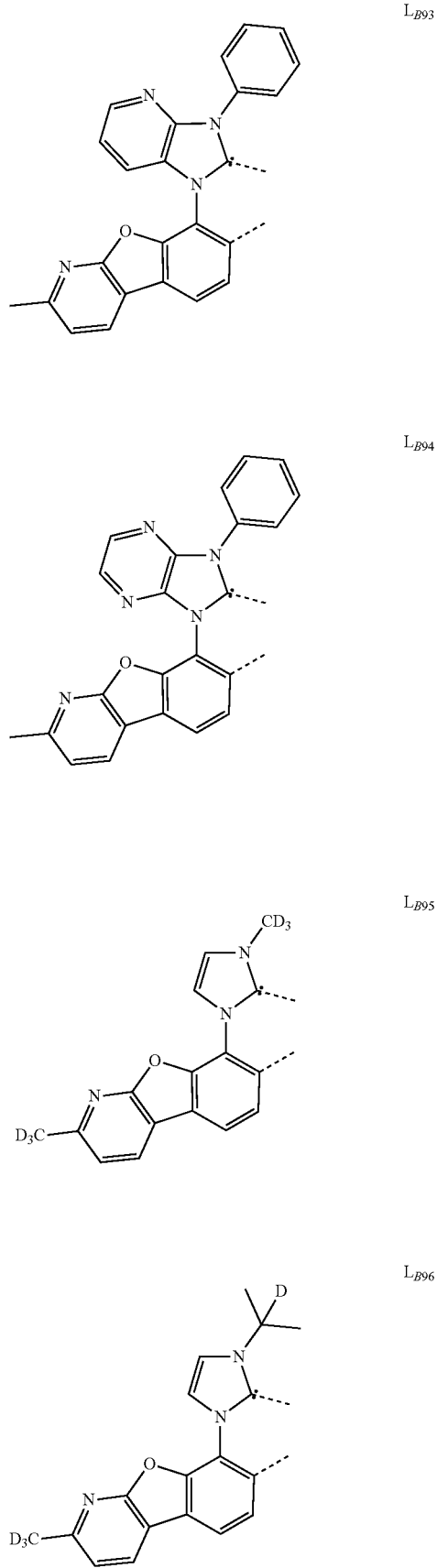

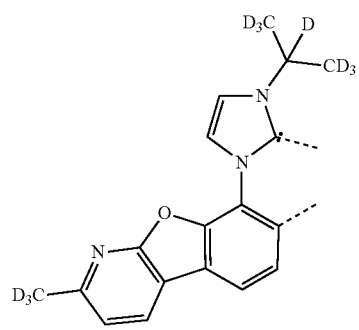 L_{B97}
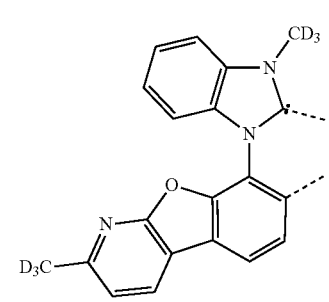 L_{B98}
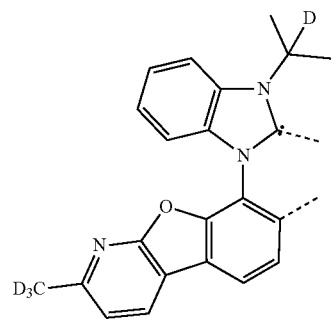 L_{B99}
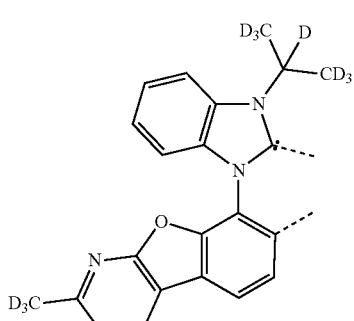 L_{B100}
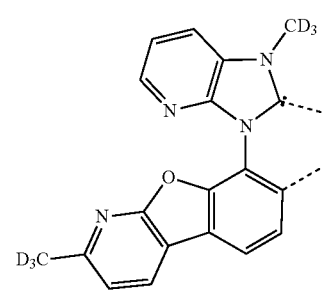 L_{B101}
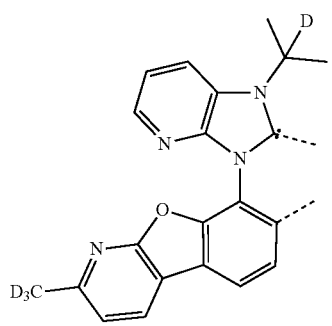 L_{B102}
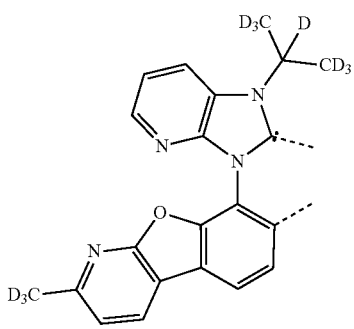 L_{B103}
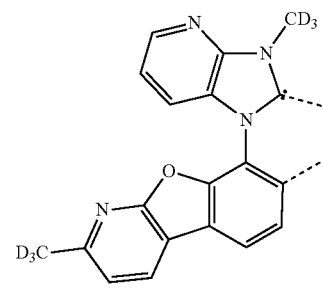 L_{B104}
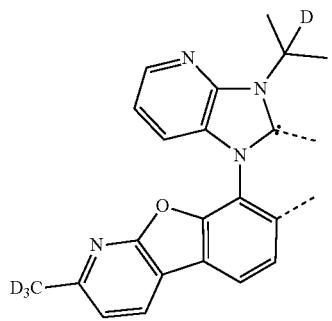 L_{B105}
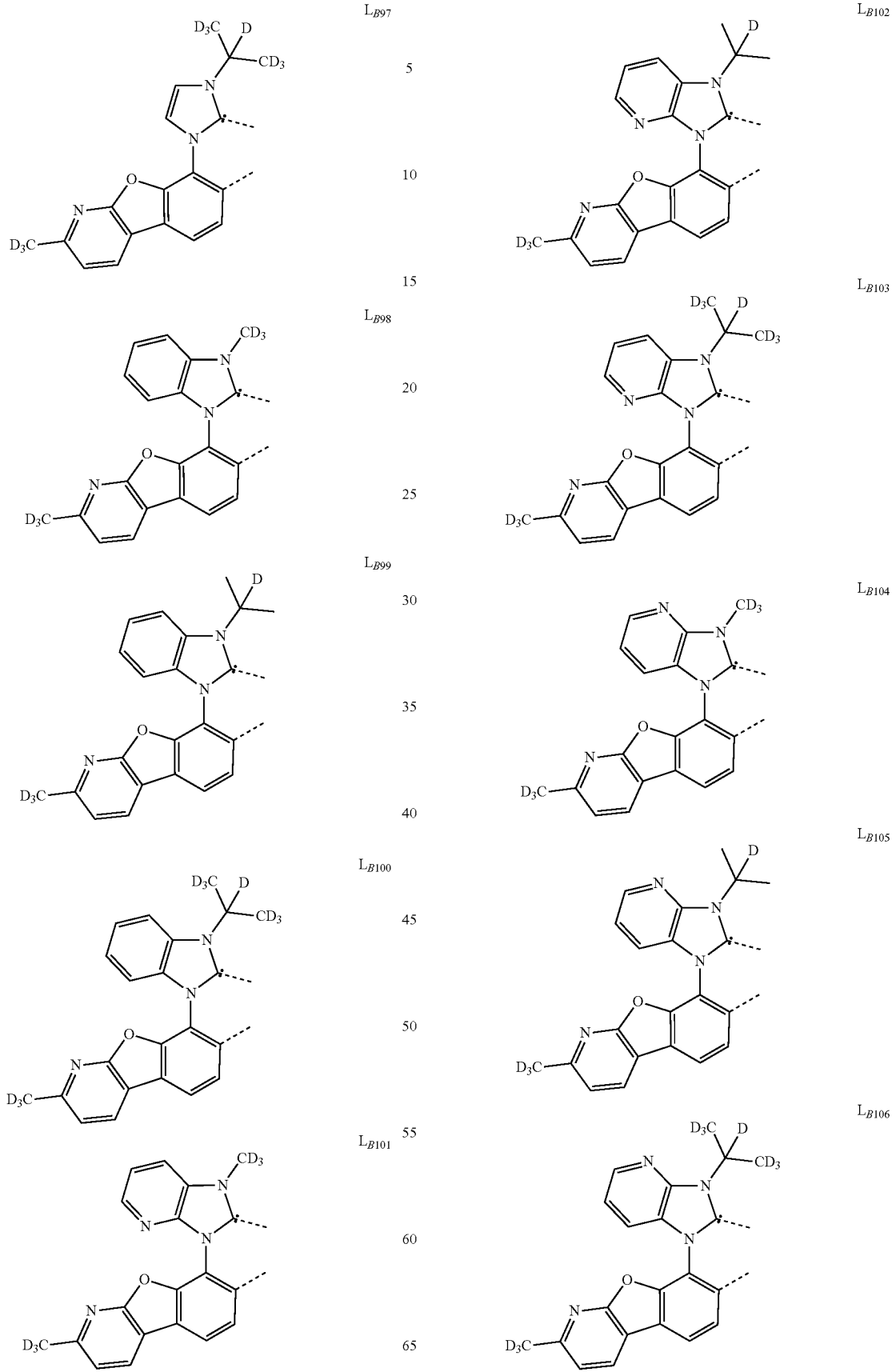 L_{B106}

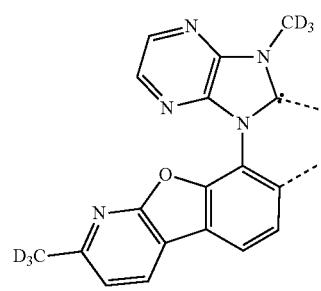 L_{B107}
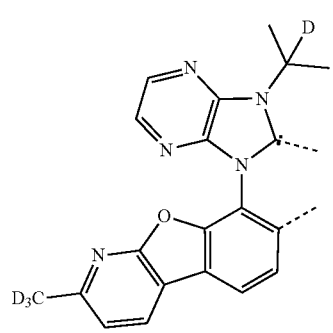 L_{B108}
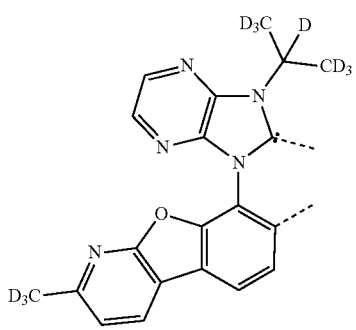 L_{B109}
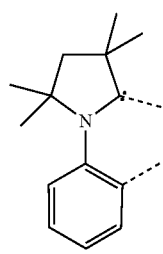 L_{B110}
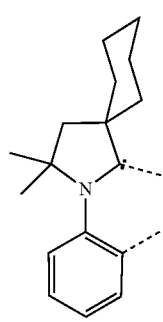 L_{B111}
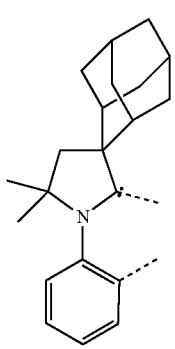 L_{B112}
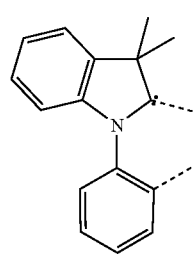 L_{B113}
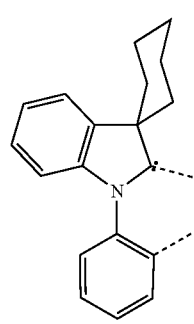 L_{B114}
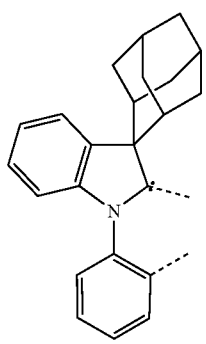 L_{B115}
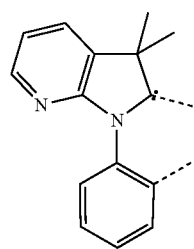 L_{B116}

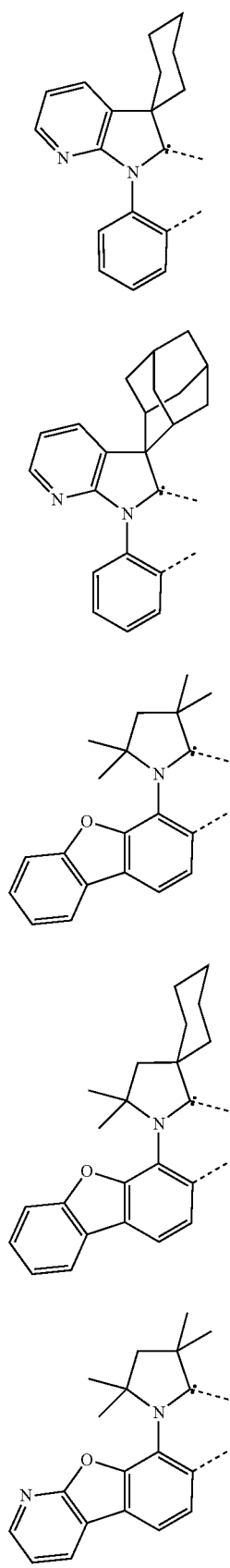
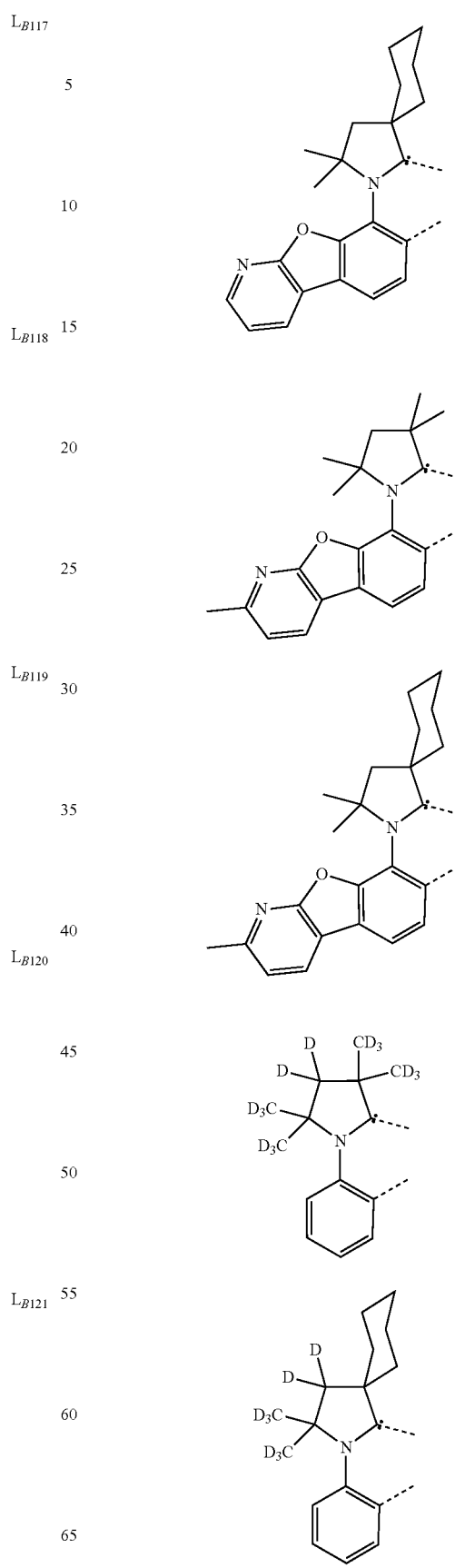

-continued
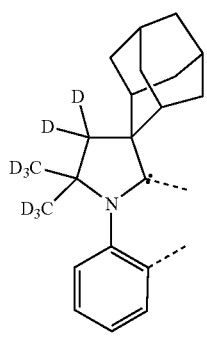
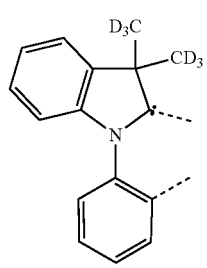
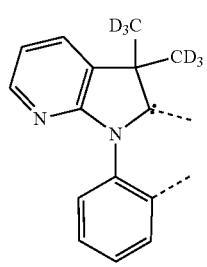
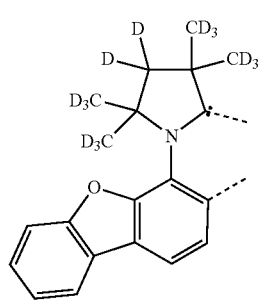
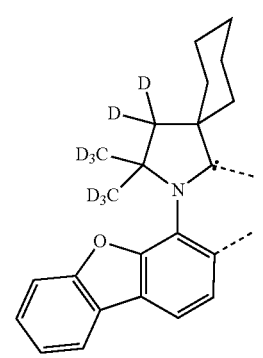
L$_{B127}$
L$_{B128}$
L$_{B129}$
L$_{B130}$
L$_{B131}$
-continued
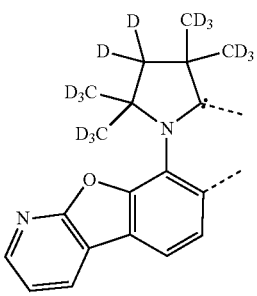
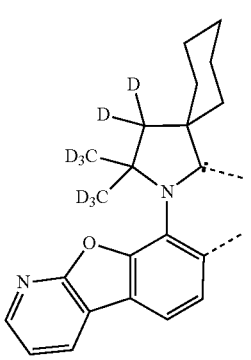
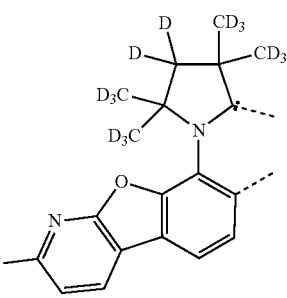
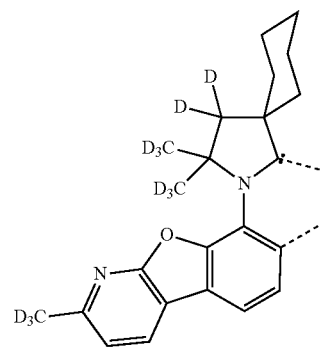
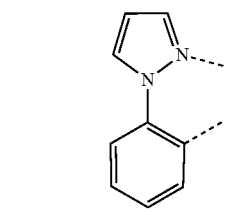
L$_{B132}$
L$_{B133}$
L$_{B134}$
L$_{B135}$
L$_{B136}$ L<sub>B137</sub>
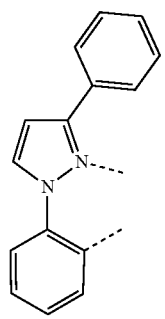
L<sub>B138</sub>
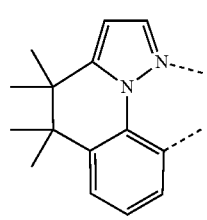
L<sub>B139</sub>
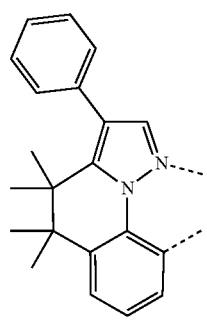
L<sub>B140</sub>
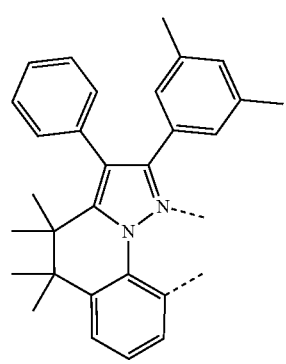
L<sub>B141</sub>
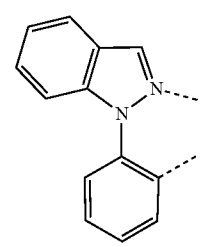
L<sub>B142</sub>
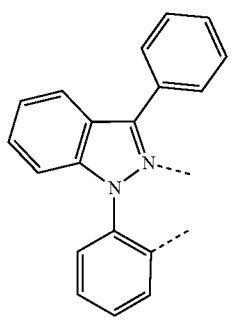
L<sub>B143</sub>
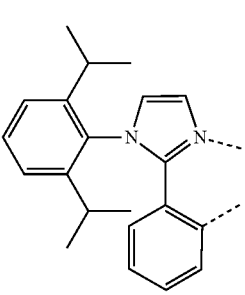
L<sub>B144</sub>
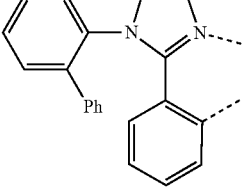
L<sub>B145</sub>
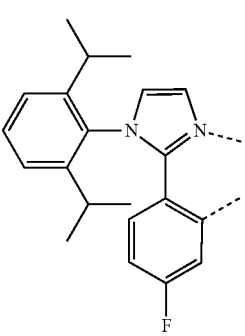
L<sub>B146</sub>
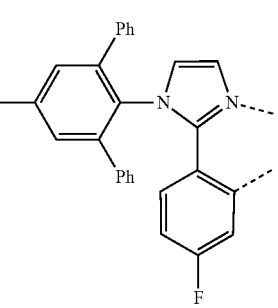

-continued
L$_{B147}$
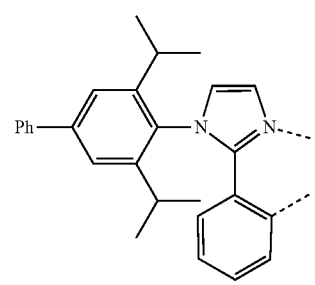
L$_{B148}$
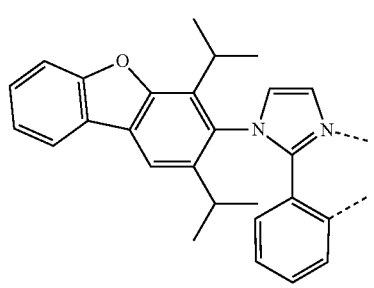
L$_{B149}$
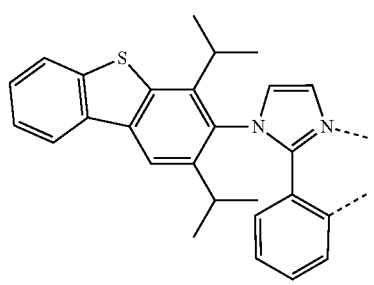
L$_{B150}$
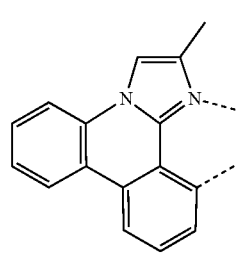
L$_{B151}$
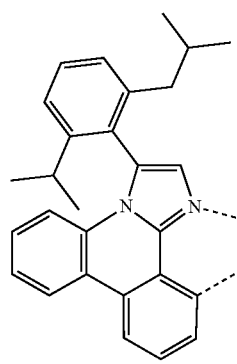
-continued
L$_{B152}$
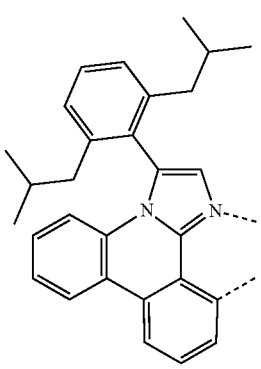
L$_{B153}$
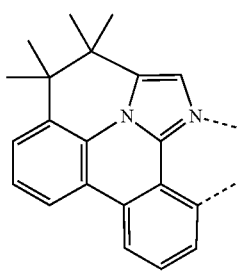
L$_{B154}$
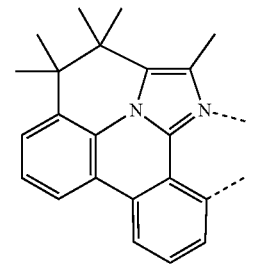
L$_{B155}$
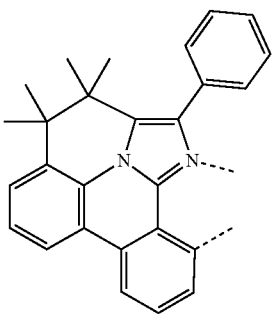
L$_{B156}$
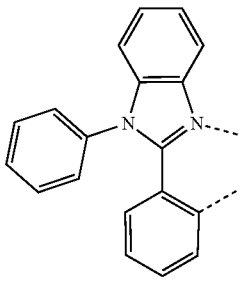

-continued

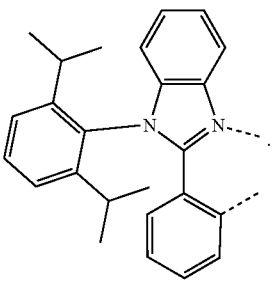

L_{B157}

17. The OLED of claim 15, wherein the emitter material is selected from the group consisting of:

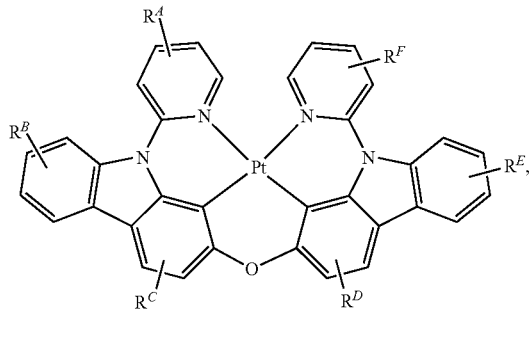

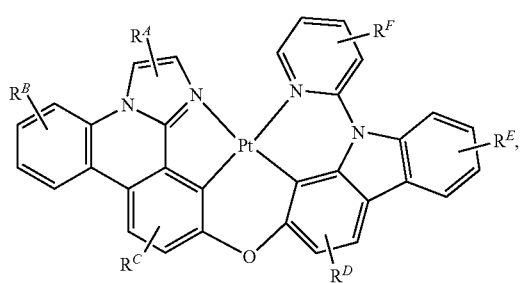

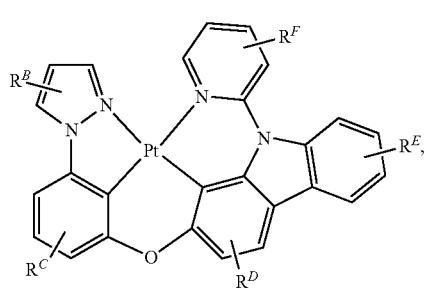

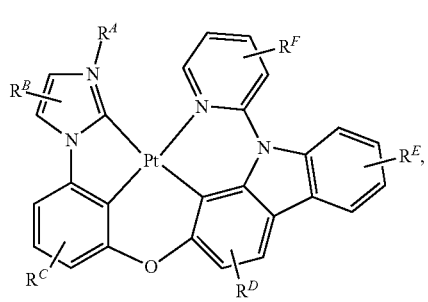

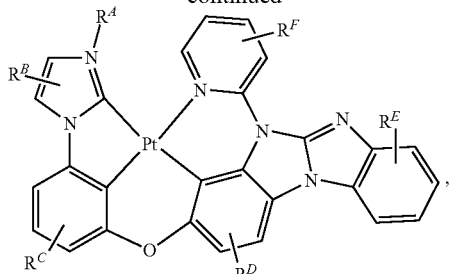

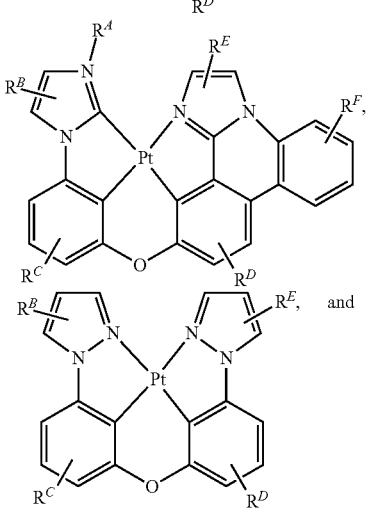

and

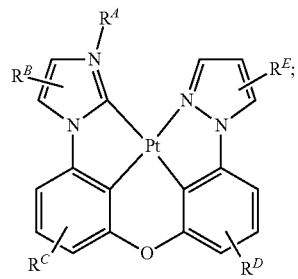

wherein,
each $R^A$ to $R^F$ may represent from mono substitution to the possible maximum number of substitution, or no substitution;
$R^A$ to $R^F$ are each independently a hydrogen or a substitution selected from the group consisting of deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, boryl, and combinations thereof; and
any two $R^A$ to $R^F$ are optionally fused or joined to form a ring or form a multidentate ligand.

18. The OLED of claim 17, wherein at least one of $R^A$ to $R^F$ comprises a chemical group containing at least three 6-membered aromatic rings that are not fused next to each other.

19. A consumer product comprising an organic light-emitting device (OLED) having an emission spectrum, the OLED comprising:
an anode;
a cathode; and
an organic emissive layer, disposed between the anode and the cathode, comprising:

a first host material having a highest occupied molecular orbital (HOMO) energy and a lowest unoccupied molecular orbital (LUMO) energy; and an emitter material having a HOMO energy and a LUMO energy;

wherein, all materials in the organic emissive layer are mixed together;

the emitter material is selected from the group consisting of a phosphorescent metal complex, and a delayed fluorescent emitter;

High HOMO energy is the highest HOMO energy among all materials in the organic emissive layer;

Low LUMO energy is the lowest LUMO energy among all materials in the organic emissive layer;

$a \leq E_T - \Delta E \leq b$, wherein $E_T$ is triplet energy $T_1$ of the emitter material, which is the lowest $T_1$ energy among all materials in the organic emissive layer, $\Delta E$ is the energy gap between the High HOMO energy and the Low LUMO energy, a is 0.00 upto 0.15 eV, and b is 0.05 upto 0.45 eV; and wherein root mean squared function (RMSD) value representing the difference between the emission spectrum of the OLED and an emission spectrum of a reference OLED, whose organic emissive layer consists of the emitter material and an inert host, is not greater than 0.05, wherein the RMSD value is a single value that represents the average difference between the two emission spectrums at all wavelengths obtained by the following equation:

$$RMSD = \sqrt{1/n \Sigma^n_1 (I_1(\lambda) - I_2(\lambda))^2},$$

wherein n is the number of points on the two emission spectrums being compared, and $I_1$ and $I_2$ are the normalized intensity spectrums as a function of wavelength, $\lambda$.

20. The consumer product of claim 19, wherein the consumer product is selected from the group consisting of a flat panel display, a computer monitor, a medical monitor, a television, a billboard, a light for interior or exterior illumination and/or signaling, a heads-up display, a fully or partially transparent display, a flexible display, a laser printer, a telephone, a cell phone, tablet, a phablet, a personal digital assistant (PDA), a wearable device, a laptop computer, a digital camera, a camcorder, a viewfinder, a microdisplay that is less than 2 inches diagonal, a 3-D display, a virtual reality or augmented reality display, a vehicle, a video walls comprising multiple displays tiled together, a theater or stadium screen, and a sign.

* * * * *